(12) United States Patent
Ohori et al.

(10) Patent No.: US 11,381,152 B2
(45) Date of Patent: *Jul. 5, 2022

(54) SIGNAL PROCESSOR, FILTER, CONTROL CIRCUIT FOR POWER CONVERTER CIRCUIT, INTERCONNECTION INVERTER SYSTEM AND PWM CONVERTER SYSTEM

(71) Applicant: DAIHEN Corporation, Osaka (JP)

(72) Inventors: Akihiro Ohori, Osaka (JP); Nobuyuki Hattori, Osaka (JP)

(73) Assignee: DAIHEN Corporation, Osaka (JP)

(*) Notice: Subject to any disclaimer, the term of this patent is extended or adjusted under 35 U.S.C. 154(b) by 94 days.

This patent is subject to a terminal disclaimer.

(21) Appl. No.: 17/036,682

(22) Filed: Sep. 29, 2020

(65) Prior Publication Data
US 2021/0013794 A1    Jan. 14, 2021

Related U.S. Application Data

(63) Continuation of application No. 16/600,726, filed on Oct. 14, 2019, now Pat. No. 10,333,576, which is a
(Continued)

(30) Foreign Application Priority Data

Sep. 29, 2011  (JP) .............................. JP2011-215737
Sep. 29, 2011  (JP) .............................. JP2011-215738
(Continued)

(51) Int. Cl.
*H02P 4/00*  (2006.01)
*H02P 21/00*  (2016.01)
(Continued)

(52) U.S. Cl.
CPC ............ *H02M 1/12* (2013.01); *G06F 17/147* (2013.01); *H02M 7/44* (2013.01); *H02P 4/00* (2013.01);
(Continued)

(58) Field of Classification Search
CPC . H02M 1/12; H02M 7/44; H02P 21/22; H02P 4/00; H02P 21/00; G06F 17/147; H03H 17/06
(Continued)

(56) References Cited

U.S. PATENT DOCUMENTS 4,639,854 A      1/1987  Kurokawa et al.
5,736,801 A  *   4/1998  Murakami ............. H03H 11/04
                                                   310/90.5
(Continued)

FOREIGN PATENT DOCUMENTS

CN    101252336 A    8/2008
CN    101587359 A    11/2009
(Continued)

OTHER PUBLICATIONS

Office Action issued in counterpart Japanese Patent Application (dated May 25, 2015).
(Continued)

*Primary Examiner* — Jorge L Carrasquillo
(74) *Attorney, Agent, or Firm* — Hamre, Schumann, Mueller & Larson, P.C.

(57) ABSTRACT

A signal processor is configured to perform a process equivalent to performing a series of fixed-to-rotating coordinate conversion, a predetermined process and then rotating-to-fixed coordinate conversion, while maintaining linearity and time-invariance. The signal processor performs a process given by the following matrix G:

$$G = \begin{bmatrix} \dfrac{F(s+j\omega_0) + F(s-j\omega_0)}{2} & \dfrac{F(s+j\omega_0) - F(s-j\omega_0)}{2j} \\ -\dfrac{F(s+j\omega_0) - F(s-j\omega_0)}{2j} & \dfrac{F(s+j\omega_0) + F(s-j\omega_0)}{2} \end{bmatrix}$$

(Continued)

where F(s) is a transfer function representing the predetermined process, $\omega_0$ is a predetermined angular frequency and j is the imaginary unit.

12 Claims, 26 Drawing Sheets

Related U.S. Application Data continuation of application No. 16/117,957, filed on Aug. 30, 2018, now Pat. No. 10,491,101, which is a continuation of application No. 14/644,433, filed on Mar. 11, 2015, now Pat. No. 10,110,111, which is a continuation of application No. 13/630,381, filed on Sep. 28, 2012, now abandoned.

(30) Foreign Application Priority Data

| | | |
|---|---|---|
| Sep. 29, 2011 | (JP) | JP2011-215739 |
| Dec. 22, 2011 | (JP) | JP2011-280814 |
| Dec. 26, 2011 | (JP) | JP2011-283473 |
| Jan. 12, 2012 | (JP) | JP2012-003654 |
| Jan. 19, 2012 | (JP) | JP2012-009370 |
| Feb. 15, 2012 | (JP) | JP2012-030232 |
| Feb. 15, 2012 | (JP) | JP2012-030234 |
| Mar. 5, 2012 | (JP) | JP2012-048230 |

(51) Int. Cl.
   *H02P 21/22* (2016.01)
   *H02M 1/12* (2006.01)
   *H02M 7/44* (2006.01)
   *H03H 17/06* (2006.01)
   *G06F 17/14* (2006.01)

(52) U.S. Cl.
   CPC ............. *H02P 21/00* (2013.01); *H02P 21/22* (2016.02); *H03H 17/06* (2013.01)

(58) Field of Classification Search
   USPC ........................................................ 318/723
   See application file for complete search history.

(56) References Cited

U.S. PATENT DOCUMENTS

| | | |
|---|---|---|
| 5,936,370 A | 8/1999 | Fukao |
| 6,052,297 A | 4/2000 | Akamatsu et al. |
| 6,055,524 A | 4/2000 | Cheng |
| 6,060,860 A * | 5/2000 | Itoh .......................... H02P 21/34 318/811 |
| 6,456,030 B1 | 9/2002 | Masaki et al. |
| 6,472,842 B1 * | 10/2002 | Ehsani ................ H02P 25/0925 318/798 |
| 6,657,566 B1 * | 12/2003 | Risbo ...................... H03M 5/08 375/242 |
| 6,697,767 B2 | 2/2004 | Wang et al. |
| 6,885,970 B2 * | 4/2005 | Petrovic ..................... G01P 3/44 318/797 |
| 6,850,426 B2 | 12/2005 | Kojiro et al. |
| 6,977,827 B2 | 12/2005 | Gritter |
| 7,091,684 B2 | 8/2006 | Kobayashi et al. |
| 7,102,314 B2 | 9/2006 | Hayashi |
| 7,177,165 B2 | 2/2007 | Deng et al. |
| 7,482,777 B2 | 1/2009 | Tomigashi |
| 7,529,652 B1 | 5/2009 | Gahinet et al. |
| 7,548,035 B2 | 6/2009 | Endo et al. |
| 7,647,213 B1 | 1/2010 | Gahinet et al. |
| 7,928,675 B2 | 4/2011 | Chen |
| 8,063,596 B2 | 11/2011 | Imura |
| 8,174,217 B2 | 5/2012 | Zhang et al. |
| 8,242,721 B2 | 8/2012 | Kwon et al. |
| 8,314,579 B2 | 11/2012 | Nishimura et al. |
| 8,446,742 B2 | 5/2013 | Hattori et al. |
| 8,594,813 B2 | 11/2013 | Cheng et al. |
| 8,595,162 B2 | 11/2013 | Al-Duwaish |
| 2002/0111758 A1 * | 8/2002 | Wang ..................... G05B 11/42 702/79 |
| 2003/0218887 A1 | 11/2003 | Kojiro et al. |
| 2005/0174090 A1 | 8/2005 | Hayashi |
| 2005/0207190 A1 | 9/2005 | Gritter |
| 2005/0281067 A1 | 12/2005 | Deng et al. |
| 2006/0022626 A1 | 2/2006 | Kobayashi et al. |
| 2006/0145650 A1 | 7/2006 | Salomaki |
| 2007/0090782 A1 | 4/2007 | Endo et al. |
| 2007/0296375 A1 | 12/2007 | Sakaguchi et al. |
| 2008/0042606 A1 | 2/2008 | Chen |
| 2008/0197799 A1 | 8/2008 | Tomigashi |
| 2008/0296085 A1 | 12/2008 | Suzuki |
| 2009/0160394 A1 | 6/2009 | Zhang et al. |
| 2009/0222136 A1 | 9/2009 | Lou |
| 2009/0322264 A1 | 12/2009 | Imura |
| 2010/0052598 A1 | 3/2010 | Hayashi et al. |
| 2010/0109584 A1 | 5/2010 | Kwon et al. |
| 2010/0156334 A1 | 6/2010 | Nishimura et al. |
| 2011/0040393 A1 | 2/2011 | Cheng et al. |
| 2011/0063883 A1 | 3/2011 | Hattori et al. |
| 2012/0053705 A1 | 3/2012 | Bensoussan |
| 2012/0106221 A1 | 5/2012 | Ochi et al. |
| 2012/0147638 A1 | 6/2012 | Kitanaka |
| 2012/0201064 A1 | 8/2012 | Asakura et al. |
| 2013/0286692 A1 | 10/2013 | Patel et al. |
| 2013/0320911 A1 | 12/2013 | Kamiya et al. |
| 2013/0328398 A1 | 12/2013 | Kanao et al. |

FOREIGN PATENT DOCUMENTS

| | | |
|---|---|---|
| EP | 1 593 014 B1 | 5/2011 |
| JP | 10-163811 A | 6/1998 |
| JP | 2000-116148 A | 4/2000 |
| JP | 2002-238163 A | 8/2002 |
| JP | 2005-73306 A | 3/2005 |
| JP | 2009-44897 A | 2/2009 |
| JP | 2011-229361 A | 11/2011 |
| WO | 2012/127910 A1 | 9/2012 |

OTHER PUBLICATIONS

Office Action issued in counterpart Japanese Patent Application, dated Sep. 29, 2015 (3 pages).

European Search Report issued in corresponding European Patent Application, dated Aug. 16, 2016.

Office Action issued in corresponding Indian Patent Application, dated Jun. 30, 2018 (9 pages).

* cited by examiner (a)

(b)

(a)

(b)

(a)

(b)

(c)

(a)

(b)

(a)

(b)

(a)

| | Phase U | Phase V | Phase W |
|---|---|---|---|
| DC | 2.28 [%] | -1.27 [%] | -1.05 [%] |
| 1 | 100 [%] | 100 [%] | 100 [%] |
| 2 | 1.21 [%] | 1.44 [%] | 1.57 [%] |
| 3 | 0.84 [%] | 0.64 [%] | 0.21 [%] |
| 4 | 0.23 [%] | 0.24 [%] | 0.15 [%] |
| 5 | 5.32 [%] | 5.03 [%] | 5.21 [%] |
| 6 | 0.04 [%] | 0.07 [%] | 0.05 [%] |
| 7 | 1.28 [%] | 1.12 [%] | 1.3 [%] |
| 8 | 0.04 [%] | 0.06 [%] | 0.07 [%] |
| 9 | 0.01 [%] | 0.02 [%] | 0.04 [%] |
| 10 | 0.09 [%] | 0.05 [%] | 0.06 [%] |
| 11 | 0.54 [%] | 0.47 [%] | 0.52 [%] |
| 12 | 0.08 [%] | 0.07 [%] | 0.02 [%] |
| 13 | 0.46 [%] | 0.48 [%] | 0.47 [%] |
| 14 | 0.03 [%] | 0.03 [%] | 0.05 [%] |
| 15 | 0.09 [%] | 0.07 [%] | 0.04 [%] |

(b)

| | Phase U | Phase V | Phase W |
|---|---|---|---|
| DC | 2.15 [%] | -1.46 [%] | -0.71 [%] |
| 1 | 100 [%] | 100 [%] | 100 [%] |
| 2 | 1.48 [%] | 1.61 [%] | 1.8 [%] |
| 3 | 0.62 [%] | 0.51 [%] | 0.15 [%] |
| 4 | 0.4 [%] | 0.32 [%] | 0.16 [%] |
| 5 | 0.26 [%] | 0.2 [%] | 0.23 [%] |
| 6 | 0.05 [%] | 0.06 [%] | 0.03 [%] |
| 7 | 0.45 [%] | 0.5 [%] | 0.42 [%] |
| 8 | 0.05 [%] | 0.02 [%] | 0.04 [%] |
| 9 | 0.02 [%] | 0.04 [%] | 0.04 [%] |
| 10 | 0.05 [%] | 0.05 [%] | 0.05 [%] |
| 11 | 0.44 [%] | 0.37 [%] | 0.36 [%] |
| 12 | 0.05 [%] | 0.05 [%] | 0.04 [%] |
| 13 | 0.24 [%] | 0.27 [%] | 0.26 [%] |
| 14 | 0.1 [%] | 0.14 [%] | 0.14 [%] |
| 15 | 0.07 [%] | 0.08 [%] | 0.03 [%] |

(b)

(c)

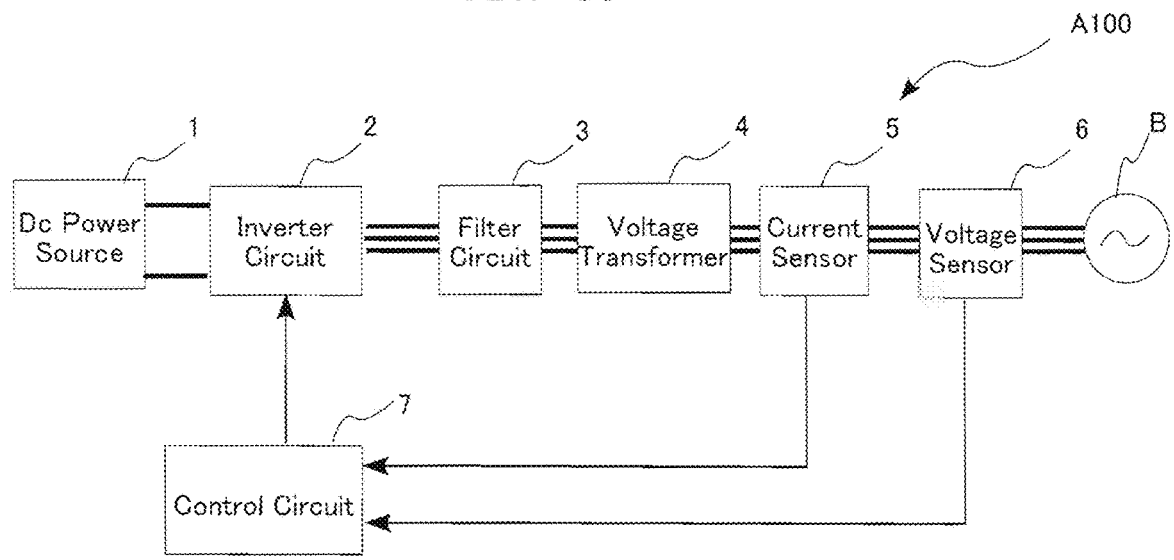
FIG. 36 - PRIOR ART
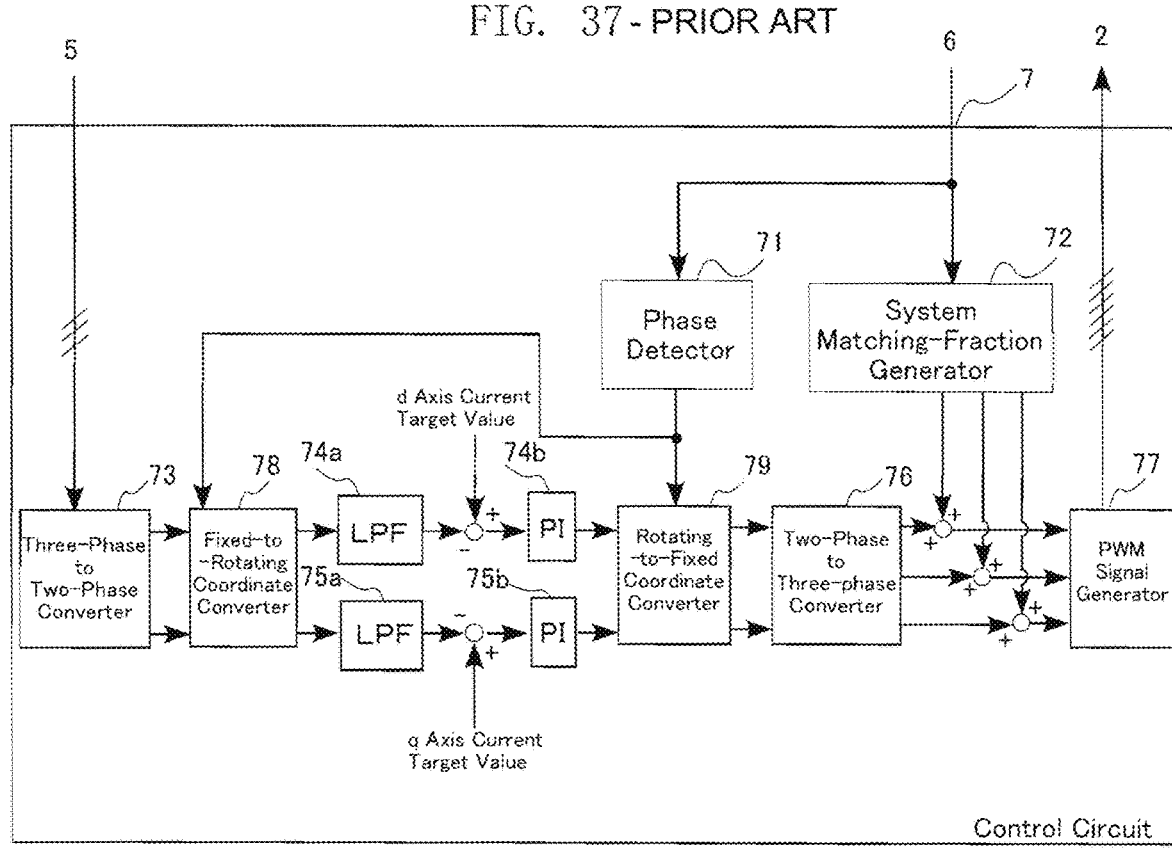
FIG. 37 - PRIOR ART

SIGNAL PROCESSOR, FILTER, CONTROL CIRCUIT FOR POWER CONVERTER CIRCUIT, INTERCONNECTION INVERTER SYSTEM AND PWM CONVERTER SYSTEM

BACKGROUND OF THE INVENTION

1. Field of the Invention

The present invention relates to signal processors, filters, and control circuits for controlling output or input of power converter circuits. The present invention also relates to interconnection inverter systems and PWM converter systems using the control circuits.

2. Description of the Related Art

Interconnection inverter systems convert DC (direct current) power which is generated by solar cells for example, to AC (alternate current) power for supply to electrical power systems. (See JP-A-2009-44897, for example.)

FIG. 36 is a block diagram for describing a conventional interconnection inverter system.

The interconnection inverter system A100 converts power generated by a DC power source 1 for supply to a three-phase electrical power system B. Hereinafter, the three phases will be called phase U, phase V and phase W.

An inverter circuit 2 receives a DC voltage from the DC power source 1, and converts the DC voltage into an AC voltage by way of switching operation of switching elements. A filter circuit 3 removes switching frequency components contained in the AC voltage outputted from the inverter circuit 2. A voltage transformer circuit 4 increases (or decreases) the AC voltage from the filter circuit 3 to a system voltage of the electrical power system B. A control circuit 7 receives an electric current signal detected by a current sensor 5 and a voltage signal detected by a voltage sensor 6 as inputs, generates PWM signals based on these, and outputs the PWM signals to the inverter circuit 2. The inverter circuit 2 performs switching operation of the switching elements based on the PWM signals from the control circuit 7.

FIG. 37 is a block diagram for describing an internal configuration of the control circuit 7.

Electrical current signals of respective phases inputted from the current sensor 5 are then inputted to a three-phase to two-phase converter 73.

The three-phase to two-phase converter 73 performs so called three-phase to two-phase conversion (alpha-beta conversion). The three-phase to two-phase conversion is a process in which three-phase AC signals are converted into equivalent two-phase AC signals, by first decomposing the three-phase AC signal components into two kinds of components in an orthogonal coordinate system (hereinafter called fixed coordinate system) composed of a mutually perpendicular two axis called alpha axis and beta axis; and then by adding these components for each of the axes. Thus, the original signal is converted into an AC signal on the alpha axis and an AC signal on the beta axis. Thus, the three-phase to two-phase converter 73 converts the three electric current signals Iu, Iv, Iw inputted thereto, to an alpha axis current signal Iα and a beta axis current signal Iβ, and then outputs these signals to a fixed-to-rotating coordinate converter 78.

The conversion process performed in the three-phase to two-phase converter 73 is represented by a formula shown below as Equation (1).

$$\begin{bmatrix} I\alpha \\ I\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} Iu \\ Iv \\ Iw \end{bmatrix} \Lambda \quad (1)$$

The fixed-to-rotating coordinate converter 78 performs so called fixed-to-rotating coordinate conversion (dq conversion). The fixed-to-rotating coordinate conversion converts two-phase signals in the fixed coordinate system into two-phase signals in a rotating coordinate system. The rotating coordinate system is an orthogonal coordinate system composed of d axis and q axis which are perpendicular to each other, and rotating in the same direction and at the same angular velocity as of a fundamental wave of the system voltage in the electrical power system B. The fixed-to-rotating coordinate converter 78 converts alpha axis current signals Iα and beta axis current signals Iβ in the fixed coordinate system which are inputted from the three-phase to two-phase converter 73 into d axis current signals Id and q axis current signals Iq in the rotating coordinate system based on a phase θ of the fundamental wave of the system voltage detected by a phase detector 71, and then outputs the converted signals.

The conversion process performed in the fixed-to-rotating coordinate converter 78 is represented by a formula shown below as Equation (2).

$$\begin{bmatrix} Id \\ Iq \end{bmatrix} = \begin{bmatrix} \cos\theta & \sin\theta \\ -\sin\theta & \cos\theta \end{bmatrix} \begin{bmatrix} I\alpha \\ I\beta \end{bmatrix} \Lambda \quad (2)$$

An LPF 74a and an LFP 75a are low-pass filters, allowing only DC components in the d axis current signals Id and in the q axis current signals Iq to pass through, respectively. The fixed-to-rotating coordinate conversion converts fundamental wave components in the alpha axis current signal Iα and the beta axis current signal Iβ into DC components of the d axis current signal Id and q axis current signal Iq respectively. A PI controller 74b and a PI controller 75b each perform PI (proportional-integral) control based on the DC component values in the d axis current signals Id and the q axis current signals Iq and deviations from their respective target values, and then output correction value signals Xd, Xq. Since DC components can be used as the target values, the PI controller 74b and the PI controller 75b are capable of providing highly accurate control.

A rotating-to-fixed coordinate converter 79 converts the correction value signals Xd, Xq, which are inputted from the PI controller 74b and the PI controller 75b respectively, into two correction value signals Xα, Xβ in the fixed coordinate system. In other words, it performs a reverse conversion process of the process performed by the fixed-to-rotating coordinate converter 78. The rotating-to-fixed coordinate converter 79 performs so called rotating-to-fixed coordinate conversion (reverse dq conversion), i.e., conversion of the correction value signals Xd, Xq in the rotating coordinate system into correction value signals Xα, XP in the fixed coordinate system based on the phase θ.

The conversion process performed in the rotating-to-fixed coordinate converter 79 is represented by a formula shown below as Equation (3).

$$\begin{bmatrix} X\alpha \\ X\beta \end{bmatrix} = \begin{bmatrix} \cos\theta & -\sin\theta \\ \sin\theta & \cos\theta \end{bmatrix} \begin{bmatrix} Xd \\ Xq \end{bmatrix} \Lambda \quad (3)$$

A two-phase to three-phase converter 76 converts the correction value signals Xα, Xβ which from the rotating-to-fixed coordinate converter 79 into three correction value signals Xu, Xv, Xw. The two-phase to three-phase converter 76 performs so called two-phase to three-phase conversion process (reverse alpha-beta conversion), i.e., an inverse conversion process of the process performed by the three-phase to two-phase converter 73.

The conversion process performed in the two-phase to three-phase converter 76 is represented by a formula shown below as Equation (4).

$$\begin{bmatrix} Xu \\ Xv \\ Xw \end{bmatrix} = \sqrt{\frac{2}{3}} \begin{bmatrix} 1 & 0 \\ -\frac{1}{2} & \frac{\sqrt{3}}{2} \\ -\frac{1}{2} & -\frac{\sqrt{3}}{2} \end{bmatrix} \begin{bmatrix} X\alpha \\ X\beta \end{bmatrix} \Lambda \qquad (4)$$

A PWM signal generator 77 generates PWM signals based on the correction value signals Xu, Xv, Xw from the two-phase to three-phase converter 76, and outputs the generated signals.

A problem, however, is that designing the control system of the control circuit 7 requires tremendous work. Recent interconnection inverter systems must satisfy requirements for very quick response in its control operation, such as restoring its output within a predetermined amount of time upon momentary voltage drop. In order to design the control system so as to satisfy such requirements as the above, the LPF 74a and the LFP 75a must be given optimal parameters, and the PI controller 74b and the PI controller 75b must be designed to have optimized proportional and integral gains. However, since the fixed-to-rotating coordinate converter 78 and the rotating-to-fixed coordinate converter 79 perform nonlinear time-varying processes, it was not possible to design the control system by using a linear control theory. Further, system analysis was not possible, either, since the control system includes nonlinear time-varying processing.

SUMMARY OF THE INVENTION

The present invention has been proposed under the above-described circumstances, and it is therefore an object of the present invention to provide a signal processor configured to perform a process which is equivalent to performing a set of the fixed-to-rotating coordinate conversion, a predetermined process and the rotating-to-fixed coordinate conversion, while maintaining linearity and time-invariance in the process.

A first aspect of the present invention provides a signal processor which generates an output signal by performing signal processing to an input signal by a first transfer function. The first transfer function is expressed by $$G_1(s) = \frac{F(s + j\omega_0) + F(s - j\omega_0)}{2}$$

where F(s) represents a transfer function expressing a predetermined process, $\omega_0$ represents a predetermined angular frequency, and represents the imaginary unit.

A second aspect of the present invention provides a signal processor which outputs a first output signal and a second output signal in response to an input of a first input signal and a second input signal. In the signal processor, the first input signal is processed by a first transfer function, the second input signal is processed by a second transfer function, and two results are added together to obtain the first output signal. Also, the first input signal is processed by a third transfer function, the second input signal is processed by the first transfer function, and two results are added together to obtain the second output signal. The first transfer function, the second transfer function and the third transfer function are expressed respectively by:

$$G_1(s) = \frac{F(s + j\omega_0) + F(s - j\omega_0)}{2}$$

$$G_2(s) = \pm \frac{F(s + j\omega_0) - F(s - j\omega_0)}{2j}$$

$$G_3(s) = \mu \frac{F(s + j\omega_0) - F(s - j\omega_0)}{2j}$$

where F(s) represents a transfer function expressing a predetermined process, $\omega_0$ represents a predetermined angular frequency and j represents an imaginary unit.

A third aspect of the present invention provides a signal processor which outputs a first output signal, a second output signal and a third output signal in response to an input of a first input signal, a second input signal and a third input signal. In the signal processor, the first input signal is processed by a first transfer function, the second input signal is processed by a second transfer function, the third input signal is processed by a third transfer function, and three results are added together to obtain the first output signal. Also, the first input signal is processed by the second transfer function, the second input signal is processed by the first transfer function, the third input signal is process by the second transfer function, and three results are added together to obtain the second output signal. Further, the first input signal is processed by the second transfer function, the second input signal is processed by the second transfer function, the third input signal is processed by the first transfer function, and three results are added together to obtain the third output signal. The first transfer function and the second transfer function being expressed by:

$$G_1(s) = \frac{F(s + j\omega_0) + F(s - j\omega_0)}{3}$$

$$G_2(s) = -\frac{F(s + j\omega_0) + F(s - j\omega_0)}{6}$$

where F(s) represents a transfer function expressing a predetermined process, $\omega_0$ represents a predetermined angular frequency, and j represents an imaginary unit.

A fourth aspect of the present invention provides a signal processor which outputs a first output signal, a second output signal and a third output signal in response to an input of a first input signal, a second input signal and a third input signal. In the signal processor, the first input signal is processed by a first transfer function, the second input signal is processed by a second transfer function, the third input signal is processed by a third transfer function and three results are added together to obtain the first output signal. Also, the first input signal is processed by the third transfer function, the second input signal is processed by the first transfer function, the third input signal is processed by the second transfer function, ans three results are added together to obtain the second output signal. Further, the first input signal is processed by the second transfer function, the second input signal is processed by the third transfer function, the third input signal is processed by the first transfer function, and three results are added together to obtain the third output signal. The first transfer function, the second transfer function and the third transfer function are expressed by:

$$G_1(s) = \frac{F(s+j\omega_0) + F(s-j\omega_0)}{3}$$

$$G_2(s) = \frac{(-1\mu\sqrt{3}\,j) \cdot F(s+j\omega_0) + (-1 \pm \sqrt{3}\,j) \cdot F(s-j\omega_0)}{6}$$

$$G_3(s) = \frac{(-1 \pm \sqrt{3}\,j) \cdot F(s+j\omega_0) + (-1\mu\sqrt{3}\,j) \cdot F(s-j\omega_0)}{6}$$

where F(s) representing a transfer function expressing a predetermined process, $\omega_0$ representing a predetermined angular frequency and j representing an imaginary unit.

A fifth aspect of the present invention provides a control circuit for controlling operation of a plurality of switching units inside a power converter circuit by a PWM signal. The control circuit includes the signal processor according to the first aspect of the present invention; and a PWM signal generator which generates a PWM signal based on an output signal from the signal processor obtained by a signal input thereto of a signal based on an output from or an input to the power converter circuit.

According to a preferred embodiment of the present invention, the control circuit further includes a two-phase conversion unit which converts a signal based on an output from or an input to the power converter circuit into a first signal and a second signal. With this arrangement, the PWM signal generator generates a PWM signal based on an output signal obtained from an input of the first signal to the signal processor and an output signal obtained from an input of the second signal to the signal processor.

A sixth aspect of the present invention provides a control circuit for controlling operation of a plurality of switching units inside a power converter circuit by a PWM signal. The control circuit includes a two-phase conversion unit which converts a signal based on an output from or an input to the power converter circuit into a first signal and a second signal; the signal processor according to the second aspect of the present invention; and a PWM signal generator which generates a PWM signal based on an output signal from the signal processor obtained by an input thereto of the first signal and the second signal.

According to a preferred embodiment of the present invention, the power converter circuit relates to a three-phase alternate current, and the two-phase conversion unit converts a signal based on a three-phase output from or three-phase input to the power converter circuit into the first signal and the second signal.

According to a preferred embodiment of the present invention, the power converter circuit relates to a single-phase alternate current. With this arrangement, the two-phase conversion unit generates a signal based on a single-phase output from or three-phase input to the power converter circuit as the first signal, and a signal with a 90-degree phase delay from the first signal as the second signal.

A seventh aspect of the present invention provides a control circuit for controlling operation of a plurality of switching units inside a three-phase alternate-current related power converter circuit by a PWM signal. The control circuit includes the signal processor according to the third aspect or the fourth aspect of the present invention; and a PWM signal generator which generates a PWM signal based on an output signal from the signal processor obtained by a signal input thereto of a signal based on an output from or an input to the power converter circuit.

According to a preferred embodiment of the present invention, the signal processor is supplied with deviation signals of the first signal and the second signal from their respective target values in place of the first signals and the second signal.

According to a preferred embodiment of the present invention, the above-described "signal based on." is provided by a deviation of said output from or said input to the power converter circuit from their respective target value.

According to a preferred embodiment of the present invention, the predetermined angular frequency U) is substituted for an angular frequency no, provided by multiplying the angular frequency $\omega_0$ by a natural number n.

According to a preferred embodiment of the present invention, the control circuit further includes a divergence determination unit for determination of a divergent tendency found in control, based on an output signal from the signal processor; and a stopping unit for stopping an output of the output signal upon determination of presence of the divergent tendency by the divergence determination unit.

According to a preferred embodiment of the present invention, the control circuit further includes a divergence determination unit for determination of a divergent tendency found in control, based on an output signal from the signal processor; and a phase change unit for changing a phase of the output signal upon determination of presence of the divergent tendency by the divergence determination unit.

According to a preferred embodiment of the present invention, the divergence determination unit determines the presence of the divergent tendency in the control by a value of the output signal surpassing a predetermined threshold value.

According to a preferred embodiment of the present invention, the predetermined process is given by a transfer function expressed as $F(s)=K_I/s$, where $K_I$ represents an integral gain.

According to a preferred embodiment of the present invention, the predetermined process is given by a transfer function expressed as $F(s)=K_P+K_I/s$, where $K_P$ and $K_I$ represent a proportional gain and an integral gain respectively.

According to a preferred embodiment of the present invention, the above-described "signal based on . . . " is provided by a signal obtained by detection of an output current or an input current.

According to a preferred embodiment of the present invention, the above-described "signal based on . . . " is provided by a signal obtained by detection of an output voltage or an input voltage.

According to a preferred embodiment of the present invention, a H∞ loop shaping method is utilized in designing a control system.

According to a preferred embodiment of the present invention, the power converter circuit is provided by an inverter circuit which generates AC power to be supplied to an electrical power system, and the predetermined angular frequency $\omega_0$ is provided by an angular frequency of a fundamental wave in the electrical power system. An eighth aspect of the present invention provides an interconnection inverter system which includes the control circuit according to said preferred embodiment and an inverter circuit.

According to a preferred embodiment of the present invention, the power converter circuit is provided by an inverter circuit for driving a motor, and the predetermined angular frequency $\omega_0$ is provided accordingly to a rotating speed of the motor.

According to a preferred embodiment of the present invention, the power converter circuit is provided by a converter circuit for conversion of AC power supplied from an electrical power system into DC power, and the predetermined angular frequency is provided by an angular frequency of a fundamental wave in the electrical power system. A ninth aspect of the present invention provides a PWM converter system which includes the control circuit according to said preferred embodiment and a converter circuit.

A tenth aspect of the present invention provides a filter, which includes the signal processor according to one of the first aspect through the fourth aspect of the present invention. With this arrangement, the predetermined process is given by a transfer function expressed as $F(s)=1/(T \cdot s+1)$, where T represents a time constant.

An eleventh aspect of the present invention provides a filter which includes the signal processor according to one of the first aspect to the fourth aspect of the present invention. With this arrangement, the predetermined process is given by a transfer function expressed as $F(s)=T \cdot s/(T \cdot s+1)$, where T represents a time constant.

A twelfth aspect of the present invention provides a phase detector which detects a phase of a fundamental wave component in an AC signal. The phase detector includes the filter according to the tenth aspect or the eleventh aspect of the present invention, and the predetermined angular frequency $\omega_0$ is provided by an angular frequency of a in a fundamental wave component the AC signal.

Other characteristics and advantages of the present invention will become clearer from the following detailed description to be made with reference to the attached drawings.

BRIEF DESCRIPTION OF THE DRAWINGS

FIG. 36 is a block diagram for describing a conventional typical interconnection inverter system.

FIG. 37 is a block diagram for describing an internal configuration of a control circuit.

DETAILED DESCRIPTION OF THE PREFERRED EMBODIMENTS

Embodiments of the present invention will be described below with reference to the drawings.

First, description will cover a method of converting a process which involves fixed-to-rotating coordinate conversion and rotating-to-fixed coordinate conversion into a linear time-invariant process.

FIG. 1(a) is a diagram for describing a process involving fixed-to-rotating coordinate conversion and rotating-to-fixed coordinate conversion operations. In this process, first, signals α and β are converted into signals d and q by fixed-to-rotating coordinate conversion. The signals d and q undergo respective processes each represented by a predetermined transfer function F(s), and are outputted as signals d' and q'. Next, the signals d' and q' are converted into signals α' and β' by rotating-to-fixed coordinate conversion. A nonlinear time-variant process in FIG. 1(a) is transformed into a linear time-invariant process using a transfer function matrix G shown in FIG. 1(b).

The fixed-to-rotating coordinate conversion in FIG. 1(a) is represented by a formula expressed by Equation (5) shown below whereas the rotating-to-fixed coordinate conversion is represented by a formula expressed by Equation (6) shown below.

$$\begin{bmatrix} d \\ q \end{bmatrix} = \begin{bmatrix} \cos\theta & \sin\theta \\ -\sin\theta & \cos\theta \end{bmatrix} \begin{bmatrix} \alpha \\ \beta \end{bmatrix} \Lambda \quad (5)$$

$$\begin{bmatrix} \alpha' \\ \beta' \end{bmatrix} = \begin{bmatrix} \cos\theta & -\sin\theta \\ \sin\theta & \cos\theta \end{bmatrix} \begin{bmatrix} d' \\ q' \end{bmatrix} \Lambda \quad (6)$$

Figure 1:
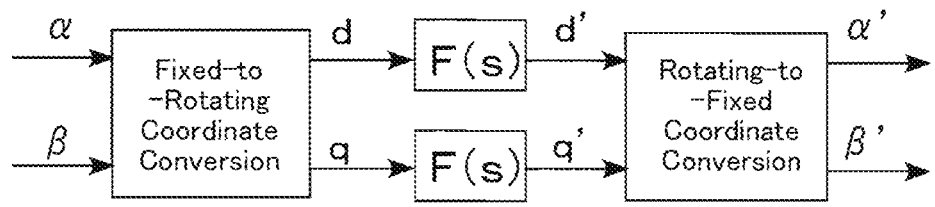
FIG. 1 is a block diagram for describing a method of converting a process involving fixed-to-rotating and rotating-to-fixed coordinate conversions into a linear time-invariant process.
Figure 1:
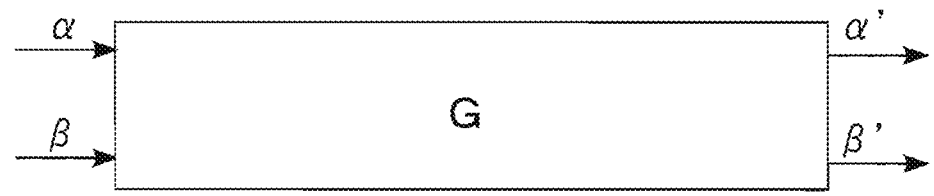
Figure 2:
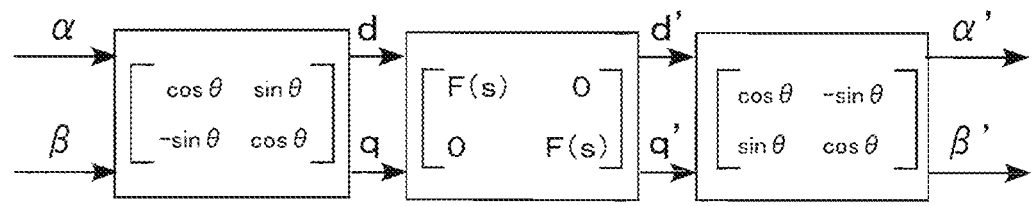
FIG. 2 is a block diagram, presented by way of matrix, for describing a method of converting a process which involves fixed-to-rotating coordinate conversion and rotating-to-fixed coordinate conversion into a linear time-invariant process.
Figure 2:
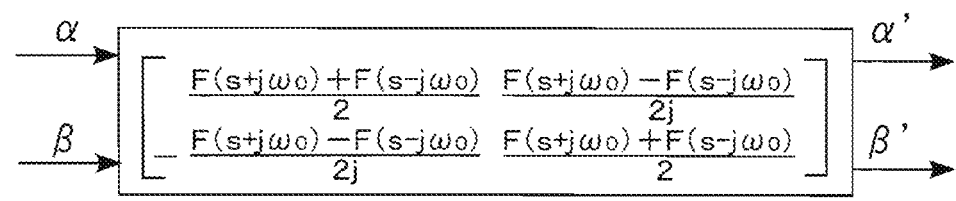

Therefore, the process in FIG. 1(a) can be expressed by using matrices as shown in FIG. 2(a). Calculating the product of the three matrices in FIG. 2(a), and transforming the obtained matrix into a linear time-invariant matrix provides a matrix G in FIG. 1(b). In this process, rotating-to-fixed and fixed-to-rotating coordinate conversion matrices are converted into products of matrices before performing the calculations.

The fixed-to-rotating coordinate conversion matrix can be converted into a matrix product shown on the right side of Equation (7) below.

$$\begin{bmatrix} \cos\theta & \sin\theta \\ -\sin\theta & \cos\theta \end{bmatrix} = T \begin{bmatrix} \exp(j\theta) & 0 \\ 0 & \exp(-j\theta) \end{bmatrix} T^{-1} \Lambda \quad (7)$$

where, j is the imaginary unit, exp( ) is an exponential of the base of natural logarithm, e, and $$T = \begin{bmatrix} \frac{1}{2} & \frac{1}{2} \\ \frac{j}{2} & -\frac{j}{2} \end{bmatrix}, T^{-1} = \begin{bmatrix} 1 & -j \\ 1 & j \end{bmatrix}$$

where, $T^{-1}$ represents an inverse matrix of T.

$$T \begin{bmatrix} \exp(j\theta) & 0 \\ 0 & \exp(-j\theta) \end{bmatrix} T^{-1} = \begin{bmatrix} \frac{1}{2} & \frac{1}{2} \\ \frac{j}{2} & -\frac{j}{2} \end{bmatrix} \begin{bmatrix} \exp(j\theta) & 0 \\ 0 & \exp(-j\theta) \end{bmatrix} \begin{bmatrix} 1 & -j \\ 1 & j \end{bmatrix} =$$

$$\begin{bmatrix} \frac{1}{2} & \frac{1}{2} \\ \frac{j}{2} & -\frac{j}{2} \end{bmatrix} \begin{bmatrix} \exp(j\theta) & -j\exp(j\theta) \\ \exp(-j\theta) & j\exp(-j\theta) \end{bmatrix} =$$

$$\begin{bmatrix} \frac{\exp(j\theta)+\exp(-j\theta)}{2} & \frac{-\exp(j\theta)+\exp(-j\theta)}{2}j \\ \frac{\exp(j\theta)-\exp(-j\theta)}{2}j & \frac{\exp(j\theta)+\exp(-j\theta)}{2} \end{bmatrix}$$

Here, substituting cos θ+j sin θ for exp(jθ) and cos θ−j sin θ for exp(−jθ) according to Euler's formula provides confirmation that:

$$T \begin{bmatrix} \exp(j\theta) & 0 \\ 0 & \exp(-j\theta) \end{bmatrix} T^{-1} = \begin{bmatrix} \cos\theta & \sin\theta \\ -\sin\theta & \cos\theta \end{bmatrix}$$

Similarly, the rotating-to-fixed coordinate conversion matrix can be converted into a matrix product shown on the right side of Equation (8) given below. The central matrix in the matrix product is a linear time-invariant matrix.

$$\begin{bmatrix} \cos\theta & -\sin\theta \\ \sin\theta & \cos\theta \end{bmatrix} = T \begin{bmatrix} \exp(-j\theta) & 0 \\ 0 & \exp(j\theta) \end{bmatrix} T^{-1} \Lambda \quad (8)$$

where, j is the imaginary unit, exp( ) is an exponential of the base of natural logarithm, e, and $$T = \begin{bmatrix} \frac{1}{2} & \frac{1}{2} \\ \frac{j}{2} & -\frac{j}{2} \end{bmatrix}, T^{-1} = \begin{bmatrix} 1 & -j \\ 1 & j \end{bmatrix}$$

where $T^{-1}$ is the inverse matrix of T.

$$T \begin{bmatrix} \exp(-j\theta) & 0 \\ 0 & \exp(j\theta) \end{bmatrix} T^{-1} = \begin{bmatrix} \frac{1}{2} & \frac{1}{2} \\ \frac{j}{2} & -\frac{j}{2} \end{bmatrix} \begin{bmatrix} \exp(-j\theta) & 0 \\ 0 & \exp(j\theta) \end{bmatrix} \begin{bmatrix} 1 & -j \\ 1 & j \end{bmatrix} =$$

$$\begin{bmatrix} \frac{1}{2} & \frac{1}{2} \\ \frac{j}{2} & -\frac{j}{2} \end{bmatrix} \begin{bmatrix} \exp(-j\theta) & -j\exp(-j\theta) \\ \exp(j\theta) & j\exp(j\theta) \end{bmatrix} =$$

$$\begin{bmatrix} \frac{\exp(-j\theta)+\exp(j\theta)}{2} & \frac{-\exp(-j\theta)+\exp(j\theta)}{2}j \\ \frac{\exp(-j\theta)-\exp(j\theta)}{2}j & \frac{\exp(-j\theta)+\exp(j\theta)}{2} \end{bmatrix}$$

Here, substituting cos θ+j sin θ for exp(jθ) and cos θ−j sin θ for exp(−jθ) according to Euler's formula provides confirmation that:

$$T\begin{bmatrix} \exp(-j\theta) & 0 \\ 0 & \exp(j\theta) \end{bmatrix}T^{-1} = \begin{bmatrix} \cos\theta & -\sin\theta \\ \sin\theta & \cos\theta \end{bmatrix}$$

Matrix G can be calculated as described by Equation (9) below, by using Equations (7) and (8) above and calculating the product of the three matrices shown in FIG. 2(a).

$$G = \begin{bmatrix} \cos\theta & -\sin\theta \\ \sin\theta & \cos\theta \end{bmatrix}\begin{bmatrix} F(s) & 0 \\ 0 & F(s) \end{bmatrix}\begin{bmatrix} \cos\theta & \sin\theta \\ -\sin\theta & \cos\theta \end{bmatrix} = \qquad (9)$$

$$T\begin{bmatrix} \exp(-j\theta) & 0 \\ 0 & \exp(j\theta) \end{bmatrix}T^{-1}\begin{bmatrix} F(s) & 0 \\ 0 & F(s) \end{bmatrix}T\begin{bmatrix} \exp(j\theta) & 0 \\ 0 & \exp(-j\theta) \end{bmatrix}$$

$$T^{-1} = T\begin{bmatrix} \exp(-j\theta) & 0 \\ 0 & \exp(j\theta) \end{bmatrix}\begin{bmatrix} 1 & -j \\ 1 & j \end{bmatrix}\begin{bmatrix} F(s) & 0 \\ 0 & F(s) \end{bmatrix}\begin{bmatrix} \frac{1}{2} & \frac{1}{2} \\ \frac{j}{2} & -\frac{j}{2} \end{bmatrix}$$

$$\begin{bmatrix} \exp(j\theta) & 0 \\ 0 & \exp(-j\theta) \end{bmatrix}T^{-1} =$$

$$T\begin{bmatrix} \exp(-j\theta) & 0 \\ 0 & \exp(j\theta) \end{bmatrix}\begin{bmatrix} 1 & -j \\ 1 & j \end{bmatrix}\begin{bmatrix} \frac{1}{2}F(s) & \frac{1}{2}F(s) \\ \frac{j}{2}F(s) & -\frac{j}{2}F(s) \end{bmatrix}$$

$$\begin{bmatrix} \exp(j\theta) & 0 \\ 0 & \exp(-j\theta) \end{bmatrix}T^{-1} = T\begin{bmatrix} \exp(-j\theta) & 0 \\ 0 & \exp(j\theta) \end{bmatrix}$$

$$\begin{bmatrix} F(s) & 0 \\ 0 & F(s) \end{bmatrix}\begin{bmatrix} \exp(j\theta) & 0 \\ 0 & \exp(-j\theta) \end{bmatrix}T^{-1}\Lambda$$

Figure 3:
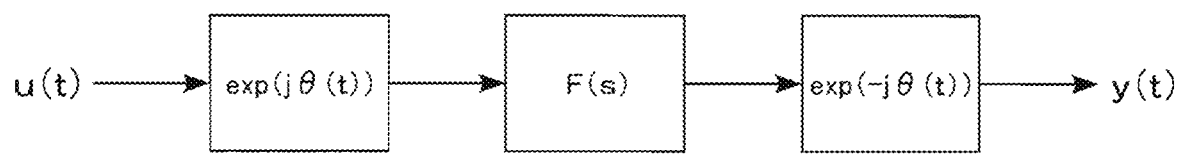
FIG. 3 is a block diagram for describing a matrix calculation.

The elements in the first row and the first column of the three central matrices in Equation (9) above can be described by a block diagram shown in FIG. 3. The input-output characteristics of the block diagram shown in FIG. 3 are calculated as follows:

$$y(t) = \exp(-j\theta(t))\int_0^t f(t-\tau)\exp(j\theta(\tau))u(\tau)d\tau$$

$$= \int_0^t f(t-\tau)\exp(-j(\theta(t)-\theta(\tau)))u(\tau)d\tau$$

where F(s) is a single-input single-output transfer function which has an impulse response f(t).

If $\theta(t)=\omega_0 t$, $\theta(t)-\theta(\tau)=\omega_0 t - \omega_0\tau=\omega_0(t-\tau)=\theta(t-\tau)$. Therefore, the input-output characteristic of the block diagram shown in FIG. 3 are equivalent to those of a linear time-invariant system which has impulse response f(t) exp($-j\omega_0 t$). Laplace transformation of the impulse response f(t) exp($-j\omega_0 t$) provides a transfer function of F($s+j\omega_0$). Similarly, the input-output characteristics of the block diagram shown in FIG. 3 with exp($-j\theta(t)$) and exp($j\theta(t)$) exchanged with each other are the input-output characteristics of a transfer function of F($s-j\omega_0$).

Therefore, proceeding further with Equation (9) gives the following:

$$G = T\begin{bmatrix} \exp(-j\theta) & 0 \\ 0 & \exp(j\theta) \end{bmatrix}\begin{bmatrix} F(s) & 0 \\ 0 & F(s) \end{bmatrix}\begin{bmatrix} \exp(j\theta) & 0 \\ 0 & \exp(-j\theta) \end{bmatrix}T^{-1} = \qquad (10)$$

$$T\begin{bmatrix} F(s+j\omega_0) & 0 \\ 0 & F(s-j\omega_0) \end{bmatrix}$$

$$T^{-1} = \begin{bmatrix} \frac{1}{2} & \frac{1}{2} \\ \frac{j}{2} & -\frac{j}{2} \end{bmatrix}\begin{bmatrix} F(s+j\omega_0) & 0 \\ 0 & F(s-j\omega_0) \end{bmatrix}$$

$$\begin{bmatrix} 1 & -j \\ 1 & j \end{bmatrix} = \begin{bmatrix} \frac{1}{2} & \frac{1}{2} \\ \frac{j}{2} & -\frac{j}{2} \end{bmatrix}\begin{bmatrix} F(s+j\omega_0) & -jF(s+j\omega_0) \\ F(s-j\omega_0) & jF(s-j\omega_0) \end{bmatrix}$$

$$\begin{bmatrix} \frac{F(s+j\omega_0)-F(s-j\omega_0)}{2} & \frac{F(s+j\omega_0)-F(s-j\omega_0)}{2} \\ \frac{F(s+j\omega_0)-F(s-j\omega_0)}{2j} & \frac{F(s+j\omega_0)-F(s-j\omega_0)}{2} \end{bmatrix}\Lambda$$

Hence, the process in FIG. 2(a) can be converted into a process shown in FIG. 2(b). The process shown in FIG. 2(b) is equivalent to carrying out fixed-to-rotating coordinate conversion, the operation given by a predetermined transfer function F(s), and then rotating-to-fixed coordinate conversion. In other words, the system of the above-described process is a linear time-invariant system.

Figure 4:
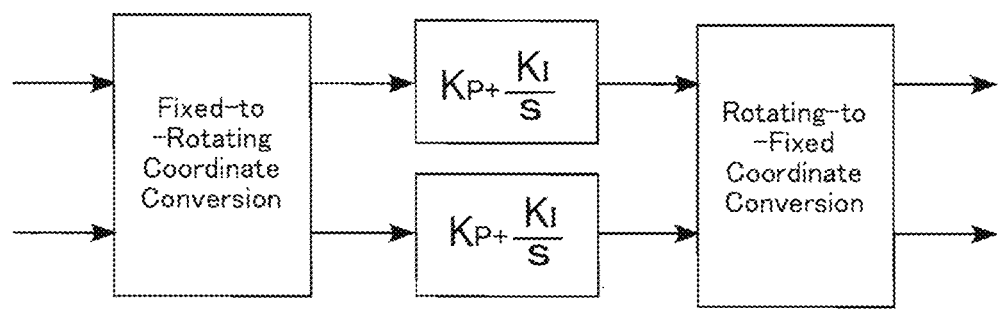
FIG. 4 is a block diagram of a process in which fixed-to-rotating coordinate conversion is followed by PI control and then by rotating-to-fixed coordinate conversion.

Transfer function for the PI (proportional-integral) control controller can be expressed as $F(s)=K_P+K_I/s$, where $K_P$ and $K_I$ representing proportional and integral gains respectively. Therefore, the process shown in FIG. 4, specifically, the transfer function matrix $G_{PI}$ which represents a process equivalent to carrying out fixed-to-rotating coordinate conversion, PI control, and then rotating-to-fixed coordinate conversion can be calculated as Equation (11) below by using Equation (10) above:

$$G_{PI} = \begin{bmatrix} \cos\theta & \sin\theta \\ -\sin\theta & \cos\theta \end{bmatrix}\begin{bmatrix} K_P + \frac{K_I}{s} & 0 \\ 0 & K_P + \frac{K_I}{s} \end{bmatrix}\begin{bmatrix} \cos\theta & -\sin\theta \\ \sin\theta & \cos\theta \end{bmatrix} = \qquad (11)$$

$$\begin{bmatrix} \frac{1}{2}\left(K_P + \frac{K_I}{s+j\omega_0} + K_P + \frac{K_I}{s-j\omega_0}\right) & \frac{1}{2j}\left(K_P + \frac{K_I}{s+j\omega_0} - K_P - \frac{K_I}{s-j\omega_0}\right) \\ -\frac{i}{2j}\left(K_P + \frac{K_I}{s+j\omega_0} - K_P - \frac{K_I}{s-j\omega_0}\right) & \frac{1}{2}\left(K_P + \frac{K_I}{s+j\omega_0} + K_P + \frac{K_I}{s-j\omega_0}\right) \end{bmatrix} =$$

$$\begin{bmatrix} \frac{K_P s^2 + K_I s + K_P\omega_0^2}{s^2 + \omega_0^2} & \frac{-K_I\omega_0}{s^2 + \omega_0^2} \\ \frac{K_I\omega_0}{s^2 + \omega_0^2} & \frac{K_P s^2 + K_I s + K_P\omega_0^2}{s^2 + \omega_0^2} \end{bmatrix}\Lambda$$

Figure 5:
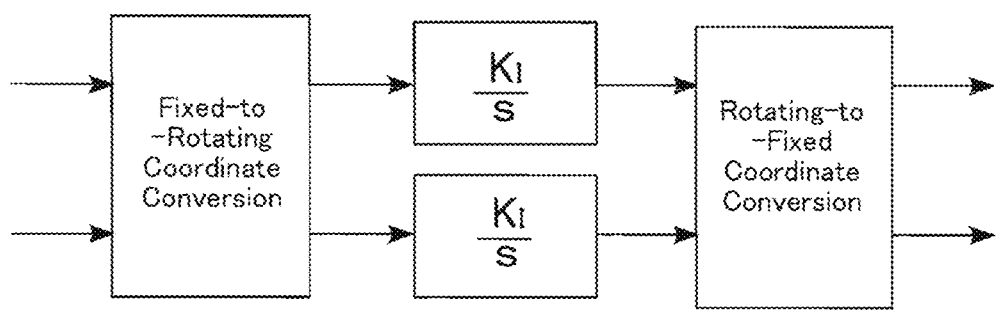
FIG. 5 is a block diagram of a process in which fixed-to-rotating coordinate conversion is followed by I control and then by rotating-to-fixed coordinate conversion.

Similarly, transfer function of the I (integral) controller can be expressed as $F(s)=K_I/s$, where $K_I$ is the integral gain. Therefore, the process shown in FIG. 5, i.e., the transfer function matrix $G_I$ which represents a process equivalent to carrying out fixed-to-rotating coordinate conversion, I control and then rotating-to-fixed coordinate conversion can be calculated as Equation (12) below, using Equation (10) above.

$$G_I = \begin{bmatrix} \cos\theta & \sin\theta \\ -\sin\theta & \cos\theta \end{bmatrix} \begin{bmatrix} \frac{K_I}{s} & 0 \\ 0 & \frac{K_I}{s} \end{bmatrix} \begin{bmatrix} \cos\theta & -\sin\theta \\ \sin\theta & \cos\theta \end{bmatrix} = \qquad (12)$$

$$\begin{bmatrix} \frac{1}{2}\left(\frac{K_I}{s+j\omega_0} + \frac{K_I}{s-j\omega_0}\right) & \frac{1}{2j}\left(\frac{K_I}{s+j\omega_0} - \frac{K_I}{s-j\omega_0}\right) \\ -\frac{1}{2j}\left(\frac{K_I}{s+j\omega_0} - \frac{K_I}{s-j\omega_0}\right) & \frac{1}{2}\left(\frac{K_I}{s+j\omega_0} + \frac{K_I}{s-j\omega_0}\right) \end{bmatrix} =$$

$$\begin{bmatrix} \frac{K_I s}{s^2+\omega_0^2} & \frac{-K_I\omega_0}{s^2+\omega_0} \\ \frac{K_I\omega_0}{s^2+\omega_0^2} & \frac{K_I s}{s^2+\omega_0^2} \end{bmatrix}$$

Hereinafter, description will be made for a case where a signal processor which performs the process given by the transfer function matrix $G_I$ expressed by Equation (12) above is used as an electric current controller in a control circuit of an interconnection inverter system, as a first embodiment of the present invention.

Figure 6:
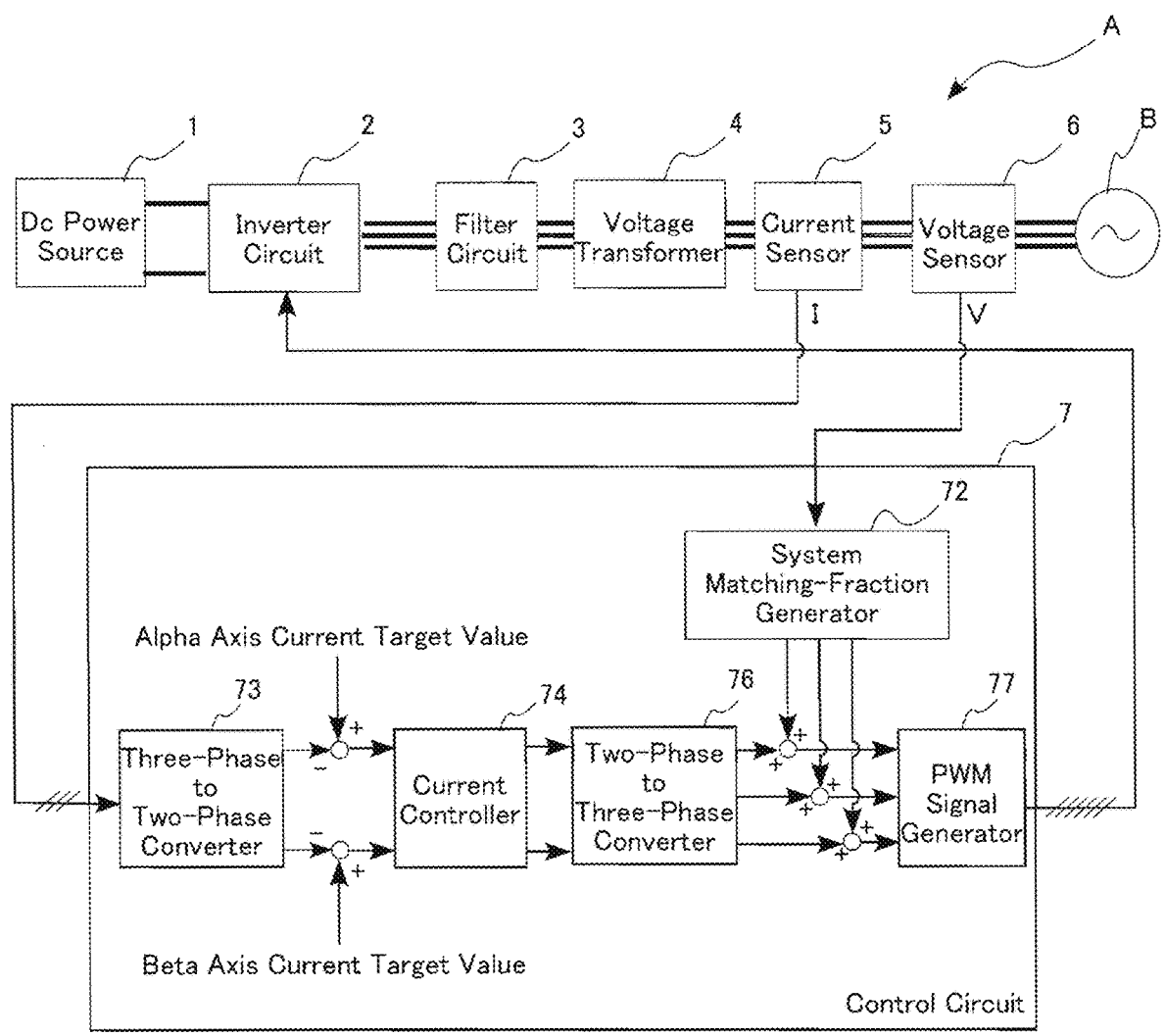
FIG. 6 is a block diagram for describing an interconnection inverter system according to a first embodiment.

FIG. 6 is a block diagram for describing an interconnection inverter system according to the first embodiment.

As shown in the figure, an interconnection inverter system A includes a DC power source 1, an inverter circuit 2, a filter circuit 3, a voltage transformer circuit 4, a current sensor 5, a voltage sensor 6, and a control circuit 7.

The DC power source is connected to the inverter circuit 2. The inverter circuit 2, the filter circuit 3, and the voltage transformer circuit 4 are connected in series in this order, to respective output lines of the phase U, phase V and phase W outputs, and then to a three-phase AC electrical power system B. The current sensor 5 and the voltage sensor 6 are disposed on the output side of the voltage transformer circuit 4. The control circuit 7 is connected to the inverter circuit 2. The interconnection inverter system A converts DC power from the DC power source 1 into AC power, for supply to the electrical power system B. It should be noted here that the configuration of the interconnection inverter system A is not limited to the above. For example, the current sensor 5 and the voltage sensor 6 may be disposed on the input side of the voltage transformer circuit 4, or other sensors may be included for control of the inverter circuit 2. Also, the voltage transformer circuit 4 may be disposed on the input side of the filter circuit 3, or there may be a configuration which does not include the voltage transformer circuit 4, i.e., so called transformerless configuration may be utilized. Still further, a DC/DC converter circuit may be placed between the DC power source 1 and the inverter circuit 2.

The DC power source 1, which outputs DC power, includes solar cells for example. The solar cells convert energy of the sun light into electric energy thereby generating DC power. The DC power source 1 outputs the generated DC power to the inverter circuit 2. The DC power source 1 is not limited to those which generate DC power by solar cells. For example, the DC power source 1 may be provided by fuel cells, batteries, electrical double layer capacitors, lithium-ion batteries, or an apparatus which outputs DC power by converting AC power from a diesel engine powered electric generator, a micro gas turbine generator, a wind driven turbine power generator, etc.

The inverter circuit 2 converts a DC voltage from the DC power source 1 into an AC voltage, and outputs the AC voltage to the filter circuit 3. The inverter circuit 2 is a three-phase inverter provided by a PWM control inverter circuit which includes unillustrated six switching elements in three sets. The inverter circuit 2 switches ON and OFF each of the switching elements based on PWM signals from the control circuit 7, thereby converting the DC voltage from the DC power source 1 into AC voltages. However, the inverter circuit 2 is not limited to this, and may be provided by a multi-level inverter for example.

The filter circuit 3 removes high frequency components generated in the process of switching operation from the AC voltages inputted from the inverter circuit 2. The filter circuit 3 includes a low-pass filter implemented by a reactor and a capacitor. After the high frequency component removal step in the filter circuit 3, the AC voltages are outputted to the voltage transformer circuit 4. The configuration of the filter circuit 3 is not limited to the above, and may be provided by any conventional filter circuit capable of removing high frequency components. The voltage transformer circuit 4 increases or decreases the AC voltage outputted from the filter circuit 3 to a voltage which is substantially equal to a system voltage.

The current sensor 5 detects an AC current (specifically, an output current from the interconnection inverter system A) in each phase outputted from the voltage transformer circuit 4. The detected current signals I (Iu, Iv, Iw) are inputted to the control circuit 7. The voltage sensor 6 detects a system voltage in each phase of the electrical power system B. The detected voltage signals V (Vu, Vv, Vw) are inputted to the control circuit 7. It should be noted here that the output voltage from the interconnection inverter system A is substantially equal to the system voltage.

The control circuit 7 controls the inverter circuit 2, and is implemented by a microcomputer for example. The control circuit 7 generates PWM signals based on the current signals I from the current sensor 5 and the voltage signals V from the voltage sensor 6, and outputs the PWM signals to the inverter circuit 2. Based on the detection signals inputted from each sensor, the control circuit 7 generates command value signals as instruction signals for the output voltage waveform of the output from the interconnection inverter system A; then generates pulse signals based on the command value signals; and then outputs the pulse signals as the PWM signals. Based on the PWM signals inputted, the inverter circuit 2 performs ON/OFF switching operation to each switching element, thereby outputting AC voltages which have corresponding waveforms to the command value signals. The control circuit 7 controls the output current by varying the command value signal waveforms thereby varying the output voltage waveforms of the interconnection inverter system A. Through this process, the control circuit 7 performs various kinds of feedback control.

FIG. 6 only shows a configuration for output current control. The figure does not show other control configurations. Actually, however, the control circuit 7 also performs DC voltage control (i.e., a feedback control to ensure that the input DC voltage will have a predetermined voltage target value), reactive power control (i.e., a feedback control to ensure that output reactive power will have a predetermined reactive power target value) etc. It should be noted here that the types of control performed by the control circuit 7 are not limited to the above. For example, the circuit may also perform output voltage control, active power control, etc.

The control circuit 7 includes a system matching-fraction generator 72, a three-phase to two-phase converter 73, a current controller 74, a two-phase to three-phase converter 76, and a PWM signal generator 77.

The system matching-fraction generator 72 receives a voltage signal V from the voltage sensor 6, and generates and outputs system command value signals Ku, Kv, Kw. The system command value signals Ku, Kv, Kw serve as reference signals for command value signals used to define the output voltage waveform to be outputted from the interconnection inverter system A. As will be described later, the system command values Ku, Kv, Kw undergo a correction process using correction value signals Xu, Xv, Xw, to obtain the command value signals.

The three-phase to two-phase converter 73 is identical with the three-phase to two-phase converter 73 in FIG. 37, receives the three current signals Iu, Iv, Iw from the current sensor 5 and converts them into an alpha axis current signal Iα and a beta axis current signal Iβ. The conversion process performed in the three-phase to two-phase converter 73 is represented by the formula which was shown earlier as Equation (1).

The current controller 74 receives the alpha axis current signal Iα and the beta axis current signal Iβ from the three-phase to two-phase converter 73 and deviations from respective target values, to generate correction value signals Xα, Xβ for the current control. The current controller 74 performs a process represented by the transfer function matrix $G_I$ of Equation (12). In other words, the controller performs a process expressed by Equation (13) below, where the deviations of the alpha axis current signal Iα and the beta axis current signal Iβ from their respective target values are represented by ΔIα and ΔIβ. As for the angular frequency $\omega_0$, a predetermined value is set as an angular frequency (for example, $\omega_0=120\pi$ [rad/sec] (60 [Hz])) for the system voltage fundamental wave, and the integral gain $K_I$ is a pre-designed value. Also, the current controller 74 performs a stability margin maximization process, which includes an adjustment to correct phase delay in the control loop. The deviations ΔIα, ΔIβ represent the "first input signal" and "the second input signal" according to the present invention respectively whereas the correction value signals Xα, Xβ represent "the first output signal" and "the second output signal" according to the present invention respectively.

$$\begin{bmatrix} X\alpha \\ X\beta \end{bmatrix} = G_I \begin{bmatrix} \Delta I\alpha \\ \Delta I\beta \end{bmatrix} \qquad (13)$$

$$= \begin{bmatrix} \dfrac{K_I s}{s^2 + \omega_0^2} & \dfrac{-K_I \omega_0}{s^2 + \omega_0^2} \\ \dfrac{K_I \omega_0}{s^2 + \omega_0^2} & \dfrac{K_I s}{s^2 + \omega_0^2} \end{bmatrix} \begin{bmatrix} \Delta I\alpha \\ \Delta I\beta \end{bmatrix} \Lambda$$

In the present embodiment, the alpha axis current target value and the beta axis current target value are provided by values obtained by rotating-to-fixed coordinate conversion values of the d axis current target value and the q axis current target value respectively. The d axis current target value is provided by a correction value for an unillustrated DC voltage control whereas the q axis current target value is provided by a correction value for an unillustrated reactive power control. It should be noted here that in cases where three-phase current target values are given, those target values should be subjected to three-phase/two-phase conversion to obtain the alpha axis current target value and the beta axis current target value. Alternatively, deviations of the three current signals Iu, Iv, Iw from the three-phase current target values may be calculated first, so that these three deviation signals should be subjected to three-phase/two-phase conversion for input to the current controller 74. Also, if the alpha axis current target value and the beta axis current target value are supplied directly, the supplied target values may be used directly.

Figure 7:
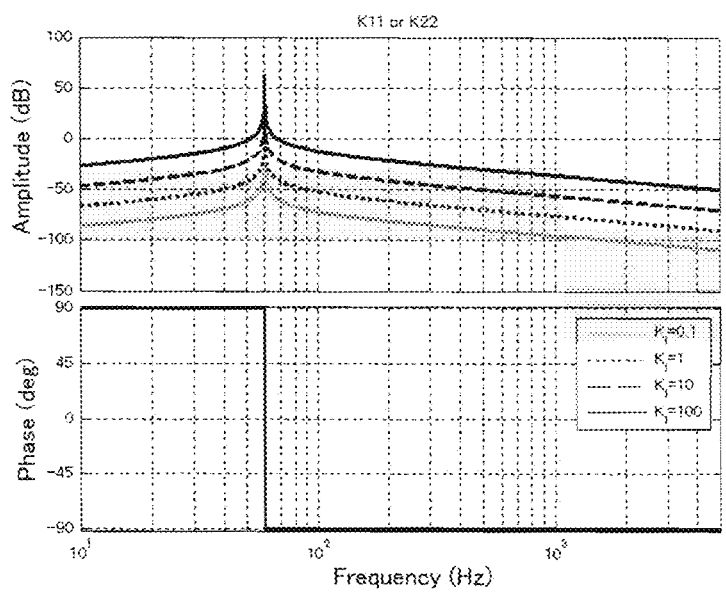
FIG. 7 is a Bode diagram for analyzing transfer functions as elements of a matrix $G_I$.
Figure 7:
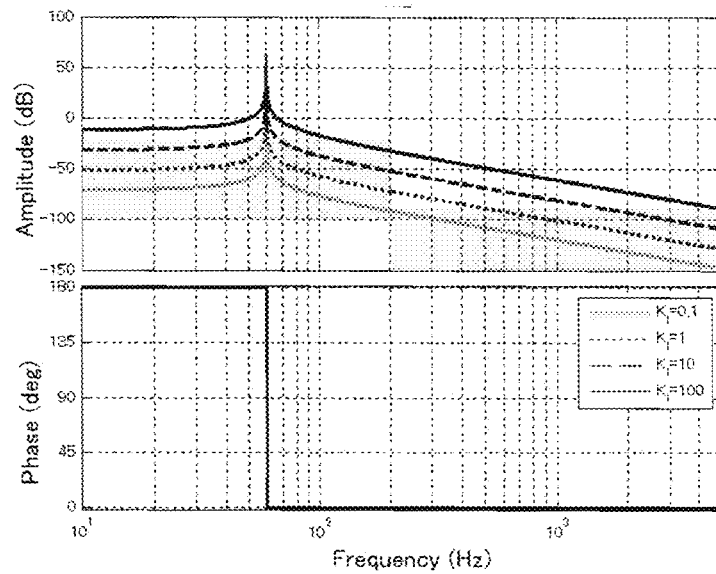
Figure 7:
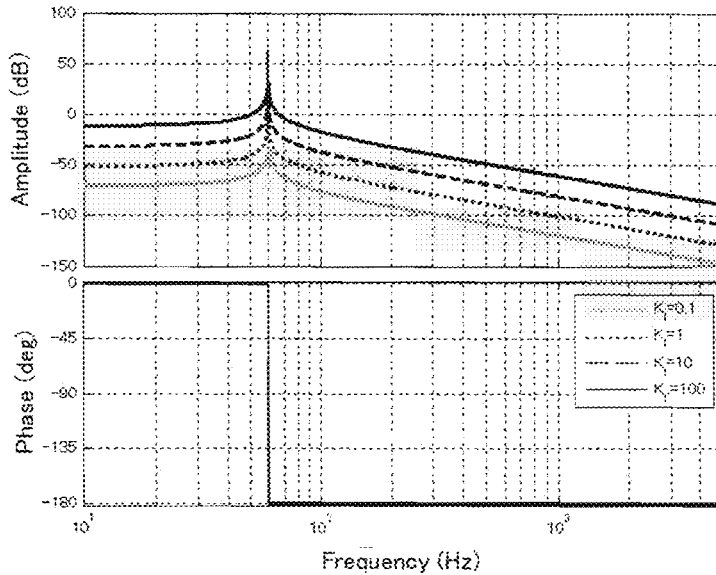

FIG. 7 is a Bode diagram for analyzing transfer functions as elements of a matrix $G_I$. FIG. 7(a) shows a transfer function of the element in the first row and the first column of the matrix $G_I$ (hereinafter will be denoted as "element (1, 1)"; the same applies to the other elements) and the element (2, 2). FIG. 7(b) shows a transfer function of the element (1, 2) of the matrix $G_I$ whereas FIG. 7(c) shows a transfer function of the element (2, 1) of the matrix $G_I$. FIG. 7 shows a case where a system voltage fundamental wave frequency (hereinafter will be called "center frequency"; in addition, an angular frequency which corresponds to the center frequency will be called "center angular frequency") is 60 Hz (specifically, in a case where the angular frequency $\omega_0=120\pi$), and integral gain $K_I$ is "0.1", "1", "10" and "100".

All amplitude characteristics in FIGS. 7(a), (b) and (c) show a peak at the center frequency, and the amplitude characteristic increases as the integral gain K increases. Also, FIG. 7(a) shows a phase characteristic, which attains 0 degree at the center frequency. In other words, the transfer functions of the element (1, 1) and the element (2, 2) of the matrix $G_I$ allow signals of the center frequency (center angular frequency) to pass through without changing their phases. FIG. 7(b) shows a phase characteristic, which attains 90 degrees at the center frequency. In other words, the transfer function of the element (1, 2) of the matrix $G_I$ allows signals of the center frequency (center angular frequency) to pass through with a 90-degree phase advance. On the other hand, FIG. 7(c) shows a phase characteristic, which attains −90 degrees at the center frequency. In other words, the transfer function of the element (2, 1) of the matrix $G_I$ allows signals of the center frequency (center angular frequency) to pass through with a 90-degree phase delay.

In the present embodiment, the current controller 74 is designed by using a H loop shaping method, which is a linear control theory, with a frequency weight being provided by the transfer function matrix $G_I$. The process performed in the current controller 74 is expressed as a transfer function matrix $G_I$, and therefore is a linear time-invariant process. Hence, it is possible to perform control system design using a linear control theory.

The current controller 74 must satisfy design specifications requiring that the output current follows a sine-wave target value, and that the output is restored to a predetermined ratio within a predetermined time (quick response) at the time of momentary voltage drop. For the system output to stay perfectly on a given target value, a closed loop system must have the same polarity as the target generator, and the closed loop system must be an asymptotic stabilization system (internal model principle). The pole of the sine-wave target value is $\pm j\omega_0$, whereas the pole of the item $1/(s^2+\omega_0^2)$ contained in the transfer function of each element of the matrix $G_I$ is also $\pm j\omega_0$. Therefore, the closed loop system and the target generator have the same polarity. Also, it is possible, if a H∞ loop shaping method is used, to design a controller in which the closed loop system achieves asymptotic stabilization. Therefore, using a H∞ loop shaping method enables to satisfy the quick response conditions easily and to design the most stable control system which meets the design specifications.

It should be noted here that design method to be used in designing the control system is not limited to this. In other words, other linear control theories may be employed for the design. Examples of usable methods include loop shaping method, optimum control, H∞ control, mixed sensitivity problem, and more.

Returning to FIG. 6, the two-phase to three-phase converter 76 is identical with the two-phase to three-phase converter 76 in FIG. 37, and converts the correction value signals Xα, Xβ from the current controller 74 into three correction value signals Xu, Xv, Xw. The conversion process performed in the two-phase to three-phase converter 76 is represented by a formula shown earlier as Equation (4).

The system command value signals Ku, Kv, Kw from the system matching-fraction generator 72 and the correction value signals Xu, Xv, Xw from the two-phase to three-phase converter 76 are added to each other respectively, to obtain command value signals X'u, X'v, X'w, which are then inputted to the PWM signal generator 77.

The PWM signal generator 77 generates PWM signals Pu, Pv, Pw by triangle wave comparison method based on the command value signals X'u, X'v, X'w inputted thereto and a carrier signal which is generated as a triangle-wave signal at a predetermined frequency (e.g. 4 kHz). In the triangle wave comparison method, each of the command value signals X'u, X'v, X'w are compared to the carrier signal, to generate a pulse signals. For example, a PWM signal Pu assumes a high level when the command value signal X'u is greater than the carrier signal and a low level when it is not, for example. The generated PWM signals Pu, Pv, Pw are outputted to the inverter circuit 2.

In the present embodiment, the control circuit 7 performs a control in the fixed coordinate system without making fixed-to-rotating coordinate conversion nor rotating-to-fixed coordinate conversion. As has been described earlier, the transfer function matrix $G_I$ gives a process which is equivalent to carrying out fixed-to-rotating coordinate conversion, then I control and then rotating-to-fixed coordinate conversion. Therefore, the current controller 74 which performs the process represented by the transfer function matrix $G_I$ performs an equivalent process to the process in FIG. 37 performed by the fixed-to-rotating coordinate converter 78, the rotating-to-fixed coordinate converter 79, and the I control process (implemented by the PI control process performed by the PI controller 74b and the PI controller 75b in FIG. 37). Also, as shown in each Bode diagram in FIG. 7, the transfer function of each element in the matrix $G_I$ has an amplitude characteristic which attains a peak at the center frequency. In other words, in the current controller 74, only the center frequency component is a high-gain component. Therefore, there is no need for providing the LPF 74a or 75a in FIG. 37.

Also, since the process performed in the current controller 74 is expressed as the transfer function matrix $G_I$, it is a linear time-invariant process. The control circuit 7 does not include nonlinear time-varying processes, i.e., the circuit does not include fixed-to-rotating coordinate conversion process or rotating-to-fixed coordinate conversion process. Hence, the entire current control system is a linear time-invariant system. Therefore, the arrangement enables control system design and system analysis using a linear control theory. As described, use of the transfer function matrix $G_I$ expressed by Equation (12) enables to replace the non-linear process in which fixed-to-rotating coordinate conversion is followed by I control and then by rotating-to-fixed coordinate conversion with a linear time-invariant multi-input multi-output system. This makes it easy to perform system analysis and control system design thereby.

It should be noted here that in the embodiment described above, the current controller 74 performs the process represented by Equation (13). However, each element in the matrix $G_I$ may be given a different value from others for its integral gain $K_I$. Specifically, the integral gain $K_I$ for each element may have a different value from one transfer function to another. For example, there may be a design to include additional characteristics in the alpha axis component such as improved response, improved stability, etc. Another example of adding one more characteristic may be to assign "0" to the integral gain $K_I$ of the element (1, 2) and that of the element (2, 1), to control both of negative-phase sequence components and negative-phase sequence components. Later, description will be made for cases of controlling both positive-phase and negative-phase sequence components. It should be noted here that setting a different integral gain $K_I$ for each element does not change the phase characteristic of the transfer function which represents each element. Therefore, the transfer function of the element (1, 1) and that of the element (2, 2) allow center frequency signals pass through without changing their phases whereas the transfer function of the element (1, 2) allows the center frequency signals to pass through with a 90-degree phase advance, and the transfer function of the element (2, 1) allows the center frequency signals to pass through with a 90-degree phase delay.

In the first embodiment described thus far, description was made for a case where positive phase sequence component control is performed to the fundamental wave component of the current signals Iu, Iv, Iw. However, the present invention is not limited to this. In addition to the positive phase sequence component signals in the fundamental wave components, the current signals Iu, Iv, Iw are superimposed with negative phase sequence component signals. There may be an arrangement where control is provided only to these negative phase sequence component signals.

Figure 8:
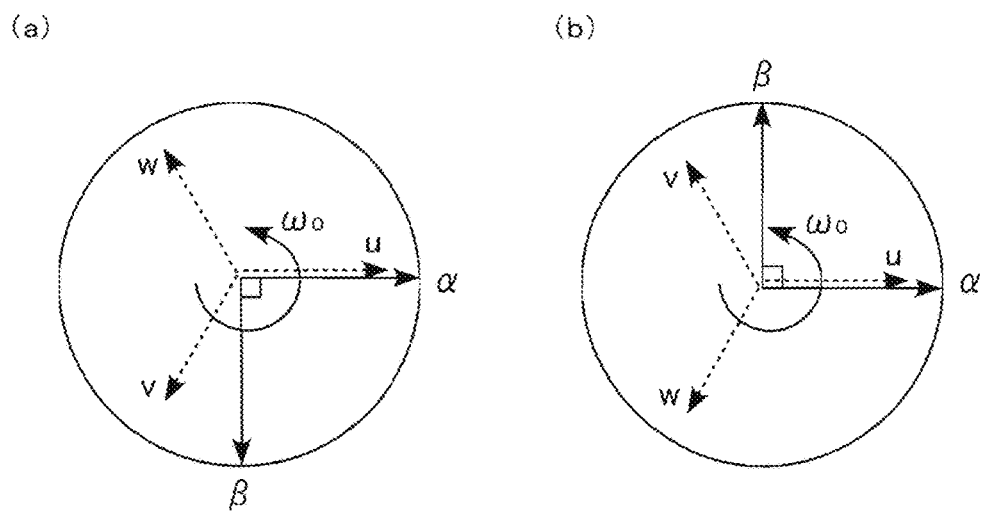
FIG. 8 is a diagram for describing a positive phase sequence component signal and a negative phase sequence component signal.

FIG. 3 is a drawing for describing positive phase sequence component signals and negative phase sequence component signals. FIG. 8(a) shows a positive phase sequence component signal whereas FIG. 8(b) shows a negative phase sequence component signal.

In FIG. 8(a), arrows in broken lines are vectors u, v, w representing positive phase sequence components in the fundamental wave component in current signals Iu, Iv, Iw. The vectors u, v, w have different directions at a 120-degree interval, and are identified in this order in the clockwise direction, rotating in the counterclockwise direction at an angular frequency of $\omega_0$. When the current signals Iu, Iv, Iw undergo three-phase/two-phase conversion, resulting positive phase sequence components of the fundamental wave component in the alpha axis current signal Iα and the beta axis current signal Iβ are indicated by solid-line arrow vectors α, β. The vectors α, β have a 90-degree clockwise difference in direction, and are rotating in the counterclockwise direction at an angular frequency of $\omega_0$.

In other words, the positive phase sequence component in the fundamental wave component of the alpha axis current signal IL outputted from the three-phase to two-phase converter 73 (see FIG. 6) has a 90-degree phase advance over the positive phase sequence component in the fundamental wave component of the beta axis current signal Iβ. Therefore, the positive phase sequence component in the fundamental wave component of the deviation ΔIα from the target value also has a 90-degree phase advance over the positive phase sequence component in the fundamental wave component of the deviation $\Delta I\beta$. Performing the process represented by the transfer function of the element (1, 1) in the matrix $G_I$ to the deviation $\Delta I\alpha$ does not change the phase of the positive phase sequence component in the fundamental wave component (see FIG. 7(a)). Also, performing the process represented by the transfer function of the element (1, 2) in the matrix $G_I$ to the deviation $\Delta I\beta$ advances the phase of the positive phase sequence component in the fundamental wave component by 90 degrees (see FIG. 7(b)). Therefore, both phases are now the same as the phase of the positive phase sequence component in the fundamental wave component of the deviation $\Delta I\alpha$, which means adding the two will make enhancement. On the other hand, performing the process represented by the transfer function of the element (2, 1) in the matrix $G_I$ to the deviation $\Delta I\alpha$ delays the phase of the positive phase sequence component in the fundamental wave component by 90 degrees (see FIG. 7(c)). Also, performing the process represented by the transfer function of the element (2, 2) in the matrix $G_I$ to the deviation $\Delta I\beta$ does not change the phase of the positive phase sequence component in the fundamental wave component. Therefore, both phases are now the same as the phase of the positive phase sequence component in the fundamental wave component of the deviation $\Delta I\beta$, which means adding the two will make enhancement.

The negative phase sequence component is a component in which the phase sequence is reversed from that of the positive phase sequence component. In FIG. 8(b), arrows in broken lines are vectors u, v, w representing negative phase sequence components in the fundamental wave components in current signals Iu, Iv, Iw. The vectors u, v, w have different directions at a 120-degree interval, are identified in this order in the counterclockwise direction, and are rotating in the counterclockwise direction at an angular frequency of $\omega_0$. When the current signals Iu, Iv, Iw undergo three-phase/two-phase conversion, resulting negative phase sequence component of the fundamental wave component in the alpha axis current signal I$\alpha$ and the beta axis current signal I$\beta$ are indicated by solid-line arrow vectors $\alpha$, $\beta$. The vectors $\alpha$, $\beta$ have a 90-degree counterclockwise difference in direction, and are rotating in the counterclockwise direction at an angular frequency of $\omega_0$.

In other words, the negative phase sequence component in the fundamental wave component of the alpha axis current signal I$\alpha$ outputted from the three-phase to two-phase converter 73 has a 90-degree phase delay from the negative phase sequence component in the fundamental wave component of the beta axis current signal I$\beta$. Performing the process represented by the transfer function of the element (1, 1) in the matrix $G_I$ to the deviation $\Delta I\alpha$ does not change the phase of the negative phase sequence component in the fundamental wave component. Also, performing the process represented by the transfer function of the element (1, 2) in the matrix $G_I$ to the deviation $\Delta I\beta$ advances the phase of the negative phase sequence component in the fundamental wave component by 90 degrees. Therefore, the two phases become opposite to each other, which means they cancel each other when the two are added to each other. On the other hand, performing the process represented by the transfer function of the element (2, 1) in the matrix $G_I$ to the deviation $\Delta I\alpha$ delays the phase of the negative phase sequence component in the fundamental wave component by 90 degrees. Also, performing the process represented by the transfer function of the element (2, 2) in the matrix $G_I$ to the deviation $\Delta I\beta$ does not change the phase of the negative phase sequence component in the fundamental wave component. Therefore, the two phases become opposite to each other, which means they cancel each other when the two are added to each other. Therefore, the current controller 74 performs positive phase sequence component control of the fundamental wave component but does not perform negative phase sequence component control thereof.

Swapping the element (1, 2) and the element (2, 1) of the transfer function matrix $G_I$ will provide the opposite result of what was described above, i.e., positive phase sequence components in the fundamental wave component will cancel each other whereas negative phase sequence component will enhance each other. Therefore, negative phase sequence component control in the fundamental wave component can be performed in the first embodiment by using the transfer function matrix $G_I$ matrix in which the element (1, 2) and the element (2, 1) are swapped with each other.

Next, description will cover a case where both of positive-phase and negative-phase sequence components in the fundamental wave component are controlled.

The process represented by the transfer function of the element (1, 1) and the element (2, 2) in the matrix $G_I$ allows the positive-phase and the negative-phase sequence components in the fundamental wave component to pass through without changing their phases (see FIG. 7(a)). Therefore, it is possible to perform control on both of the positive-phase and the negative-phase sequence components in the fundamental wave component if the element (1, 2) and the element (2, 1) are "0" in the matrix $G_I$ represented by the Equation (12). In this case, there is no component enhancement unlike in the case where only the positive phase sequence component is controlled (where the matrix $G_I$ represented by Equation (12) is utilized), so the integral gain $K_I$ must be given a larger value accordingly. Hereinafter, description will be made for a second embodiment, where both of positive-phase and negative phase sequence components in the fundamental wave component are controlled.

Figure 9:
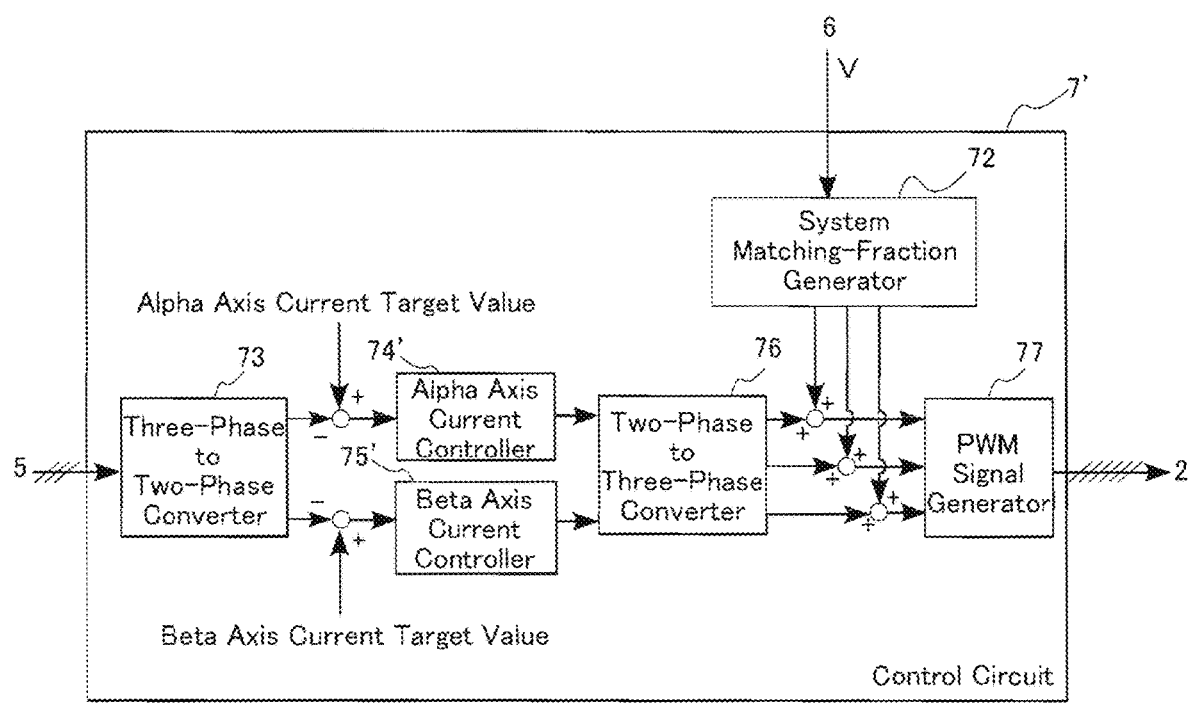
FIG. 9 is a block diagram for describing a control circuit according to a second embodiment.

FIG. 9 is a block diagram for describing a control circuit according to the second embodiment. In FIG. 9, those elements which are identical or similar to those included in the control circuit 7 in FIG. 6 are indicated by the same reference codes.

FIG. 9 shows a control circuit 7', which differs from the control circuit 7 (see FIG. 6) according to the first embodiment in that the current controller 74 is replaced by an alpha axis current controller 74' and a beta axis current controller 75'.

The alpha axis current controller 74' receives a deviation $\Delta I\alpha$ between the alpha axis current signal I$\alpha$ from the three-phase to two-phase converter 73 and an alpha axis current signal target value, to generate a correction value signal X$\alpha$ for the current control. The alpha axis current controller 74' performs a process represented by $K_I s/(s^2+\omega_0^2)$ which is a transfer function of the element (1, 1) and the element (2, 2) in the matrix $C_T$. Also, the alpha axis current controller 74' performs a stability margin maximization process, which includes phase adjustment to correct a phase delay in the control loop. The deviation $\Delta I\alpha$ represents the "input signal" according to the present invention whereas the correction value signal X$\alpha$ represents the "output signal" according to the present invention.

The beta axis current controller 75' receives a deviation $\Delta I\beta$ between the beta axis current signal I$\beta$ from the three-phase to two-phase converter 73 and a beta axis current target value, to generate a correction value signal X$\beta$ for the current control. The beta axis current controller 75' performs a process represented by $K_I s/(s^2+\omega_0^2)$ which is a transfer function of the element (1, 1) and the element (2, 2) in the matrix $G_I$. Also, the beta axis current controller 75' performs a stability margin maximization process, which includes phase adjustment to correct a phase delay in the control loop. The deviation $\Delta I\beta$ represents the "input signal" according to the present invention whereas the correction value signal $X\beta$ represents the "output signal" according to the present invention.

In the present embodiment, the alpha axis current controller 74' and the beta axis current controller 75' are designed by H∞ loop shaping method, which is based on a linear control theory, with a frequency weight being provided by the transfer function $K_I \cdot s/(s^2+\omega_0^2)$ for each of the controllers. The processes performed in the alpha axis current controller 74' and the beta axis current controller 75' are expressed by the transfer function $K_I \cdot s/(s^2+\omega_0^2)$, and therefore are linear time-invariant processes. Hence, it is possible to perform control system design using a linear control theory. It should be noted here that a linear control theory other than the H∞ loop shaping method may be utilized in the design.

The present embodiment provides the same advantages as offered by the first embodiment. The alpha axis current controller 74' and the beta axis current controller 75' may be given different values from each other for the integral gain $K_I$ in their transfer function $K_I \cdot s/(s^2+\omega_0^2)$. Specifically, a specific value may be individually designed and used as the integral gain $K_I$ for each of the alpha axis current controller 74' and the beta axis current controller 75'. For example, there may be a design to include additional characteristics in the alpha axis component such as improved response, improved stability, etc.

Figure 10:
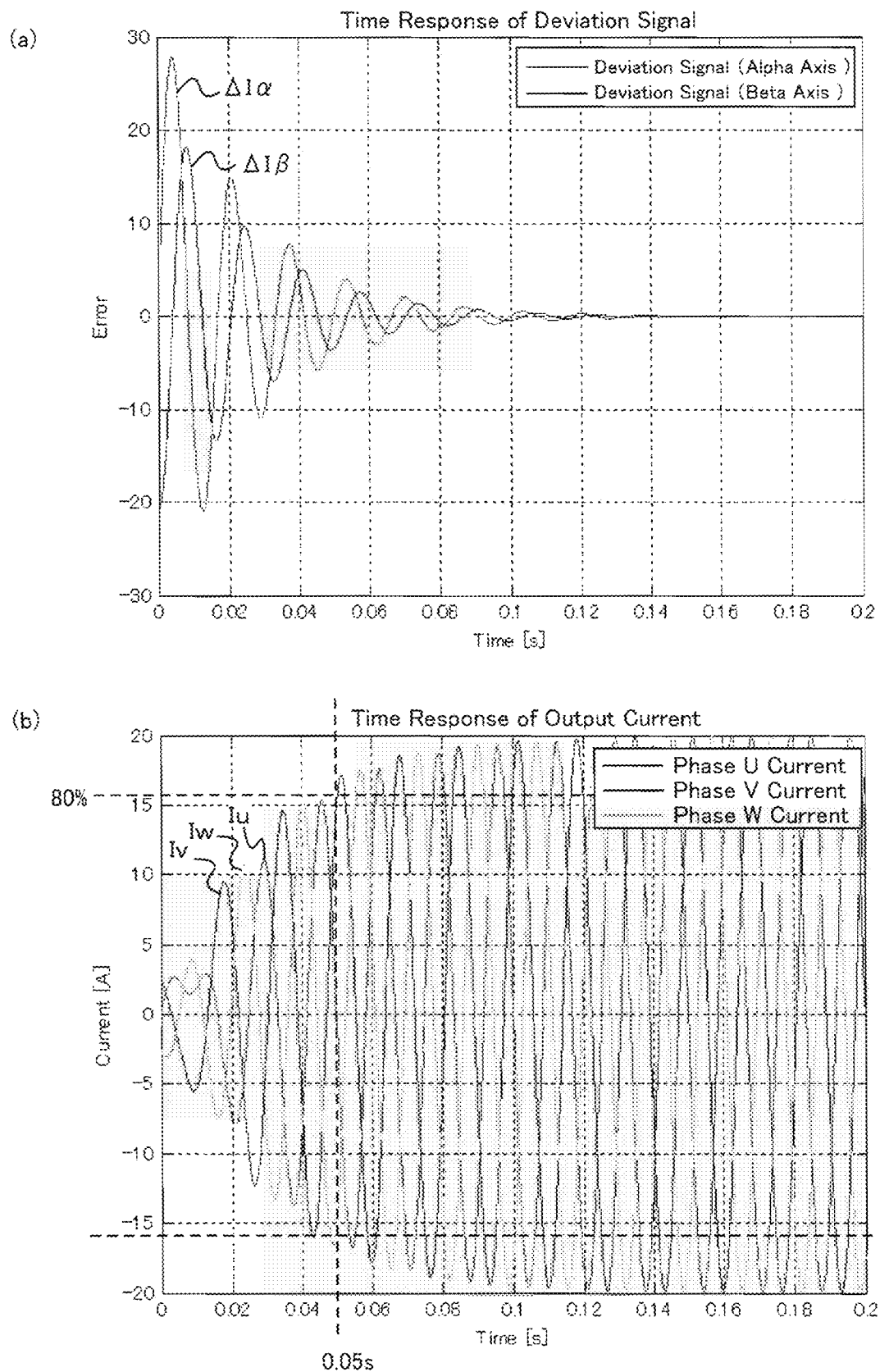
FIG. 10 is a diagram for describing a result of a simulation conducted with the second embodiment.

FIG. 10 is a diagram for describing a result of a simulation conducted with the second embodiment.

In the simulation, non-balanced distortion was added to the current of each phase in the interconnection inverter system A (see FIG. 6), with a target current set at 20 [A]. FIG. 10(*a*) shows a deviation $\Delta I\alpha$ inputted to the alpha axis current controller 74' (see FIG. 9), and a deviation $\Delta I\beta$ inputted to the beta axis current controller 75'. FIG. 10(*b*) shows current signals Iu, Iv, Iw detected in an output current of each phase by the current sensor 5. As shown in FIG. 10(*a*), the deviation $\Delta I\alpha$ and the deviation $\Delta I\beta$ became gradually smaller and attained "0" substantially, in 0.14 [s]. Also, as shown in FIG. 10(*b*), the current signals Iu, Iv, Iw became gradually larger and achieved 80-percent value, i.e. 16 [A], of the target in 0.05 [s]. Note also, that each of the current signals Iu, Iv, Iw has a balanced waveform. Since the non-balanced distortion has been removed and the positive phase sequence component follows the target value, it is clear that the alpha axis current controller 74' and the beta axis current controller 75' control positive-phase and negative-phase sequence components appropriately. Also, the control has sufficiently quick response.

In the first and the second embodiments, description was made for cases where three current signals Iu, Iv, Iw are converted into an alpha axis current signal Iα and a beta axis current signal Iβ to provide control. However, the present invention is not limited to this. For example, control may be provided through direct use of the three current signals Iu, Iv, Iw. Hereinafter, such a case will be described as a third embodiment.

Figure 11:
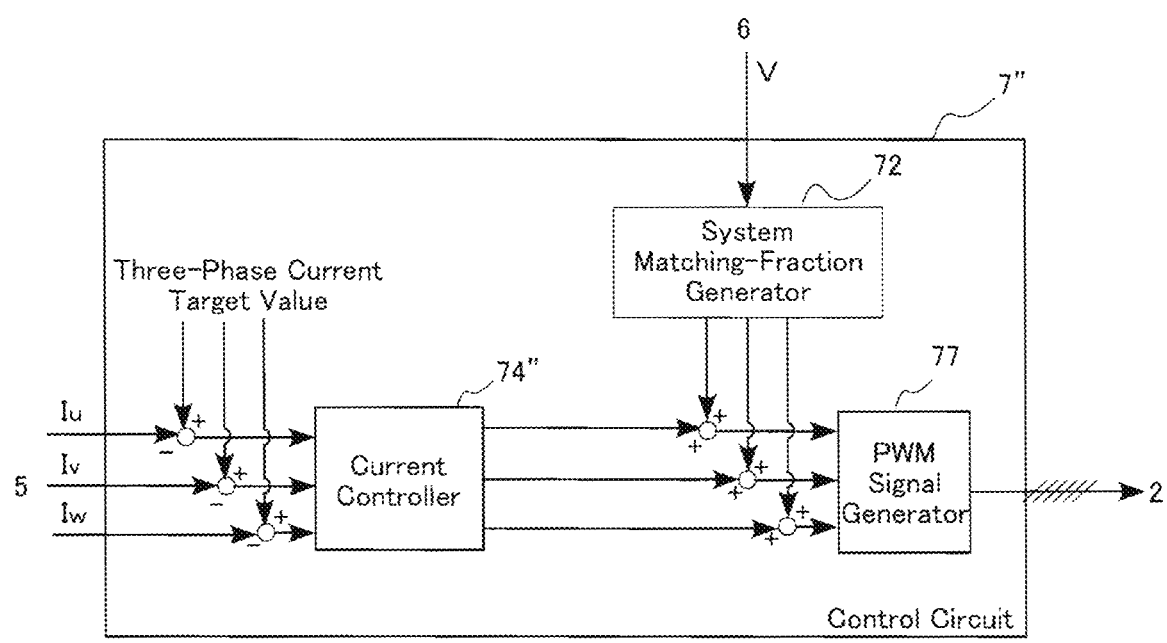
FIG. 11 is a block diagram for describing a control circuit according to a third embodiment.

FIG. 11 is a block diagram for describing a control circuit according to the third embodiment. In this figure, elements which are identical with or similar to those in the control circuit 7 in FIG. 6 are indicated by the same reference codes.

FIG. 11 shows a control circuit 7'', which differs from the control circuit 7 (see FIG. 6) according to the first embodiment in that it does not have the three-phase to two-phase converter 73 and the two-phase to three-phase converter 76, and that the current controller 74'' provides direct control using the current signals Iu, Iv, Iw.

Since three-phase to two-phase conversion and two-phase to three-phase conversion are expressed by Equation (1) and Equation (4), a process in which the three-phase to two-phase conversion is followed by the process represented by the matrix G of the transfer function and then followed by two-phase to three-phase conversion is represented by a transfer function matrix G' shown as Equation (14) below:

$$G' = \frac{2}{3}\begin{bmatrix} 1 & 0 \\ -\frac{1}{2} & \frac{\sqrt{3}}{2} \\ -\frac{1}{2} & -\frac{\sqrt{3}}{2} \end{bmatrix} G \begin{bmatrix} 1 & -\frac{1}{2} & -\frac{1}{2} \\ 0 & \frac{\sqrt{3}}{2} & -\frac{\sqrt{3}}{2} \end{bmatrix} = \frac{2}{3}\begin{bmatrix} 1 & 0 \\ -\frac{1}{2} & \frac{\sqrt{3}}{2} \\ -\frac{1}{2} & -\frac{\sqrt{3}}{2} \end{bmatrix} \quad (14)$$

$$\begin{bmatrix} \frac{F(s+j\omega_0)+F(s_j-j\omega_0)}{2} & \frac{F(s+j\omega_0)-F(s-j\omega_0)}{2j} \\ -\frac{F(s+j\omega_0)-F(s-j\omega_0)}{2j} & \frac{F(s+j\omega_0)+F(s-j\omega_0)}{2} \end{bmatrix} \times$$

$$\begin{bmatrix} 1 & -\frac{1}{2} & -\frac{1}{2} \\ 0 & \frac{\sqrt{3}}{2} & -\frac{\sqrt{3}}{2} \end{bmatrix} = \begin{bmatrix} G_{11}(s) & G_{12}(s) & G_{13}(s) \\ G_{21}(s) & G_{22}(s) & G_{23}(s) \\ G_{31}(s) & G_{32}(s) & G_{33}(s) \end{bmatrix} \Lambda$$

where:

$$G_{11}(s) = G_{22} = G_{33}(s) = \frac{F(s+j\omega_0)+F(s-j\omega_0)}{3}$$

$$G_{12}(s) = G_{23}(s) =$$

$$G_{31}(s) = \frac{(-1-\sqrt{3}\,j)\cdot F(s+j\omega_0) + (-1+\sqrt{3}\,j)\cdot F(s-j\omega_0)}{6}$$

$$G_{13}(s) = G_{21}(s) = G_{32}(s) =$$

$$\frac{(-1+\sqrt{3}\,j)\cdot F(s+j\omega_0) + (-1-\sqrt{3}\,j)\cdot F(s-j\omega_0)}{6}$$

Therefore, the transfer function matrix $G'_I$ representing the process performed by the current controller 74'' is represented by Equation (15) below:

$$G'_I = \begin{bmatrix} G_{I11}(s) & G_{I12}(s) & G_{I13}(s) \\ G_{I21}(s) & G_{I22}(s) & G_{I23}(s) \\ G_{I31}(s) & G_{I32}(s) & G_{I33}(s) \end{bmatrix} \Lambda \quad (15)$$

where:

$$G_{I11}(s) = G_{I22}(s) = G_{I33}(s) = \frac{1}{3}\left(\frac{K_I}{s+j\omega_0} + \frac{K_I}{s-j\omega_0}\right) = \frac{2}{3}\cdot\frac{K_I s}{s^2+\omega_0^2}$$

$$G_{I12}(s) = G_{I23}(s) =$$

$$G_{I31}(s) = \frac{1}{6}\left\{(-1-\sqrt{3}\,j)\cdot\frac{K_I}{s+j\omega_0} + (-1+\sqrt{3}\,j)\cdot\frac{K_I}{s-j\omega_0}\right\} =$$

$$-\frac{1}{3}\cdot\frac{K_I(s+\sqrt{3}\,\omega_0)}{s^2+\omega_0^2}$$

$$G_{I13}(s) = G_{I21}(s) = G_{I32}(s) =$$

$$\frac{1}{6}\left\{(-1+\sqrt{3}\,j)\cdot\frac{K_I}{s+j\omega_0} + (-1-\sqrt{3}\,j)\cdot\frac{K_I}{s-j\omega_0}\right\} =$$

$$-\frac{1}{3}\cdot\frac{K_I(s-\sqrt{3}\,\omega_0)}{s^2+\omega_0^2}$$

The current controller 74" receives deviations of the three current signals Iu, Iv, Iw outputted by the current sensor 5 from their respective target values, to generate correction value signals Xu, Xv, Xw for the current control. The current controller 74" performs the process represented by the transfer function matrix $G_I'$ of Equation (15) above. In other words, the controller performs a process expressed by Equation (16) below, where ΔIu, ΔIv, ΔIw represent the deviations of the current signals Iu, Iv, Iw from their respective target values. As for the angular frequency $\omega_0$, a predetermined value is set as an angular frequency (for example, $\omega_0=120\pi$ [rad/sec] (60 [Hz])) for the system voltage fundamental wave, and the integral gain $K_I$ is a pre-designed value. Also, the current controller 74" performs a stability margin maximization process, which includes phase adjustment to correct a phase delay in the control loop. The deviations ΔIu, ΔIv, ΔIw represent "the first input signal", "the second input signal", and "the third input signal" respectively according to the present invention whereas the correction value signals Xu, Xv, Xw represent "the first output signal", "the second output signal" and "the third output signal" according to the present invention.

$$\begin{bmatrix} Xu \\ Xv \\ Xw \end{bmatrix} = G_I' \begin{bmatrix} \Delta Iu \\ \Delta Iv \\ \Delta Iw \end{bmatrix} \Lambda \quad (16)$$

In the present embodiment, the target values for the current signals Iu, Iv, Iw are provided by values which are obtained by first performing rotating-to-fixed coordinate conversion to a d axis current target value and a q axis current target value and then performing two-phase to three-phase conversion to the obtained values. If three-phase current target values are supplied directly, the supplied target values may be used directly. Also, if the alpha axis current target value and the beta axis current target value are supplied, then the supplied values should be subjected to two-phase to three-phase conversion for use.

In the present embodiment, the current controller 74" is designed by H∞ loop shaping method, which is based on a linear control theory, with a frequency weight being provided by the transfer function matrix $G_I$. The process performed in the current controller 74" is expressed as the transfer function matrix $G_I'$, and therefore is a linear time-invariant process. Hence, it is possible to perform control system design using a linear control theory. It should be noted here that a linear control method other than the H∞ loop shaping method may be utilized in the design.

In the present embodiment, the current controller 74" which performs the process represented by the transfer function matrix $G_I'$ performs a process equivalent to the PI control in FIG. 37 performed by the three-phase to two-phase converter 73, the two-phase to three-phase converter 76, the fixed-to-rotating coordinate converter 78, the rotating-to-fixed coordinate converter 79, and the I control (implemented by the PI control performed by the PI controller 74b and the PI controller 75b in FIG. 37). Also, the process performed in the current controller 74" is expressed as the transfer function matrix $G_I'$, and therefore is a linear time-invariant process. Therefore, the entire current control system is a linear time-invariant system, and hence, the arrangement enables control system design and system analysis using a linear control theory.

If negative phase sequence component control of the fundamental wave component is to be performed in the third embodiment, it can be achieved by using a transfer function matrix $G_I'$ in which the elements $G_{I12}(s)$, $G_{I23}(s)$, $G_{I31}(s)$ are swapped with the elements $G_{I13}(s)$, $G_{I21}(s)$ and $G_{I32}(s)$ respectively (in other words, a transposed matrix of the matrix $G_I$ should be used).

Next, description will cover a case where both of the positive-phase and the negative-phase sequence components in the fundamental wave component are controlled in the third embodiment.

If "0" is given to the element (1, 2) and the element (2, 1) of the matrix G in the Equation (14) described above, the calculation provides a transfer function matrix G" represented by Equation (17) shown below.

$$G'' = \frac{2}{3} \begin{bmatrix} 1 & 0 \\ -\frac{1}{2} & \frac{\sqrt{3}}{2} \\ -\frac{1}{2} & -\frac{\sqrt{3}}{2} \end{bmatrix} \quad (17)$$

$$\begin{bmatrix} \frac{F(s+j\omega_0)+F(s-j\omega_0)}{2} & 0 \\ 0 & \frac{F(s+j\omega_0)+F(s-j\omega_0)}{2} \end{bmatrix} \times$$

$$\begin{bmatrix} 1 & -\frac{1}{2} & -\frac{1}{2} \\ 0 & \frac{\sqrt{3}}{2} & -\frac{\sqrt{3}}{2} \end{bmatrix} =$$

$$\frac{1}{3} \cdot \frac{F(s+j\omega_0)+F(s-j\omega_0)}{2} \begin{bmatrix} 2 & -1 & -1 \\ -1 & 2 & -1 \\ -1 & -1 & 2 \end{bmatrix} \Lambda$$

Therefore, a transfer function matrix $G''_I$ which represents the process performed by the current controller 74" when controlling both of the positive-phase and the negative phase sequence components are expressed by Equation (18) shown below:

$$G''_I = \frac{1}{3} \cdot \frac{K_I s}{s^2 + \omega_0^2} \begin{bmatrix} 2 & -1 & -1 \\ -1 & 2 & -1 \\ -1 & -1 & 2 \end{bmatrix} \Lambda \quad (18)$$

Thus far, in the first through the third embodiments, description was made for cases where the current controller 74 (the alpha axis current controller 74', the beta axis current controller 75', the current controller 74") performs a control which replaces the I control. However, the present invention is not limited by these. For example, an alternative control which replaces the PI control may be provided. If the current controller 74 in the first embodiment is to perform a control which replaces the PI control, it can be achieved by using a transfer function matrix $G_{PI}$ represented by Equation (11) above.

Figure 12:
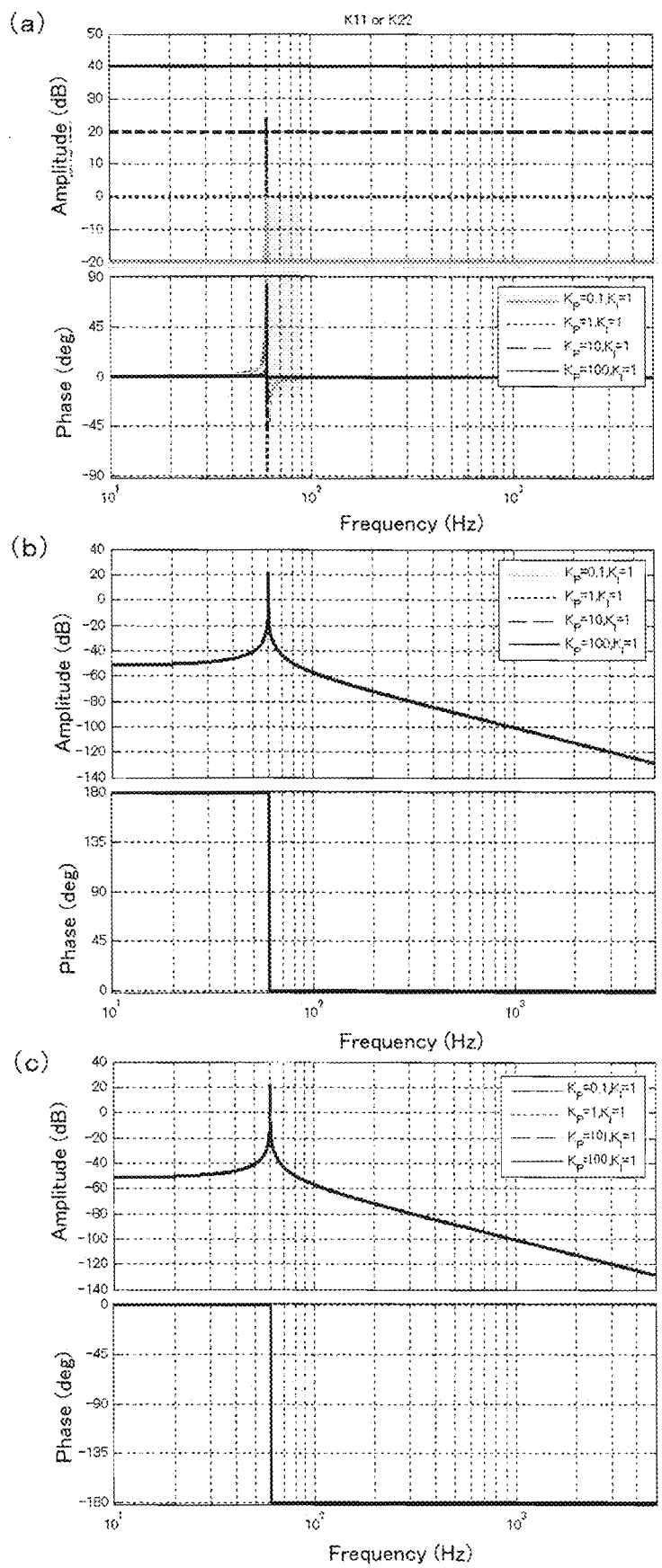
FIG. 12 is a Bode diagram for analyzing transfer functions as elements of a matrix $G_{PI}$.

FIG. 12 is a Bode diagram for analyzing transfer functions as elements of a matrix $G_{PI}$. FIG. 12(a) shows transfer functions of the element (1, 1) and the element (2, 2) of the matrix $G_{PI}$ whereas FIG. 12 (b) shows a transfer function of the element (1, 2) of the matrix $G_{PI}$, and FIG. 12(c) shows a transfer function of the element (2, 1) of the matrix $G_{P1}$. FIG. 12 shows a case where the center frequency is 60 Hz, an integral gain $K_I$ is fixed to 1 and the proportional gain $K_P$ is set to "0.1", "1", "10" and "100".

FIG. 12(*a*) shows an amplitude characteristic which has a peak at the center frequency. As the proportional gain $K_P$ increases, the amplitude characteristic increases except at the center frequency. The phase characteristic comes to zero degree at the center frequency. In other words, the transfer functions for the element (1, 1) and the element (2, 2) of the matrix $G_I$ allow signals of the center frequency (center angular frequency) to pass through without changing the phase.

Amplitude characteristics in FIG. 12(*b*) and FIG. 12(*c*) also have their peaks at the center frequency. The amplitude characteristics and the phase characteristics are constant regardless of the proportional gain $K_P$. Also, the phase characteristic in FIG. 12(*b*) attains 90 degrees at the center frequency. In other words, the transfer function of the element (1, 2) of the matrix $G_{PI}$ allows signals of the center frequency (center angular frequency) to pass through with a 90-degree phase advance. On the other hand, the phase characteristic in FIG. 12(*c*) attains −90 degrees at the center frequency. In other words, the transfer function of the element (2, 1) of the matrix $G_I$ allows signals of the center frequency (center angular frequency) to pass through with a 90-degree phase delay.

If the aloha axis current controller 74' and the beta axis current controller 75' in the second embodiment are to perform an alternative control which replaces the PI control, it can be achieved by using a transfer function $(K_P \cdot s^2 + K_I \cdot s + K_P \cdot \omega_0^2)/(s^2 + \omega_0^2)$ which represents the element (1, 1) and the element (2, 2) in the transfer function matrix $G_{PI}$ represented by Equation (11) above.

If the current controller 74" in the third embodiment is to perform an alternative control which replaces the PI control, it can be achieved by using a transfer function matrix $G'_{PI}$ represented by Equation (19) shown below:

$$G'_{PI} = \begin{bmatrix} G_{PI11}(s) & G_{PI12}(s) & G_{PI13}(s) \\ G_{PI21}(s) & G_{PI22}(s) & G_{PI23}(s) \\ G_{PI31}(s) & G_{PI32}(s) & G_{PI33}(s) \end{bmatrix} \Lambda \quad (19)$$

where:

$G_{PI11}(s) = G_{PI22}(s) = G_{PI33}(s) =$ $$\frac{1}{3}\left(K_P + \frac{K_I}{s+j\omega_0} + K_P + \frac{K_I}{s-j\omega_0}\right) = \frac{2}{3} \cdot \frac{K_P s^2 + K_I s + K_P \omega_0^2}{s^2 + \omega_0^2}$$

$G_{PI12}(s) = G_{PI23}(s) = G_{PI31}(s) = \frac{1}{6}\left\{(-1-\sqrt{3}\,j)\cdot\left(K_P + \frac{K_I}{s+j\omega_0}\right) + \right.$ $\left. (-1+\sqrt{3}\,j)\cdot\left(K_P + \frac{K_I}{s-j\omega_0}\right)\right\} =$ $$-\frac{1}{3} \cdot \frac{K_P s^2 + K_I(s+\sqrt{3}\,\omega_0) + K_P \omega_0^2}{s^2 + \omega_0^2}$$

$G_{PI13}(s) = G_{PI21}(s) = G_{PI32}(s) = \frac{1}{6}\left\{(-1+\sqrt{3}\,j)\cdot\left(K_P + \frac{K_I}{s+j\omega_0}\right) + \right.$ $\left. (-1-\sqrt{3}\,j)\cdot\left(K_P + \frac{K_I}{s-j\omega_0}\right)\right\} =$ $$-\frac{1}{3} \cdot \frac{K_P s^2 + K_I(s-\sqrt{3}\,\omega_0) + K_P \omega_0^2}{s^2 + \omega_0^2}$$

Also, if the current controller 74" is to perform an alternative control which replaces the PI control in an arrangement where both of the positive-phase and the negative-phase sequence components are controlled in the third embodiment, it can be achieved by using a transfer function matrix $G''_{PI}$ represented by Equation (20) shown below:

$$G''_{PI} = \frac{1}{3} \cdot \frac{K_P s^2 + K_I s + K_P \omega_0^2}{s^2 + \omega_0^2} \begin{bmatrix} 2 & -1 & -1 \\ -1 & 2 & -1 \\ -1 & -1 & 2 \end{bmatrix} \Lambda \quad (20)$$

Providing alternative control which replaces the PI control offers an advantage that a damping effect can be added at transient time by adjusting the proportional gain $K_P$. However, there is also a disadvantage that the system is more sensitive to modeling errors. On the contrary, providing control which replaces the T control is disadvantageous in that a damping effect at transient time cannot be added, yet there is an advantage that the system is not very much sensitive to modeling errors.

It should be noted here that there may be an arrangement that the current controller 74 (the alpha axis current controller 74', the beta axis current controller 75', the current controller 74") provides an alternative control which replaces the above-described alternative controls to I control or PI control. If the transfer function F(s) in Equation (10) is substituted for a transfer function of the intended control, the equation provides a transfer function matrix which represents a process equivalent to carrying out fixed-to-rotating coordinate conversion, the intended control and then rotating-to-fixed coordinate conversion. Therefore, it is possible to design a system which provides an alternative control (the transfer function for which is expressed as $F(s) = K_P + K_I/s + K_D \cdot s$, where $K_P$ is proportional gain, $K_I$ is integral gain, and $K_D$ is derivative gain) which replaces the PID control. It is also possible to provide control which can replace D control (derivative control: the transfer function for which is expressed by $F(s) = K_D \cdot s$, where $K_D$ is derivative gain); P control (proportional control: the transfer function for which is expressed by $F(s) = K_P$, where $K_P$ is proportional gain), PD control, ID control, etc.

In the first through the third embodiments thus far, description was made for cases where output current was controlled. However, the present invention is not limited to this. For example, output voltage may be controlled. Hereinafter, a case of controlling the output voltage will be described as a fourth embodiment.

Figure 13:
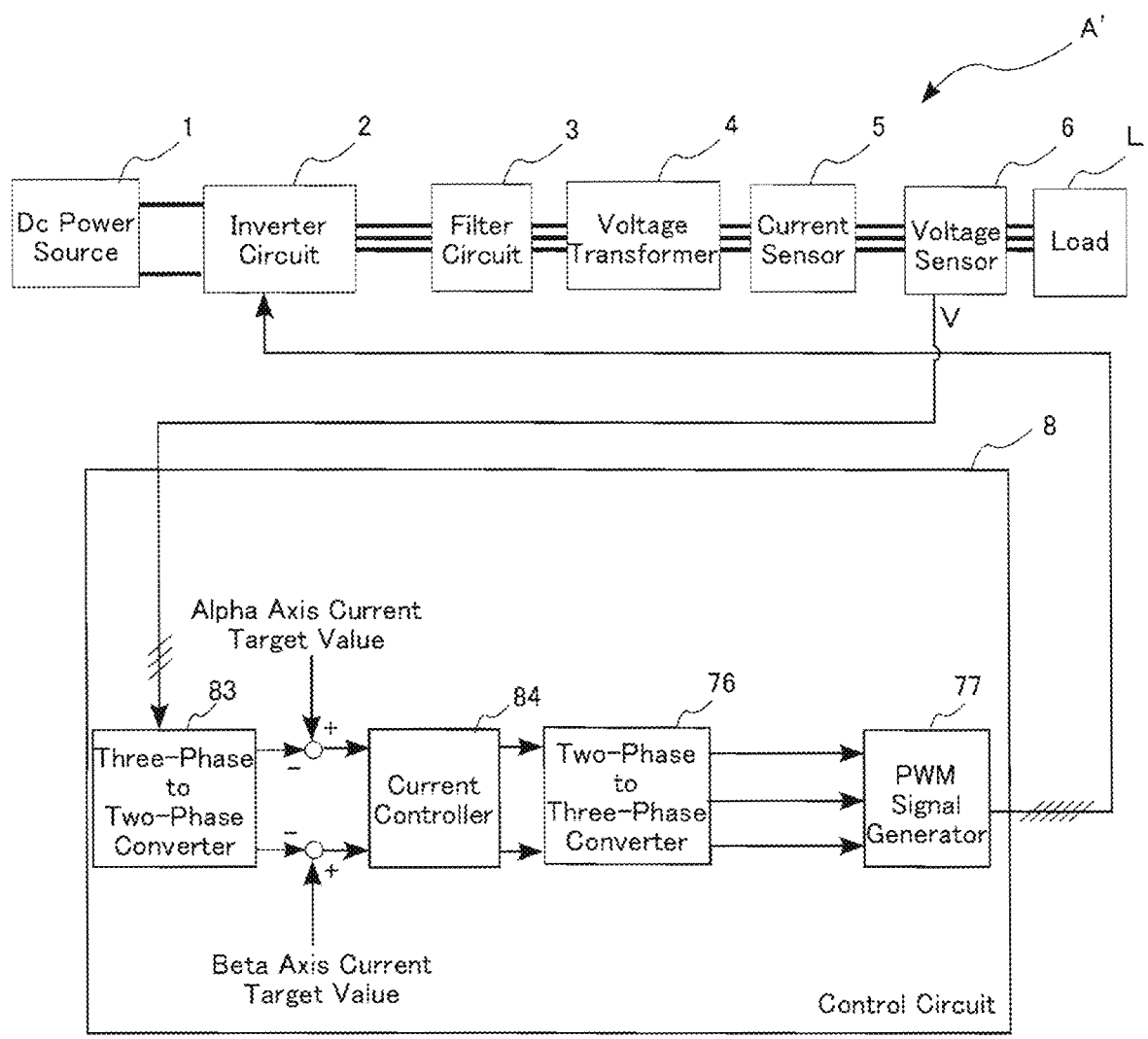
FIG. 13 is a block diagram for describing a control circuit according to a fourth embodiment.

FIG. 13 is a block diagram for describing a control circuit according to the fourth embodiment. In this figure, elements which are identical with or similar to those in the interconnection inverter system A in FIG. 6 are indicated by the same reference codes.

An inverter system A' in FIG. 13 differs from the interconnection inverter system A (see FIG. 6) according to the first embodiment in that the system supplies power to a load L instead of the electrical power system B. Since it is necessary to control the voltage which is supplied to the load L, a control circuit 8 controls the output voltage, instead of the output current. The control circuit 8 differs from the control circuit 7 (see FIG. 6) according to the first embodiment in that it generates PWM signals based on voltage signals V from the voltage sensor 6. The inverter system A' supplies power to the Load L while controlling the output voltage at a target value through feedback control.

A three-phase to two-phase converter 83 receives three voltage signals Vu, Vv, Vw from the voltage sensor 6 and converts these voltage signals into an alpha axis voltage signal Vα and a beta axis voltage signal Vβ. The conversion process performed in the three-phase to two-phase converter 83 is represented by a formula shown below as Equation (21).

$$\begin{bmatrix} V\alpha \\ V\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} Vu \\ Vv \\ Vw \end{bmatrix} \quad (21)$$

The voltage signals Vu, Vv, Vw are phase voltage signals in respective phases. Alternatively however, line voltage signals may be detected and used. In this case, the line voltage signals may be converted into phase voltage signals and then the formula represented by Equation (21) above is utilized. Another option may be to use a matrix, in place of the one represented by Equation (21), which converts the line voltage signals into an alpha axis voltage signal Vα and a beta axis voltage signal Vβ.

A voltage controller 84 receives deviations of the alpha axis voltage signal Iα and the beta axis voltage signal Iβ outputted by the three-phase to two-phase converter 83 from their respective target values, to generate correction value signals Xα, Xβ for the voltage control. A voltage controller 84 performs a process represented by the transfer function matrix $G_I$ represented by Equation (12). In other words, the controller performs a process given by Equation (22) below where the deviations of the alpha axis voltage signal Iα and of the beta axis voltage signal Iβ from their respective target values are represented by ΔVα and αVβ. As for the angular frequency $\omega_0$, a predetermined value is set as an angular frequency (for example, $\omega_0=120\pi$ [rad/sec] (60 [Hz])) for the system voltage fundamental wave, and the integral gain $K_I$ is a pre-designed value. Also, the voltage controller 84 performs a stability margin maximization process, which includes phase adjustment to correct phase delay in the control loop. The deviations ΔVα, ΔVβ represent "the first input signal" and "the second input signal" respectively according to the present invention whereas the correction value signals Xα, Xβ represent "the first output signal" and "the second output signal" respectively according to the present invention.

$$\begin{bmatrix} X\alpha \\ X\beta \end{bmatrix} = G_I \begin{bmatrix} \Delta V\alpha \\ \Delta V\beta \end{bmatrix} \quad (22)$$

$$= \begin{bmatrix} \dfrac{K_I s}{s^2 + \omega_0^2} & \dfrac{-K_I \omega_0}{s^2 + \omega_0^2} \\ \dfrac{K_I \omega_0}{s^2 + \omega_0^2} & \dfrac{K_I s}{s^2 + \omega_0^2} \end{bmatrix} \begin{bmatrix} \Delta V\alpha \\ \Delta V\beta \end{bmatrix}$$

In the present embodiment, the alpha axis voltage target value and the beta axis voltage target value are provided by values obtained by rotating-to-fixed coordinate conversion of the d axis voltage target value and the q axis voltage target value respectively. It should be noted here that in cases where three-phase voltage target values are given, those target values should be subjected to three-phase to two-phase conversion to obtain the alpha axis voltage target value and the beta axis voltage target value. Also, if the alpha axis voltage target value and the beta axis voltage target value are supplied directly, the supplied target values may be used directly.

In the present embodiment, the voltage controller 84 is designed by H∞ loop shaping method, which is based on a linear control theory, with a frequency weight being provided by the transfer function matrix $G_I$. The process performed in the voltage controller 84 is expressed by the transfer function matrix $G_I$, and therefore is a linear time-invariant process. Hence, it is possible to perform control system design using a linear control theory. It should be noted here that a linear control method other than the H-loop shaping method may be utilized in the design.

In the present embodiment, the control circuit 8 performs control in the fixed coordinate system without making fixed-to-rotating coordinate conversion nor rotating-to-fixed coordinate conversion. As has been described earlier, the transfer function matrix $G_I$ is a transfer function matrix which represents an equivalent process to carrying out fixed-to-rotating coordinate conversion, then I control and then rotating-to-fixed coordinate conversion. Therefore, the voltage controller 84 which performs the process represented by the transfer function matrix $G_I$ performs an equivalent process to the process performed by the fixed-to-rotating coordinate converter 78, the rotating-to-fixed coordinate converter 79, and I control process in FIG. 37. Also, as shown in each Bode diagram in FIG. 7, the transfer function for each element in the matrix $G_I$ has an amplitude characteristic which attains its peak at the center frequency. In other words, in the voltage controller 84, only the center frequency component is a high-gain component. Therefore, there is no need for providing the LPF 74a or 75a in FIG. 37.

The process performed in the voltage controller 84 is expressed by the transfer function matrix $G_I$, and therefore is a linear time-invariant process. Also, the control circuit 8 does not include nonlinear time-varying processes, i.e., the circuit does not include fixed-to-rotating coordinate conversion process nor rotating-to-fixed coordinate conversion process. Hence, the entire voltage control system is a linear time-invariant system. Therefore, the arrangement enables control system design and system analysis using a linear control theory. As described, use of the transfer function matrix $G_I$ represented by Equation (12) enables to replace the non-linear process in which fixed-to-rotating coordinate conversion is followed by I control and then by rotating-to-fixed coordinate conversion with a linear time-invariant multi-input multi-output system. This makes it easy to perform system analysis and control system design.

It should be noted here that in the present embodiment, the voltage controller 84 performs the process represented by Equation (22). However, each element in the matrix $G_I$ may be given a different value from others for its integral gain $K_I$. Specifically, an integral gain $K_I$ which differ from one transfer function to another may be designed for each element. For example, there may be a design to include additional characteristics in the alpha axis component such as improved quick response, improved stability, etc. Another example of giving an additional characteristic may be to assign "0" to the integral gain $K_I$ of the element (1, 2) and that of the element (2, 1), to control both of negative-phase and negative-phase sequence components. Also, if negative phase sequence component control is to be performed, it can be accomplished by using the transfer function matrix $G_I$ in which the element (1, 2) and the element (2, 1) are swapped with each other.

Also, if positive phase sequence component is to be controlled using the three voltage signals Vu, Vv, Vw, it can be achieved by using the transfer function matrix G'. If negative phase sequence components are to be controlled, it can be achieved by using the transfer function matrix $G'_1$ in which the elements $G_{I21}(s)$, $G_{I23}(s)$, $G_{I31}(s)$ are swapped with $G_{I13}(s)$, $G_{I21}(s)$, $G_{I32}(s)$ (i.e., a transposed matrix of the matrix $G'_I$ should be used). If both of the positive-phase and the negative-phase sequence components are to be controlled, it can be accomplished by using the transfer function matrix $G''_I$ represented by Equation (18). Also, there may be arrangements where the voltage controller 84 does not provide the alternative control which replaces the I control, but provides a different alternative control (such as PI control, D control, P control, PD control, ID control, and PID control) which replaces the above-described alternative controls.

Next, description will cover a case where switching is made between output voltage control and output current control, as a fifth embodiment.

In normal situations, an interconnection inverter system supplies electric power to an electrical power system while controlling its output in association with the electrical power system. If there is an accident in the electrical power system, the inverter circuit will disconnect itself from the electrical power system and then ceases its operation. However, there is an increasing demand for interconnection inverter systems which operate autonomously during an accident in the electrical power system for continued supply of power to a load which is connected to the interconnection inverter system. If an interconnection inverter system is to perform autonomous operation to supply power to a load, it is necessary to control output voltage. An interconnection inverter system according to the fifth embodiment is such a system which is implemented by a combination of the first embodiment and the fourth embodiment and is capable of switching its operation between output voltage control and output current control.

Figure 14:
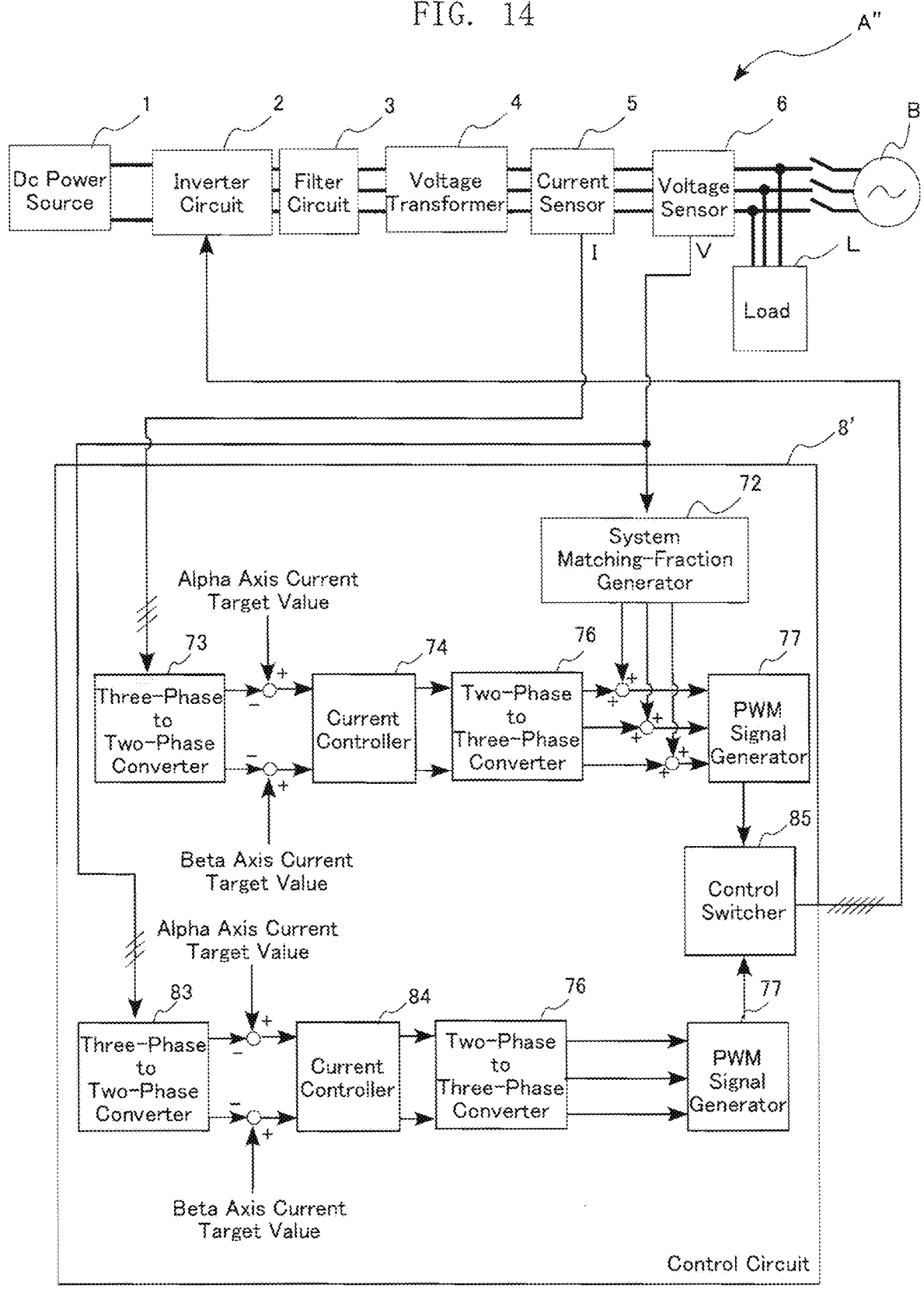
FIG. 14 is a block diagram for describing a control circuit according to a fifth embodiment.

FIG. 14 is a block diagram for describing a control circuit according to the fifth embodiment. In this figure, elements which are identical with or similar to those in the interconnection inverter system A in FIG. 6 are indicated by the same reference codes.

FIG. 14 shows an interconnection inverter system A", which supplies power to a load L while also supplying power to the electrical power system B if it is interconnected therewith. It should be noted here that the interconnection inverter system A according to the first embodiment works in the same manner. However, description for the first embodiment only covered a situation where the system was interconnected with the electrical power system B, and therefore no reference or description was made for the load L. The interconnection inverter system A" performs current control when it is in connection with the electrical power system B but performs voltage control when it is disconnected from the electrical power system B.

FIG. 14 shows a control circuit 8", which differs from the control circuit 7 (see FIG. 6) according to the first embodiment in that it includes a three-phase to two-phase converter 83, a voltage controller 84, a two-phase to three-phase converter 76 and a PWM signal generator 77 for voltage control, and a control switcher 85.

The three-phase to two-phase converter 83 and the voltage controller 84 are identical with the three-phase to two-phase converter 83 and the voltage controller 84 (see FIG. 13) according to the fourth embodiment. In other words, they generate correction value signals Xα, Xβ based on three voltage signals Vu, Vv, Vw from the voltage sensor 6. Then, the two-phase to three-phase converter 76 and the PWM signal generator 77 in the subsequent stages generate PWM signals for the voltage control. On the other hand, the three-phase to two-phase converter 73 and the current controller 74 generate correction value signals Xα, Xβ based on three current signals Iu, Iv, Iw from the current sensor 5. Then, the two-phase to three-phase converter 76, the system matching-fraction generator 72 and the PWM signal generator 77 in the subsequent stages generate PWM signals for the voltage control. The control switcher 85 outputs PWM signals for voltage control generated by the voltage controller 84 based on the correction value signals Xα, Xβ when not connected with the electrical power system B, while it outputs the PWM signals for current control generated by the current controller 74 based on the correction value signals Xα, Xβ when connected with the electrical power system B.

In the present embodiment, the interconnection inverter system A" is capable of performing current control thereby supplying power to the electrical power system B when it is connected with the electrical power system B whereas it is capable of performing voltage control thereby supplying power to the load L when not connected with the electrical power system B. Also, in the present embodiment, the control circuit 8' performs control in the fixed coordinate system without making fixed-to-rotating coordinate conversion nor rotating-to-fixed coordinate conversion. Since the processes performed in the current controller 74 and the voltage controller 84 are processes which are equivalent to a process in which fixed-to-rotating coordinate conversion is followed by I control and then by rotating-to-fixed coordinate conversion, and are expressed by a transfer function matrix $G_I$, they are linear time-invariant processes. Therefore, each of the entire current control system and the entire voltage control system is a linear time-invariant system, and hence, the arrangement enables control system design and system analysis using a linear control theory.

In the first through the fifth embodiments, description was made for cases where the control circuit according to the present invention was applied to an interconnection inverter system (inverter system). However, the present invention is not limited to this. The present invention is also applicable to control circuits which control inverter circuits used in unbalance compensators, static reactive power compensators (SVC, SVG), power active filters, uninterruptable power supply systems (UPS), and so on. The present invention is also applicable to control circuits for controlling inverter circuits which control rotation of motors or of electric power generators Further, the present invention is not limited to controlling those inverter circuits which convert DC current into three-phase AC current. For example, the invention is applicable to control circuits for converters which convert three-phase AC current into DC current and for cyclo-converters which convert three-phase AC frequencies. Hereinafter, description will cover a case where the present invention is applied to a control circuit of a converter circuit, as a sixth embodiment.

Figure 15:
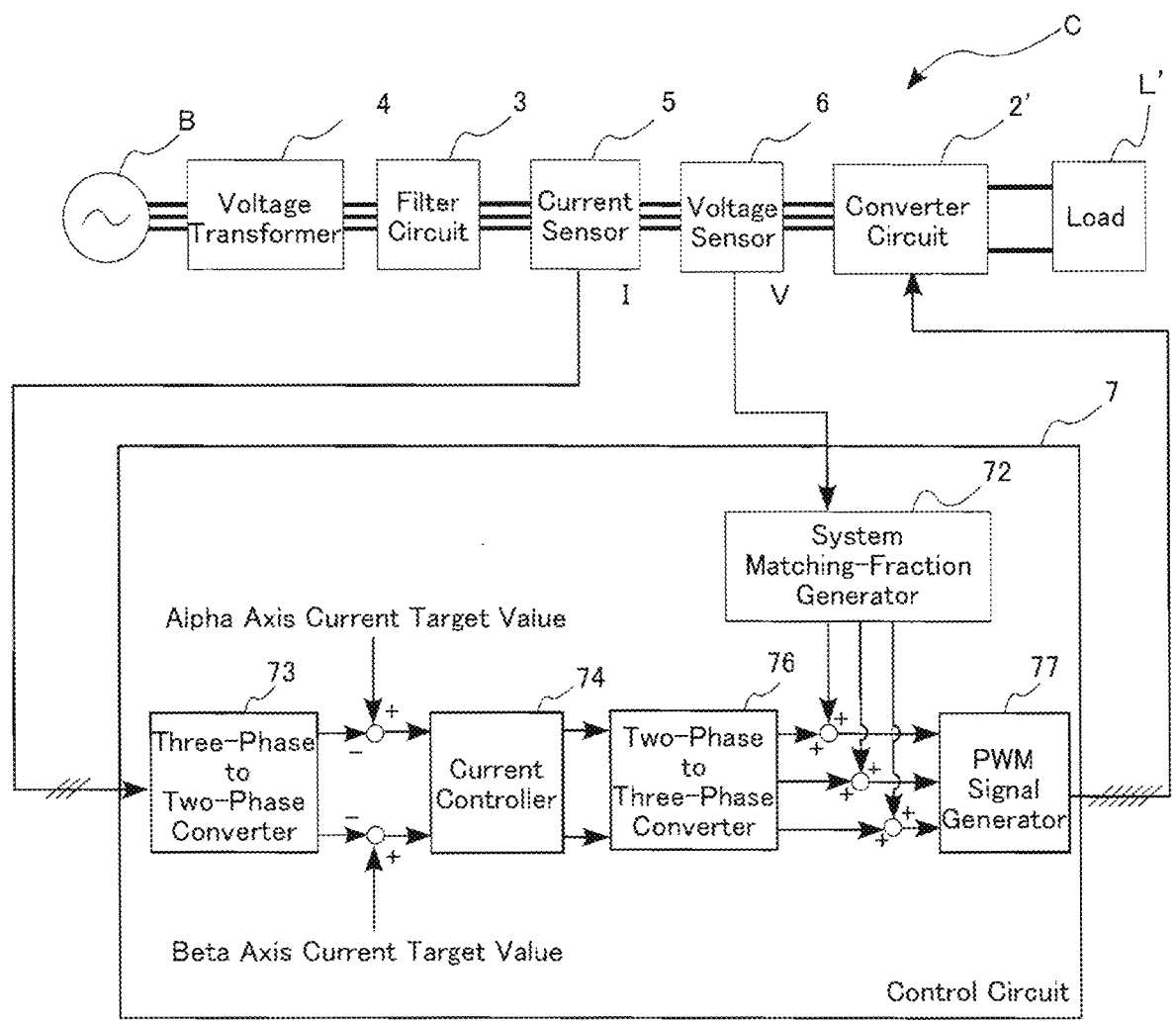
FIG. 15 is a block diagram for describing a three-phase PWM converter system according to a sixth embodiment.

FIG. 15 is a block diagram for describing a three-phase PWM converter system according to the sixth embodiment. In this figure, elements which are identical with or similar to those in the interconnection inverter system A in FIG. 6 are indicated by the same reference codes.

FIG. 15 shows a three-phase PWM converter system C which converts AC power from an electrical power system B into DC power and supplies the DC power to a load L'. The load L' is a DC load. The three-phase PWM converter system C includes a voltage transformer circuit 4, a filter circuit 3, a current sensor 5, a voltage sensor 6, a converter circuit 2', and a control circuit 7.

The voltage transformer circuit 4 increases or decreases the AC voltage from the electrical power system B to a predetermined level. The filter circuit 3 removes high frequency components from the AC voltage inputted from the voltage transformer circuit 4, and outputs the filtered voltage to the converter circuit 2'. The current sensor 5 detects an AC current of each phase inputted to the converter circuit 2'. The detected current signals I are inputted to the control circuit 7. The voltage sensor 6 detects an AC voltage of each phase inputted to the converter circuit 2'. The detected voltage signals V are inputted to the control circuit 7. The converter circuit 2' converts the inputted AC voltages into a DC voltage and output the DC voltage to the load L'. The converter circuit 2' is a three-phase PWM converter, i.e., a voltage-type converter circuit which includes unillustrated six switching elements in three sets. The converter circuit 2' switches ON and OFF each of the switching elements based on PWM signals from the control circuit 7, thereby converting the inputted AC voltages to a DC voltage. The converter circuit 2' is not limited to this, and may be provided by a current-type converter circuit.

The control circuit 7 controls the converter circuit 2'. Like the control circuit 7 according to the first embodiment, the control circuit 7 generates PWM signals and outputs the generated signals to the converter circuit 2'. FIG. 15 only shows a configuration for input current control. The figure does not show other control configurations. Though not illustrated, the control circuit 7 also includes a DC voltage controller and a reactive power controller thereby providing control on output voltage and input reactive power. The type of control performed by the control circuit 7 is not limited to the above. For example, if the converter circuit 2' is a current-type converter circuit, output current control is performed instead of the output voltage control.

The present embodiment provides the same advantages as offered by the first embodiment. If the three-phase PWM converter system C is to be reduced in its size by reducing the size of the filter circuit 3, accuracy in current control will have to be decreased, which leads to increased difficulty in control system design. However, according to the present embodiment, system design can be easy by using a linear control theory. Therefore, difficulty in control system design is no longer a hurdle to size reduction of the three-phase PWM converter system C.

The configuration of the three-phase PWM converter system C is not limited to the above. For example, the control circuit 7 may be replaced by the control circuit 7', 7'', 8 or 8'. Also, an inverter circuit may be provided on the output side of the converter circuit 2' for conversion of the DC power further into AC power for supply to an AC load. In this case the system provides a cyclo-converter.

Next, methods of controlling harmonic components will be described.

The transfer function matrix G represented by Equation (10) is for controlling a fundamental wave component. The n-th harmonic is an angular frequency component obtained by multiplying the fundamental wave angular frequency by n. When the n-th-order harmonic positive phase sequence component is subjected to three-phase to two-phase conversion, two cases are possible: In one case the alpha axis signal has an advanced phase over the beta axis signal, and in the other case the phase is delayed. If $n=3k+1$ ($k=1, 2, \ldots$), the n-th-order harmonic positive phase sequence component signal has a sequence of phases which is identical with that in the positive phase sequence component signal of the fundamental wave. Specifically, with the fundamental wave's positive phase sequence component having U-, V-, and W-phase signals represented by $Vu=V\cos\theta$, $Vv=V\cos(\theta-2\pi/3)$ and $Vw=V\cos(\theta-4\pi/3)$ respectively, signals of e.g. the seventh-order harmonic positive phase sequence component in the U, V and W phases are expressed as $Vu_7=V_7\cos 7\theta$, $Vv_7=V_7\cos(7\theta-14\pi/3)=V_7\cos(7\theta-2\pi/3)$, and $Vw_7=V_7\cos(7\theta-28\pi/3)=V_7\cos(7\theta-4\pi/3)$ respectively. In this case, the phase sequence is identical with that of the positive phase sequence component in the fundamental wave, and like in FIG. 8(a), the phase of the alpha axis signal is advanced by 90 degrees over the phase of the beta axis signal. Therefore, the transfer function matrix to control positive phase sequence component of the n-th-order harmonic ($n=3k+1$) is expressed as a transfer function matrix $G_n$ represented by Equation (23) which is Equation (10) with the item $\omega_0$ substituted for $n\cdot\omega_0$. On the other hand, if $n=3k+2$ ($k=1, 2, \ldots$), the n-th-order harmonic positive phase sequence component signal has a phase sequence which is identical with that of the negative phase sequence component signal of the fundamental wave. Specifically, with the fundamental wave's positive phase sequence component having U-, V-, and W-phase signals Vu, Vv, Vw being represented by the same equations as the above, signals of e.g. the fifth-order harmonic positive phase sequence components in the U, V and W phases are expressed as, $Vu_5=V_5\cos 5\theta$, $Vv_5=V_5\cos(5\theta-10\pi/3)=V_5\cos(5\theta-4\pi/3)$, and $Vw_5=V_5\cos(5\theta-20\pi/3)=V_5\cos(5\theta-2\pi/3)$ respectively. In this case, the phase sequence is identical with that of the negative phase sequence component in the fundamental wave, and like in FIG. 3(b), the phase of the alpha axis signal is delayed by 90 degrees from the phase of the beta axis signal. Therefore, the transfer function matrix to control the positive phase sequence component of the n-th-order harmonic ($n=3k+2$) is expressed as a transfer function matrix $G_n$ represented by Equation (23') which is Equation (10) in which the item $\omega_0$ is substituted for $n\cdot\omega_0$ and the elements (1, 2) and the element (2, 1) are swapped with each other.

$$Gn = \begin{bmatrix} \dfrac{F(s+jn\omega_0)+F(s-jn\omega_0)}{2} & \dfrac{F(s+jn\omega_0)-F(s-jn\omega_0)}{2j} \\ -\dfrac{F(s+jn\omega_0)-F(s-jn\omega_0)}{2j} & \dfrac{F(s+jn\omega_0)+F(s-jn\omega_0)}{2} \end{bmatrix} \Lambda \quad (23)$$

$$Gn = \begin{bmatrix} \dfrac{F(s+jn\omega_0)+F(s-jn\omega_0)}{2} & -\dfrac{F(s+jn\omega_0)-F(s-jn\omega_0)}{2j} \\ \dfrac{F(s+jn\omega_0)-F(s-jn\omega_0)}{2j} & \dfrac{F(s+jn\omega_0)+F(s-jn\omega_0)}{2} \end{bmatrix} \Lambda \quad (23')$$

Also, the transfer function matrix $G_{In}$ to perform I control on the positive phase sequence component of the n-th-order harmonic ($n=3k+1$) is calculated as Equation (24) which is Equation (12) in which the item $\omega_0$ is substituted for $n\cdot\omega_0$. On the other hand, the matrix $G_{In}$ of the transfer function to provided I control on the positive phase sequence component of the n-th-order harmonic ($n=3k+2$) is calculated as Equation (24') which is Equation (12) in which the item $\omega_0$ is substituted for $n\cdot\omega_0$ and the element (1, 2) and the element (2, 1) are swapped with each other. The following Equations (24) and (24') can be obtained as $F(s)=K_I/s$ in Equations (23) and (23').

$$G_{In} = \begin{bmatrix} \dfrac{K_I s}{s^2+n^2\omega_0^2} & \dfrac{-K_I n\omega_0}{s^2+n^2\omega_0^2} \\ \dfrac{K_I n\omega_0}{s^2+n^2\omega_0^2} & \dfrac{K_I s}{s^2+n^2\omega_0^2} \end{bmatrix} \Lambda \quad (24)$$

$$G_{in} = \begin{bmatrix} \dfrac{K_I s}{s^2+n^2\omega_0^2} & \dfrac{K_I n\omega_0}{s^2+n^2\omega_0^2} \\ \dfrac{-K_I n\omega_0}{s^2+n^2\omega_0^2} & \dfrac{K_I s}{s^2+n^2\omega_0^2} \end{bmatrix} \Lambda \quad (24')$$

Hereinafter, description will be made for a seventh embodiment of the present invention, which is a case where a harmonic compensation controller which performs the process given by the transfer function matrix $G_{In}$ in Equations (24) and (24') is applied to an interconnection inverter system control circuit.

Figure 16:
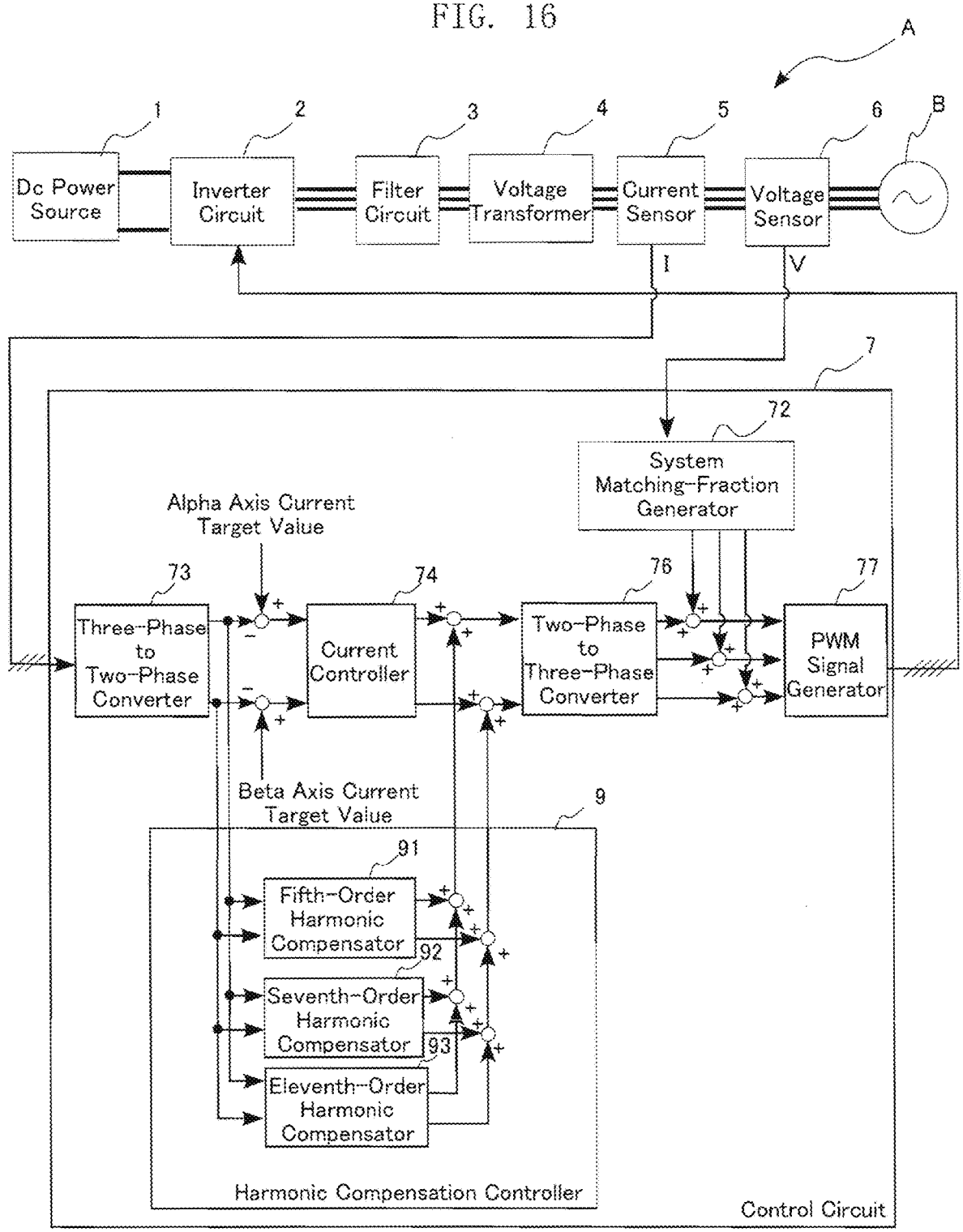
FIG. 16 is a block diagram for describing an interconnection inverter system according to a seventh embodiment.

FIG. 16 is a block diagram for describing the interconnection inverter system according to the seventh embodiment. In this figure, elements which are identical with or similar to those in the control circuit 7 in FIG. 6 are indicated by the same reference codes. FIG. 16 shows a control circuit 7, which is the control circuit 7 (see FIG. 6) according to the first embodiment further including a harmonic compensation controller 9.

The harmonic compensation controller 9 works for harmonic component suppression. It receives an alpha axis current signal Iα and a beta axis current signal Iβ from the three-phase to two-phase converter 73, and generates harmonic compensation signals Yα, Yβ for harmonic suppression control. The harmonic compensation controller 9 includes a fifth-order harmonic compensator 91 for suppressing positive phase sequence component of the fifth-order harmonic; a seventh-order harmonic compensator 92 for suppressing positive phase sequence component of the seventh-order harmonic; and an eleventh-order harmonic compensator 93 for suppressing positive phase sequence component of the eleventh-order harmonic.

The fifth-order harmonic compensator 91 works for suppressing positive phase sequence component of the fifth-order harmonic. The fifth-order harmonic compensator 91 performs a process given by a transfer function matrix $G_{I5}$, which is the transfer function matrix $G_{In}$ represented by Equation (24') with n=5 for the control of positive phase sequence component of the fifth-order harmonic. In other words, the fifth-order harmonic compensator 91 performs a process given by the following Equation (25), to output fifth-order harmonic compensation signals Yα$_5$, Yβ$_5$. As for the angular frequency $\omega_0$, a predetermined value is set as an angular frequency (for example, $\omega_0$=120π [rad/sec] (60 [Hz])) for the system voltage fundamental wave, and the integral gain $K_{I5}$ is a pre-designed value. Also, the fifth-order harmonic compensator 91 performs a stability margin maximization process, which includes phase adjustment to correct phase delay in the control loop for reversing the phase. The alpha axis current signal Iα and the beta axis current signal Iβ represent "the first input signal" and "the second input signal" according to the present invention respectively whereas the fifth-order harmonic compensation signals Yα$_5$, Yβ$_5$ represent "the first output signal" and "the second output signal" according to the present invention respectively.

$$\begin{bmatrix} Y\alpha_5 \\ Y\beta_5 \end{bmatrix} = G_{I5} \begin{bmatrix} I\alpha \\ I\beta \end{bmatrix} = \begin{bmatrix} \frac{K_{I5}s}{s^2+25\omega_0^2} & \frac{5K_{I5}\omega_0}{s^2+25\omega_0^2} \\ \frac{-5K_{I5}\omega_0}{s^2+25\omega_0^2} & \frac{K_{I5}s}{s^2+25\omega_0^2} \end{bmatrix} \begin{bmatrix} I\alpha \\ I\beta \end{bmatrix} \Lambda \quad (25)$$

In the present embodiment, the fifth-order harmonic compensator 91 is designed by H∞ loop shaping method, which is a method based on a linear control theory, with a frequency weight being provided by the transfer function matrix $G_{I5}$. The process performed in the fifth-order harmonic compensator 91 is expressed as the matrix $G_{I5}$ of the transfer function, and therefore is a linear time-invariant process. Hence, it is possible to perform control system design using a linear control theory.

It should be noted here that design method to be used in designing the control system is not limited to this. In other words, other linear control theories may be employed for the design. Examples of usable methods include loop shaping method, optimum control, H∞ control, mixed sensitivity problem, and more. Also, there may be an arrangement that a phase $\theta_5$ is calculated and set in advance for adjustment based on the phase delay. For example, if the target of control has a 90-degree phase delay, a 180-degree phase delay may be designed by a setting $\theta_5$=−90 degrees. In this case, a rotation conversion matrix based on the phase $\theta_5$ is added to Equation (25).

The seventh-order harmonic compensator 92 works for suppressing positive phase sequence component of the seventh-order harmonic. The seventh-order harmonic compensator 92 performs a process given by a transfer function matrix $G_{I7}$, which is the transfer function matrix $G_{In}$ represented by Equation (24) with n=7 for the control of positive phase sequence component of the seventh-order harmonics. In other words, the seventh-order harmonic compensator 92 performs a process given by the following Equation (26), to output seventh-order harmonic compensation signals Yα$_7$, Yβ$_7$. As for the angular frequency $\omega_0$, a predetermined value is set as an angular frequency for the system voltage fundamental wave, and the integral gain $K_{I7}$ is a pre-designed value. Also, the seventh-order harmonic compensator 92 performs a stability margin maximization process, which includes phase adjustment to correct phase delay in the control loop for reversing the phase. The seventh-order harmonic compensator 92 is designed by the same method as is the fifth-order harmonic compensator 91.

$$\begin{bmatrix} Y\alpha_7 \\ Y\beta_7 \end{bmatrix} = G_{I7} \begin{bmatrix} I\alpha \\ I\beta \end{bmatrix} = \begin{bmatrix} \frac{K_{I7}s}{s^2+49\omega_0^2} & \frac{-7K_{I7}\omega_0}{s^2+49\omega_0^2} \\ \frac{7K_{I7}\omega_0}{s^2+49\omega_0^2} & \frac{K_{I7}s}{s^2+49\omega_0^2} \end{bmatrix} \begin{bmatrix} I\alpha \\ I\beta \end{bmatrix} \Lambda \quad (26)$$

The eleventh-order harmonic compensator 93 works for suppressing positive phase sequence component of the eleventh-order harmonics. The eleventh-order harmonic compensator 93 performs a process given by a transfer function matrix $G_{I11}$, which is the transfer function matrix $G_{In}$ represented by Equation (24') with n=11 for the control of positive phase sequence component of the eleventh-order harmonics. In other words, the eleventh-order harmonic compensator 93 performs a process given by the following Equation (27), to output eleventh-order harmonic compensation signals Yα11, Yβ11. As for the angular frequency $\omega_0$, a predetermined value is set as an angular frequency for the system voltage fundamental wave, and the integral gain $K_{I11}$ is a pre-designed value. Also, the eleventh-order harmonic compensator 93 performs a stability margin maximization process, which includes phase adjustment to correct phase delay in the control loop for reversing the phase. The eleventh-order harmonic compensator 93 is designed by the same method as is the fifth-order harmonic compensator 91.

$$\begin{bmatrix} Y\alpha_{11} \\ Y\beta_{11} \end{bmatrix} = G_{I11} \begin{bmatrix} I\alpha \\ I\beta \end{bmatrix} = \begin{bmatrix} \frac{K_{I11}s}{s^2+121\omega_0^2} & \frac{11K_{I11}\omega_0}{s^2+121\omega_0^2} \\ \frac{-11K_{I11}\omega_0}{s^2+121\omega_0^2} & \frac{K_{I11}s}{s^2+121\omega_0^2} \end{bmatrix} \begin{bmatrix} I\alpha \\ I\beta \end{bmatrix} \Lambda \quad (27)$$

The fifth-order harmonic compensation signals $Y\alpha_5$, $Y\beta_5$ outputted by the fifth-order harmonic compensator 91, the seventh-order harmonic compensation signals $Y\alpha_7$, $Y\beta_7$ outputted by the seventh-order harmonic compensator 92, and the eleventh-order harmonic compensation signals $Y\alpha_{11}$, $Y\beta_{11}$ outputted by the eleventh-order harmonic compensator 93 are added together respectively, and the resulting harmonic compensation signals $Y\alpha$, $Y\beta$ are outputted from the harmonic compensation controller 9. It should be noted here that the present embodiment covers a case where the harmonic compensation controller 9 includes the fifth-order harmonic compensator 91, the seventh-order harmonic compensator 92, and the eleventh-order harmonic compensator 93. However, the present invention is not limited to this. The harmonic compensation controller 9 is designed in accordance with the orders of harmonics which must be suppressed. For example, if the fifth-order harmonics are the only target of suppression, then only the fifth-order harmonic compensator 91 may be included. Likewise, if it is desired to suppress the thirteenth-order harmonic, then a thirteenth-order harmonic compensator should be added for a process expressed by a matrix $G_{I13}$, which is the transfer function matrix $G_{In}$ with n=13 represented by Equation (24).

The harmonic compensation signals $Y\alpha$, $Y\beta$ outputted from the harmonic compensation controller 9 are added to the correction value signals $X\alpha$, $X\beta$ outputted from the current controller 74. The two-phase to three-phase converter 76 is fed with correction value signals $X\alpha$, $X\beta$ obtained by the addition of the harmonic compensation signals $Y\alpha$, $Y\beta$.

In the present embodiment, the fifth-order harmonic compensator 91 performs control in the fixed coordinate system without making fixed-to-rotating coordinate conversion nor rotating-to-fixed coordinate conversion. The matrix $G_{I5}$ of the transfer function is a transfer function matrix which shows a process equivalent to carrying out fixed-to-rotating coordinate conversion, then I control and then rotating-to-fixed coordinate conversion.

Also, the process performed in the fifth-order harmonic compensator 91 is expressed as the transfer function matrix $G_{I5}$, and therefore is a linear time-invariant process. The fifth-order harmonic compensation does not include nonlinear time-varying processes, i.e., the circuit does not include fixed-to-rotating coordinate conversion process nor rotating-to-fixed coordinate conversion process. Hence, the entire control loop is a linear time-invariant system. Therefore, the arrangement enables control system design and system analysis using a linear control theory. As described, use of the transfer function matrix $G_{I5}$ represented by Equation (25) enables to replace the non-linear process in which fixed-to-rotating coordinate conversion is followed by I control and then by rotating-to-fixed coordinate conversion with a linear time-invariant multi-input multi-output system. This makes it easy to perform system analysis and control system design.

The same applies to the seventh-order harmonic compensator 92 and the eleventh-order harmonic compensator 93. In other words the processes performed in the seventh-order harmonic compensator 92 and in the eleventh-order harmonic compensator 93 are also linear time-invariant processes, and therefore it is possible to design control systems and perform system analyses using a linear control theory.

In the present embodiment, description was made for cases where elements in a transfer function matrix have the same integral gain. However, each element in the matrix may be given a different value from others for its integral gain. For example, there may be a design to include additional characteristics in the alpha axis component such as improved quick responsiveness, improved stability, etc. Another example of adding a characteristic may be to assign "0" to the integral gain $K_I$ of the element (1, 2) and that of the element (2, 1), to control both of negative-phase and negative-phase sequence components. Later, description will be made for a case of controlling both positive-phase and negative-phase sequence components.

In the present embodiment, description was made for a case where the fifth-order harmonic compensator 91, the seventh-order harmonic compensator 92 and the eleventh-order harmonic compensator 93 are designed individually from each other. However, the present invention is not limited to this. The fifth-order harmonic compensator 91, the seventh-order harmonic compensator 92 and the eleventh-order harmonic compensator 93 may be designed all in one, with a common integral gain.

In the seventh embodiment, description was made for cases where control is made to positive phase sequence components in each harmonic. However, the present invention is not limited to this. Control may be made to negative phase sequence components in each harmonic This can be accomplished by using the transfer function matrix $G_{In}$ used for controlling the positive phase sequence components in which the element (1, 2) and the element (2, 1) are swapped with each other. Also, control may be provided on both of the positive-phase and negative-phase sequence components. Hereinafter, description will be made for an eighth embodiment, where both positive-phase and negative-phase sequence components are controlled.

As has been described earlier, the process shown in the transfer function of the element (1, 1) and the element (2, 2) in the matrix $G_I$ allows positive-phase and negative-phase sequence components to pass through without changing their phase (see FIG. 7(a)). Therefore it is possible to provide control on both of the positive-phase and negative-phase sequence components if use is made for the matrix $G_I$ represented by Equation (12), in which "0" is assigned to the element (1, 2) and the element (2, 1). The same applies to the matrices $G_n$ and $G_{In}$: Therefore, it is possible to perform control on both of the positive phase sequence component and the negative phase sequence component if the element (1, 2) and the element (2, 1) are "0" in the matrices represented by Equations (23) and (24).

The eighth embodiment provides a control circuit, which is the control circuit 7 in FIG. 16 in which "0" is assigned to the element (1, 2) and the element (2, 1) in matrices $G_{I5}$, $G_{I7}$, $G_{I11}$ of the transfer functions used in the fifth-order harmonic compensator 91, the seventh-order harmonic compensator 92, and the eleventh-order harmonic compensator 93 respectively. Thus, the eighth embodiment can provide control on both positive-phase and negative-phase sequence components in harmonics of each order. Also, the eighth embodiment provides the same advantage as offered by the seventh embodiment, i.e., that the embodiment enables control system design and system analysis using linear control theories.

Figure 17:
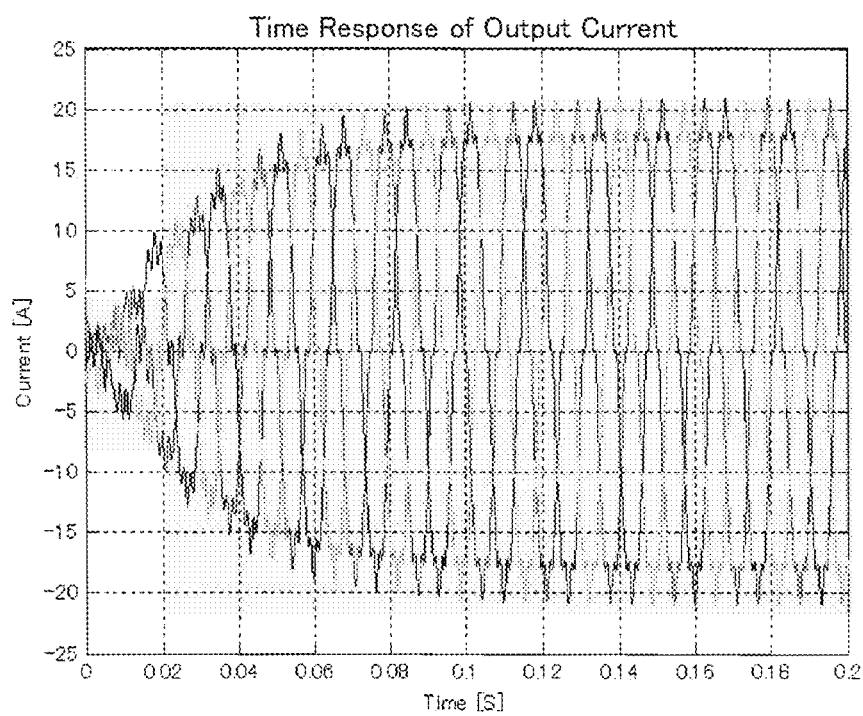
FIG. 17 is a diagram for describing a result of a simulation conducted with an eighth embodiment.
Figure 17:
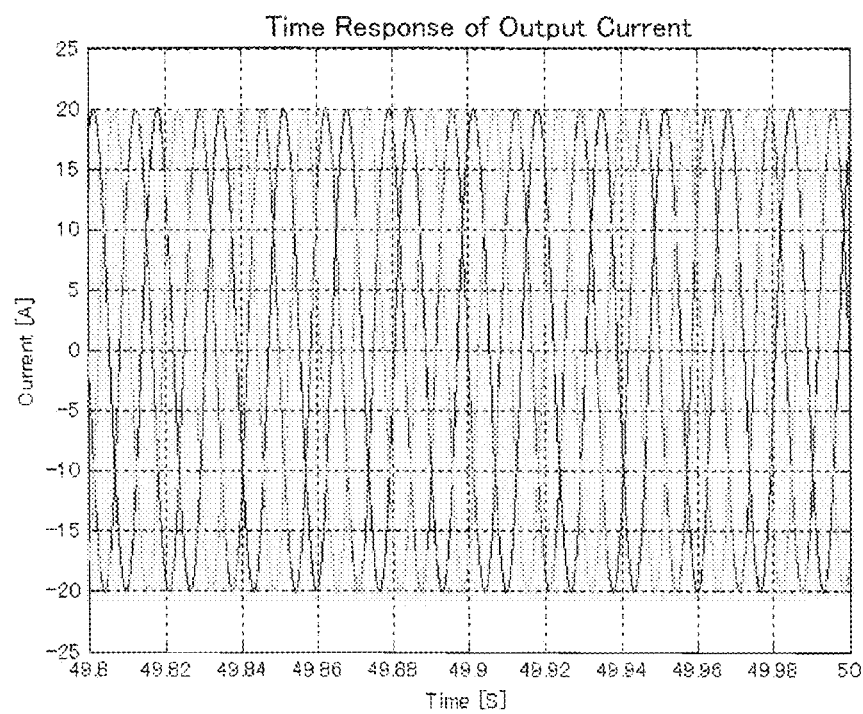

FIG. 17 is a diagram for describing a result of a simulation conducted with the eighth embodiment.

In the simulation, non-balanced distortion and harmonic disturbance in each order were added to the current in each phase in the interconnection inverter system A (see FIG. 16), with a target current set at 20 [A]. FIG. 17 shows waveforms of current signals Iu, Iv, Iw detected by the current sensor 5 in an output current of each phase. FIG. 17(a) shows waveforms right after the simulation was started whereas FIG. 17(b) shows waveforms in 50 seconds after the simulation was started. As shown in FIG. 17(b), each of the current signals Iu, Iv, Iw has a smooth waveform with all harmonic components suppressed well.

Figures 18, 19:
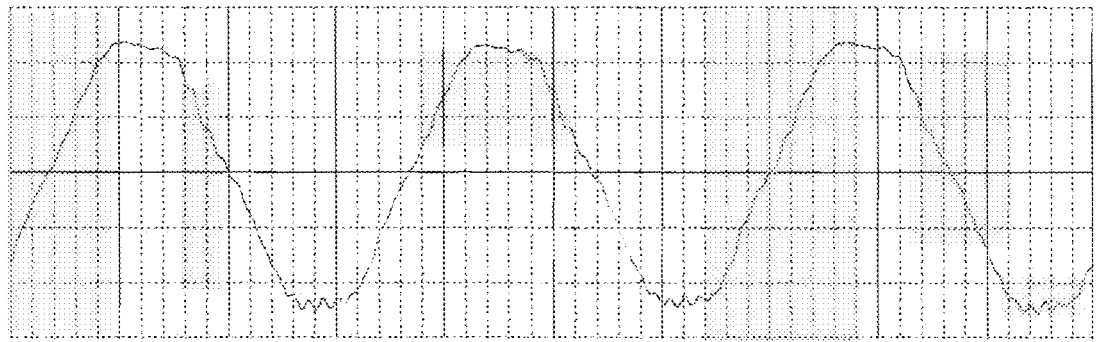
FIG. 18 is a diagram for describing a result of an experiment conducted with the eighth embodiment.
FIG. 19 is a table for describing a result of an experiment conducted with the eighth embodiment.

FIG. 18 and FIG. 19 are diagrams for describing a result of an experiment conducted with the eighth embodiment.

In this experiment, comparison was made between a case where there was a harmonic compensation controller 9 (including only a fifth-order harmonic compensator 91 and a seventh-order harmonic compensator 92) was provided and a case the same was not provided in an interconnection inverter system A (see FIG. 16) which was connected with an electrical power system B contaminated with non-balanced distortion and harmonic disturbance at each order of harmonics. FIG. 18 shows waveforms of a phase U current signal Iu after a steady state was achieved. FIG. 18(a) shows a case where the harmonic compensation controller 9 was not provided whereas FIG. 18(b) shows a case where the harmonic compensation controller 9 was provided. As compared to FIG. 18(a), the waveform in FIG. 18(b) is smoother as a result of suppression on the fifth-order and the seventh-order harmonic components. FIG. 19 is a chart which shows ratios of harmonic components contained in the current signals Iu, Iv, Iw in the steady state. The table shows percentage values of each harmonic component, with the fundamental wave component being 100%. FIG. 18(a) shows a case where the harmonic compensation controller 9 was not provided whereas FIG. 18(b) shows a case where the harmonic compensation controller 9 was provided. As compared to the table in FIG. 19(a), the table in FIG. 19(b) shows better suppression on the fifth-order and the seventh-order harmonic components.

In the seventh and the eighth embodiments, description was made for cases where three current signals Iu, Iv, Iw are converted into an alpha axis current signal Iα and a beta axis current signal Iβ, to provide control. However, the present invention is not limited to this. For example, control may be provided through direct use of the three current signals Iu, Iv, Iw. Hereinafter, such a case will be described as a ninth embodiment.

Figure 20:
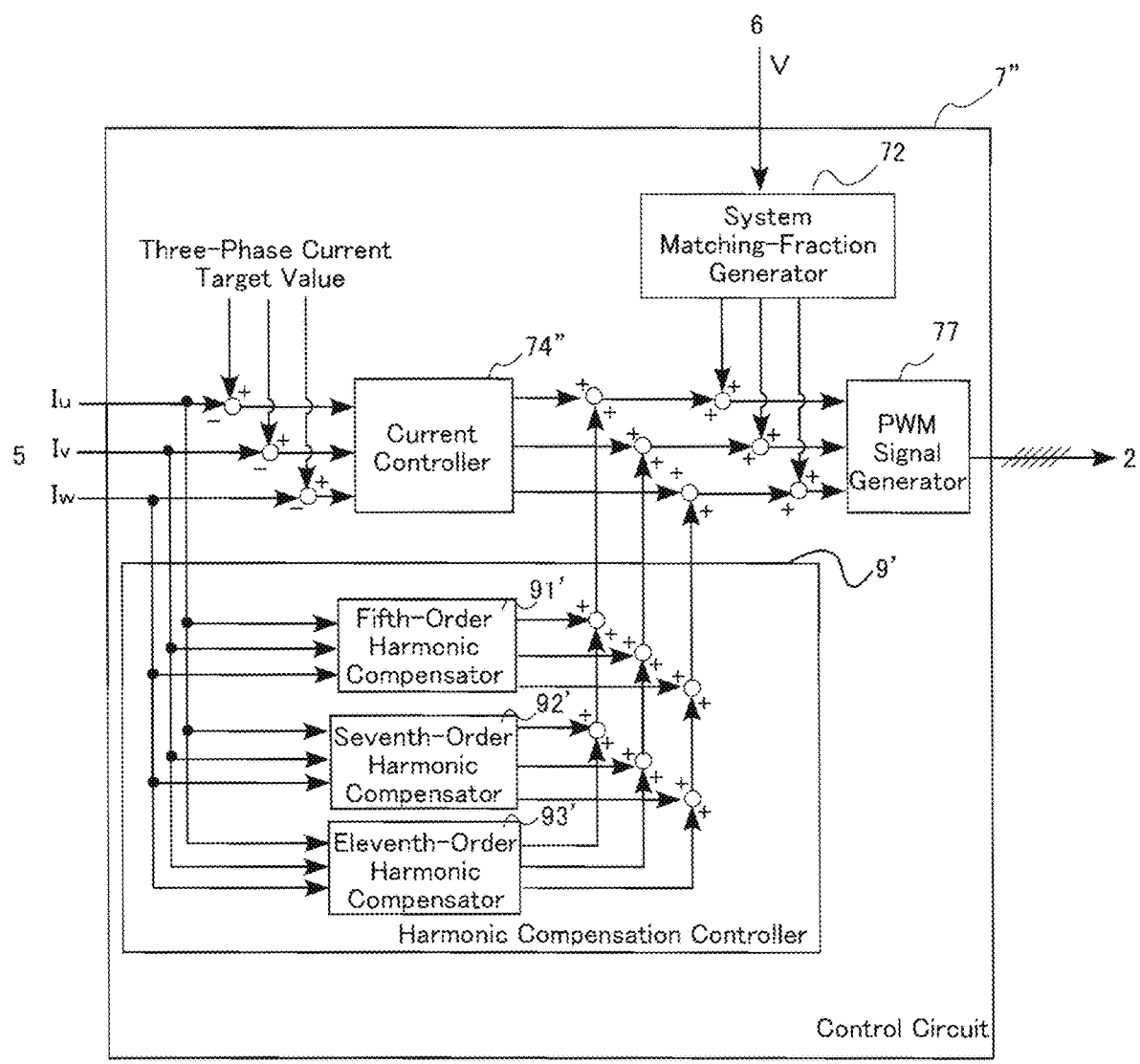
FIG. 20 is a block diagram for describing a control circuit according to a ninth embodiment.

FIG. 20 is a block diagram for describing a control circuit according to the ninth embodiment. In this figure, elements which are identical with or similar to those in the control circuit 7″ in FIG. 11 are indicated by the same reference codes.

FIG. 20 shows a control circuit 7‴, which is the control circuit 7″ (see FIG. 11) according to the third embodiment further including a harmonic compensation controller 9′. The harmonic compensation controller 9′ differs from the harmonic compensation controller 9 (see FIG. 16) according to the seventh embodiment in that its fifth-order harmonic compensator 91′, seventh-order harmonic compensator 92′ and eleventh-order harmonic compensator 93′ provide direct control using three current signals Iu, Iv, Iw.

Since three-phase to two-phase conversion and two-phase to three-phase conversion are expressed by Equation (1) and Equation (4), a process in which the three-phase to two-phase conversion is followed by the process represented by the transfer function matrix $G_n$ and then followed by two-phase to three-phase conversion is expressed by a transfer function matrix $G'_n$ represented by Equation (28) given below:

$$G'_n = \frac{2}{3} \begin{bmatrix} 1 & 0 \\ -\frac{1}{2} & \frac{\sqrt{3}}{2} \\ -\frac{1}{2} & -\frac{\sqrt{3}}{2} \end{bmatrix} \quad (28)$$

$$G_n \begin{bmatrix} 1 & -\frac{1}{2} & -\frac{1}{2} \\ 0 & \frac{\sqrt{3}}{2} & -\frac{\sqrt{3}}{2} \end{bmatrix} = \begin{bmatrix} G_{n11}(s) & G_{n12}(s) & G_{n13}(s) \\ G_{n21}(s) & G_{n22}(s) & G_{n23}(s) \\ G_{n31}(s) & G_{n32}(s) & G_{n33}(s) \end{bmatrix} \Lambda$$

where when $n = 3k + 1$ $(k = 1, 2, \ldots)$, $$G_{n11}(s) = G_{n22}(s) = G_{n33}(s)$$
$$= \frac{F(s + jn\omega_0) + F(s - jn\omega_0)}{3}$$

$$G_{n12}(s) = G_{n23}(s) = G_{n31}(s)$$
$$= \frac{(-1 - \sqrt{3}\,j) \cdot F(s + jn\omega_0) + (-1 + \sqrt{3}\,j) \cdot F(s - jn\omega_0)}{6}$$

$$G_{n13}(s) = G_{n21}(s) = G_{n32}(s)$$
$$= \frac{(-1 + \sqrt{3}\,j) \cdot F(s + jn\omega_0) + (-1 - \sqrt{3}\,j) \cdot F(s - jn\omega_0)}{6}$$

when $n = 3k + 2$ $(k = 0, 1, 2, \ldots)$, $$G_{n11}(s) = G_{n22}(s) = G_{n33}(s)$$
$$= \frac{F(s + jn\omega_0) + F(s - jn\omega_0)}{3}$$

$$G_{n12}(s) = G_{n23}(s) = G_{n31}(s)$$
$$= \frac{(-1 + \sqrt{3}\,j) \cdot F(s + jn\omega_0) + (-1 - \sqrt{3}\,j) \cdot F(s - jn\omega_0)}{6}$$

$$G_{n13}(s) = G_{n21}(s) = G_{n32}(s)$$
$$= \frac{(-1 - \sqrt{3}\,j) \cdot F(s + jn\omega_0) + (-1 + \sqrt{3}\,j) \cdot F(s - jn\omega_0)}{6}$$

Therefore, the process in which three-phase to two-phase conversion is followed by a process represented by the transfer function matrix $G_{In}$, and then followed by two-phase to three-phase conversion is given by the matrix $G'_{In}$ of the transfer function represented by Equation (29) given below:

$$G'_{In} = \begin{bmatrix} G_{In11}(s) & G_{In12}(s) & G_{In13}(s) \\ G_{In21}(s) & G_{In22}(s) & G_{In23}(s) \\ G_{In31}(s) & G_{In32}(s) & G_{In33}(s) \end{bmatrix} \Lambda \quad (29)$$

where when $n = 3k + 1$ $(k = 1, 2, \ldots)$, $$G_{In11}(s) = G_{In22}(s) = G_{In33}(s) = \frac{2}{3} \cdot \frac{K_I s}{s^2 + n^2 \omega_0^2}$$

$$G_{In12}(s) = G_{In23}(s) = G_{In31}(s) = -\frac{1}{3} \cdot \frac{K_I(s + \sqrt{3}\,n\omega_0)}{s^2 + n^2 \omega_0^2}$$

$$G_{In13}(s) = G_{In21}(s) = G_{In32}(s) = -\frac{1}{3} \cdot \frac{K_I(s - \sqrt{3}\,n\omega_0)}{s^2 + n^2 \omega_0^2}$$

when $n = 3k + 2$ $(k = 0, 1, 2, \ldots)$ $$G_{n11}(s) = G_{n22}(s) = G_{n33}(s) = \frac{2}{3} \cdot \frac{K_I s}{s^2 + n^2 \omega_0^2}$$

-continued $$G_{In12}(s) = G_{In23}(s) = G_{In31}(s) = -\frac{1}{3} \cdot \frac{K_I(s - \sqrt{3}\,n\omega_0)}{s^2 + n^2\omega_0^2}$$

$$G_{In13}(s) = G_{In21}(s) = G_{In32}(s) = -\frac{1}{3} \cdot \frac{K_I(s + \sqrt{3}\,n\omega_0)}{s^2 + n^2\omega_0^2}$$

The fifth-order harmonic compensator 91' receives three current signals Iu, Iv, Iw from the current sensor 5 for generation of fifth-order harmonic compensation signals Yu$_5$, Yv$_5$, Yw$_5$ to be used in suppressing positive phase sequence component of the fifth-order harmonic. The compensator performs a process represented by Equation (30) shown below. It should be noted here that the transfer function matrix G'$_{I5}$ is the transfer function matrix G'$_{In}$ represented by Equation (29) with n=5. Also, the fifth-order harmonic compensator 91' performs a stability margin maximization process, which includes phase adjustment to correct phase delay in the control loop for reversing the phase. The current signals Iu, Iv, Iw represent "the first input signal", "the second input signal", and "the third input signal" according to the present invention respectively whereas the fifth-order harmonic compensation signals Yu$_5$, Yv$_5$, Yw$_5$ represent "the first output signal", "the second output signal" and "the third output signal" according to the present invention respectively.

$$\begin{bmatrix} Yu_5 \\ Yv_5 \\ Yw_5 \end{bmatrix} = G'_{I5} \begin{bmatrix} Iu \\ Iv \\ Iw \end{bmatrix} \Lambda \quad (30)$$

In the present embodiment, the fifth-order harmonic compensator 91' is designed by H loop shaping method, which is a method based on a linear control theory, with a frequency weight being provided by the transfer function matrix G'$_{I5}$. The process performed in the fifth-order harmonic compensator 91' is expressed by the transfer function matrix G'$_{I5}$, and therefore is a linear time-invariant process. Hence, it is possible to perform control system design using a linear control theory. The fifth-order harmonic compensator 91' is designed in the same manner as is the fifth-order harmonic compensator 91 according to the seventh embodiment. However, a linear control theory other than the H∞ loop shaping method may be utilized in the design.

The seventh-order harmonic compensator 92' receives three current signals Iu, Iv, Iw from the current sensor 5 for generation of seventh-order harmonic compensation signals Yu$_7$, Yv$_7$, Yw$_7$ to be used in suppressing positive phase sequence component in the seventh-order harmonic. The compensator performs a process represented by the Equation (31) shown below. It should be noted here that the matrix G'$_{I7}$ of the transfer function is the transfer function matrix G'$_{In}$ represented by Equation (29) with n=7. Also, the seventh-order harmonic compensator 92' performs a stability margin maximization process, which includes phase adjustment to correct phase delay in the control loop for reversing the phase. The seventh-order harmonic compensator 92' is also designed by the same method as is the fifth-order harmonic compensator 91'.

$$\begin{bmatrix} Yu_7 \\ Yv_7 \\ Yw_7 \end{bmatrix} = G'_{I7} \begin{bmatrix} Iu \\ Iv \\ Iw \end{bmatrix} \Lambda \quad (31)$$

The eleventh-order harmonic compensator 93' receives three current signals Iu, Iv, Iw from the current sensor 5 for generation of eleventh-order harmonic compensation signals Yu$_{11}$, Yv$_{11}$, Yw$_{11}$ to be used in suppressing positive phase sequence components in the eleventh-order harmonics. The compensator performs a process represented by the following Equation (32). It should be noted here that the transfer function matrix G'$_{I11}$ is the transfer function matrix G'$_{In}$ represented by Equation (29) with n=11. Also, the eleventh-order harmonic compensator 93' performs a stability margin maximization process, which includes phase adjustment to correct phase delay in the control loop for reversing the phase. The eleventh-order harmonic compensator 93' is also designed by the same method as is the fifth-order harmonic compensator 91'.

$$\begin{bmatrix} Yu_{11} \\ Yv_{11} \\ Yw_{11} \end{bmatrix} = G'_{I11} \begin{bmatrix} Iu \\ Iv \\ Iw \end{bmatrix} \Lambda \quad (32)$$

The fifth-order harmonic compensation signals Yα$_5$, Yβ$_5$ outputted from the fifth-order harmonic compensator 91', the seventh-order harmonic compensation signals Yα$_7$, Yβ$_7$ outputted from the seventh-order harmonic compensator 92', and the eleventh-order harmonic compensation signals Yα11, Yβ11 outputted from the eleventh-order harmonic compensator 93' are added together respectively, and the resulting harmonic compensation signals Yu, Yv, Yw are outputted from the harmonic compensation controller 9. The harmonic compensation controller 9' is designed in accordance with the orders of harmonics which must be suppressed. For example, if it is desired to suppress only the fifth-order harmonics, then the controller may only include the fifth-order harmonic compensator 91'. If it is desired to further suppress the thirteenth-order harmonic, then the controller should further include a thirteenth-order harmonic compensator for a process expressed by a transfer function matrix G'$_{I13}$, which is the transfer function matrix G$_{In}$ of the transfer function represented by Equation (25) with n=13.

The harmonic compensation signals Yu, Yv, Yw outputted from the harmonic compensation controller 9' are added to the correction value signals Xu, Xv, Xw from the current controller 74". After the addition of the compensation signals Yu, Yv, Yw, system command values Ku, Kv, Kw from the system matching-fraction generator 72 are added to the correction value signals Xu, Xv, Xw, to obtain command value signals X'u, X'v, X'w, which are then inputted to the PWM signal generator 77.

In the present embodiment, the process performed in the fifth-order harmonic compensator 91' is expressed by the transfer function matrix G'$_{I5}$, and therefore is a linear time-invariant process. Also, the fifth-order harmonic compensation does not include nonlinear time-varying processes, i.e., the circuit does not include fixed-to-rotating coordinate conversion process nor rotating-to-fixed coordinate conversion process. Hence, the entire control loop is a linear time-invariant system. Therefore, the arrangement enables control system design and system analysis using a linear control theory. The same applies to the seventh-order harmonic compensator 92' and the eleventh-order harmonic compensator 93'.

If negative phase sequence component control is to be performed in the ninth embodiment, it can be achieved by using the transfer function matrix G'$_{In}$ used for controlling the positive phase sequence components in which the elements $G_{In12}(s)$, $G_{In23}(s)$, and $G_{In31}(s)$ are swapped with $G_{In13}(s)$, $G_{In21}(s)$ and $G_{In32}(s)$ respectively (specifically, a transposed matrix of the matrix $G'_{In}$ should be used). Also, control may be provided on both positive-phase and negative-phase sequence components. Hereinafter, description will cover such a case as a ninth embodiment, where the fifth-order harmonic compensator 91', the seventh-order harmonic compensator 92', and the eleventh-order harmonic compensator 93' control both positive-phase and negative-phase sequence components.

If "0" is given to the element (1, 2) and the element (2, 1) of the matrix $G_n$ in Equation (28) described above, the calculation provides a transfer function matrix $G''_n$ represented by Equation (33) shown below:

$$G''_n = \frac{2}{3}\begin{bmatrix} 1 & 0 \\ -\frac{1}{2} & \frac{\sqrt{3}}{2} \\ -\frac{1}{2} & -\frac{\sqrt{3}}{2} \end{bmatrix} \quad (33)$$

$$\begin{bmatrix} \frac{F(s+jn\omega_0)+F(s-jn\omega_0)}{2} & 0 \\ 0 & \frac{F(s+jn\omega_0)+F(s-jn\omega_0)}{2} \end{bmatrix} \times$$

$$\begin{bmatrix} 1 & -\frac{1}{2} & -\frac{1}{2} \\ 0 & \frac{\sqrt{3}}{2} & -\frac{\sqrt{3}}{2} \end{bmatrix} = \frac{1}{3} \cdot \frac{F(s+jn\omega_0)+F(s-jn\omega_0)}{2}\begin{bmatrix} 2 & -1 & -1 \\ -1 & 2 & -1 \\ -1 & -1 & 2 \end{bmatrix} \Lambda$$

Therefore, if the fifth-order harmonic compensator 91' is to control both positive-phase and negative-phase sequence components, it can be accomplished by using a transfer function matrix $G''_{I5}$ which is the transfer function matrix $G''_{IN}$ represented by Equation (34) with n=5 shown below. Likewise, if the seventh-order harmonic compensator 92' is to control both positive-phase and negative-phase sequence components, it can be accomplished by using a transfer function matrix $G''_{I7}$ which is the transfer function matrix $G''_{IN}$ represented by Equation (34) with n=7 shown below. Further, if the eleventh-order harmonic compensator 93' is to control both positive-phase and negative-phase sequence components, it can be accomplished by using a transfer function matrix $G''_{I}11$ which is the transfer function matrix $G''_{IN}$ represented by Equation (34) with n=11 shown below:

$$G''_{In} = \frac{1}{3} \cdot \frac{K_I s}{s^2 + n^2\omega_0^2}\begin{bmatrix} 2 & -1 & -1 \\ -1 & 2 & -1 \\ -1 & -1 & 2 \end{bmatrix} \Lambda \quad (34)$$

In the seventh through the ninth embodiments, description was made for cases where the fifth-order harmonic compensator 91 (91' the seventh-order harmonic compensator 92 (92') and the eleventh-order harmonic compensator 93 (93') perform a control which replaces I control. However, the present invention is not limited by these. For example, an alternative control which replaces PI control may be provided. If the fifth-order harmonic compensator 91, the seventh-order harmonic compensator 92 and the eleventh-order harmonic compensator 93 in the seventh embodiment are to provide an alternative control which replaces PI control, with n=3k+1 (k=1, 2, . . . ), it can be accomplished by substituting $\omega_0$ for $n\cdot\omega_0$ in the Equation (11) above, which will provide a transfer function matrix $G_{PIn}$ represented by Equation (35) shown below. In a case where n=3k+2 (k=0, 1, 2, . . . ), then substitute the item $\omega_0$ for $n\cdot\omega_0$ in Equation (11), swap the element (1, 2) with the element (2, 2) and use a transfer function matrix $G_{PIn}$ represented by Equation (35') shown below. The following Equations (35) and (35') can be obtained by substituting $F(s)$ for $K_P + K_I/s$ in Equations (23) and (23').

$$G_{PIn} = \begin{bmatrix} \frac{K_P s^2 + K_I s + K_P n^2\omega_0^2}{s^2 + n^2\omega_0^2} & \frac{-K_I n\omega_0}{s^2 + n^2\omega_0^2} \\ \frac{K_I n\omega_0}{s^2 + n^2\omega_0^2} & \frac{K_P s^2 + K_I s + K_P n^2\omega_0^2}{s^2 + n^2\omega_0^2} \end{bmatrix} \Lambda \quad (35)$$

$$G_{PIn} = \begin{bmatrix} \frac{K_P s^2 + K_I s + K_P n^2\omega_0^2}{s^2 + n^2\omega_0^2} & \frac{K_I n\omega_0}{s^2 + n^2\omega_0^2} \\ \frac{-K_I n\omega_0}{s^2 + n^2\omega_0^2} & \frac{K_P s^2 + K_I s + K_P n^2\omega_0^2}{s^2 + n^2\omega_0^2} \end{bmatrix} \Lambda \quad (35')$$

If the fifth-order harmonic compensator 91 is to provide control which replaces PI control, it can be accomplished by using a matrix $G_{PI5}$ represented by Equation (35') with n=5. If the seventh-order harmonic compensator 92 is to provide control which replaces PI control, it can be accomplished by using a matrix $G_{PI7}$ given by Equation (35') with n=7. If the eleventh-order harmonic compensator 93 is to provide control which replaces PI control, it can be accomplished by using a matrix $G_{PI11}$ given by Equation (35') with n=11.

If the fifth-order harmonic compensator 91, the seventh-order harmonic compensator 92 and the eleventh-order harmonic compensator 93 in the eighth embodiment are to provide control which replaces PI control, it can be accomplished by using the transfer function matrix $G_{PIn}$ represented by Equations (35) and (35') in which "0" is given to the element (1, 2) and the element (2, 1).

If the fifth-order harmonic compensator 91', the seventh-order harmonic compensator 92' and the eleventh-order harmonic compensator 93' in the ninth embodiment are to provide control which replaces PI control, it can be accomplished by using a transfer function matrix $G'_{PIn}$ represented by Equation (36) shown below:

$$G'_{PIn} = \begin{bmatrix} G_{PIn11}(s) & G_{PIn12}(s) & G_{PIn13}(s) \\ G_{PIn21}(s) & G_{PIn22}(s) & G_{PIn23}(s) \\ G_{PIn31}(s) & G_{PIn32}(s) & G_{PIn33}(s) \end{bmatrix} \Lambda \quad (36)$$

where when n=3k+1 (k=1, 2, . . . ), $$G_{PIn11}(s) = G_{PIn22}(s) = G_{PIn33}(s) = \frac{2}{3} \cdot \frac{K_P s^2 + K_I s + K_P n^2\omega_0^2}{s^2 + n^2\omega_0^2}$$

$$G_{PIn12}(s) = G_{PIn23}(s) = G_{PIn31}(s) = -\frac{1}{3} \cdot \frac{K_P s^2 + K_I(s + \sqrt{3}\, n\omega_0) + K_P n^2\omega_0^2}{s^2 + n^2\omega_0^2}$$

$$G_{PIn13}(s) = G_{PIn21}(s) = G_{PIn32}(s) = -\frac{1}{3} \cdot \frac{K_P s^2 + K_I(s - \sqrt{3}\, n\omega_0) + K_P n^2\omega_0^2}{s^2 + n^2\omega_0^2}$$

-continued when $n = 3k + 2$ ($k = 0, 1, 2, \ldots$)

$$G_{PIn11}(s) = G_{PIn22}(s) = G_{PIn33}(s) = \frac{2}{3} \cdot \frac{K_P s^2 + K_I s + K_P n^2 \omega_0^2}{s^2 + n^2 \omega_0^2}$$

$$G_{PIn12}(s) = G_{PIn23}(s) = G_{PIn31}(s) = -\frac{1}{3} \cdot \frac{K_P s^2 + K_I(s - \sqrt{3}\, n\omega_0) + K_P n^2 \omega_0^2}{s^2 + n^2 \omega_0^2}$$

$$G_{PIn13}(s) = G_{PIn21}(s) = G_{PIn32}(s) = -\frac{1}{3} \cdot \frac{K_P s^2 + K_I(s + \sqrt{3}\, n\omega_0) + K_P n^2 \omega_0^2}{s^2 + n^2 \omega_0^2}$$

If the fifth-order harmonic compensator 91', the seventh-order harmonic compensator 92', and the eleventh-order harmonic compensator 93' are to provide control which replaces PI control, in the configuration that negative phase sequence component control is performed for each harmonic in the ninth embodiment, it can be achieved by using a matrix provided by the transfer function matrix $G'_{PIn}$ represented by Equation (36) above in which the elements $G_{PIn12}(s)$, $G_{PIn23}(s)$ and $G_{PIn31}(s)$ are swapped with $G_{PIn13}(s)$, $G_{PIn21}(s)$ and $G_{PIn32}(s)$ respectively (specifically, a transposed matrix of the matrix $G'_{PIn}$ should be used). Also, if the fifth-order harmonic compensator 91', the seventh-order harmonic compensator 92' and the eleventh-order harmonic compensator 93' are to provide alternative control which replaces PI control, in the configuration that both positive-phase and negative-phase sequence components are controlled in the ninth embodiment, it can be accomplished by using a transfer function matrix $G''_{PIn}$ represented by Equation (37) shown below:

$$G''_{PIn} = \frac{1}{3} \cdot \frac{K_P s^2 + K_I s + K_P n^2 \omega_0^2}{s^2 + n^2 \omega_0^2} \begin{bmatrix} 2 & -1 & -1 \\ -1 & 2 & -1 \\ -1 & -1 & 2 \end{bmatrix} \Lambda \quad (37)$$

Providing alternative control which replaces PI control provides an advantage that a damping effect can be added at transient time by adjusting the proportional gain $K_P$. However, there is also a disadvantage that the system is more sensitive to modeling errors. On the contrary, providing control which replaces I control is disadvantageous in that a damping effect at transient time cannot be added, yet there is an advantage that the system is not very much sensitive to modeling errors.

Still another alternative may be that the fifth-order harmonic compensator 91 (91'), the seventh-order harmonic compensator 92 (92') and the eleventh-order harmonic compensator 93 (93') perform alternative control which replaces the above-described other alternative controls equivalent to I control or to the PI control. If transfer functions F(s) in Equations (23) and (23') are substituted for a transfer functions of the above-mentioned alternative control, it becomes possible to calculate a transfer function matrix which represents a process equivalent to carrying out fixed-to-rotating coordinate conversion, then the above-described alternative control and then rotating-to-fixed coordinate conversion. Therefore, it is possible to design a system which provides an alternative control to PID control (the transfer function for which is expressed as $F(s) = K_P + K_I/s + K_D \cdot s$, where proportional gain is represented by $K_P$, integral gain is represented by $K_I$, and derivative gain is represented by $K_D$). It is also possible to provide controls which can substitute D control (derivative control; the transfer function for which is expressed as $F(s) = K_D \cdot s$, where derivative gain is represented by $K_D$); P control (proportional control; the transfer function for which is expressed as $F(s) = K_P$, where proportional gain is represented by $K_P$); PD control; ID control; etc.

In the seventh through the ninth embodiments thus far, description was made for cases where output current is controlled. However, the present invention is not limited to this. For example, output voltage may be controlled. In this case, the control circuit 8 (see FIG. 13) according to the fourth embodiment further includes the harmonic compensation controller 9. Again, the arrangement provides the same advantages as offered by the seventh embodiment. Also, any of the control methods described thus far for the seventh through the ninth embodiments is applicable to the case where output voltage is controlled. For example, both of positive-phase and negative-phase sequence components may be controlled; three voltage signals Vu, Vv, Vw may be used for control; or alternative control replacing PI control may be provided. Also, there may be a configuration where the control circuit 8' (see FIG. 14) according to the fifth embodiment further includes the harmonic compensation controller 9.

Next, description will cover methods for preventing harmonic suppression control from becoming divergent.

In the seventh embodiment (see FIG. 16), the fifth-order harmonic compensator 91 performs phase adjustment to correct phase delay in the control loop for reversing the phase. Setting for the phase adjustment is based on the impedance of the interconnection inverter system A (mainly from a reactor inductance and capacitor capacitance of the filter circuit 3) before the system is interconnected with the electrical power system B. Once the interconnection inverter system A is connected with the electrical power system B and if the electrical power system B has load conditions which are different from the assumption, there can be a problem such as a shift or an increase in resonance points of the filter circuit 3. If this happens, phase correction is no longer appropriate, and the control can be divergent.

Figure 21:
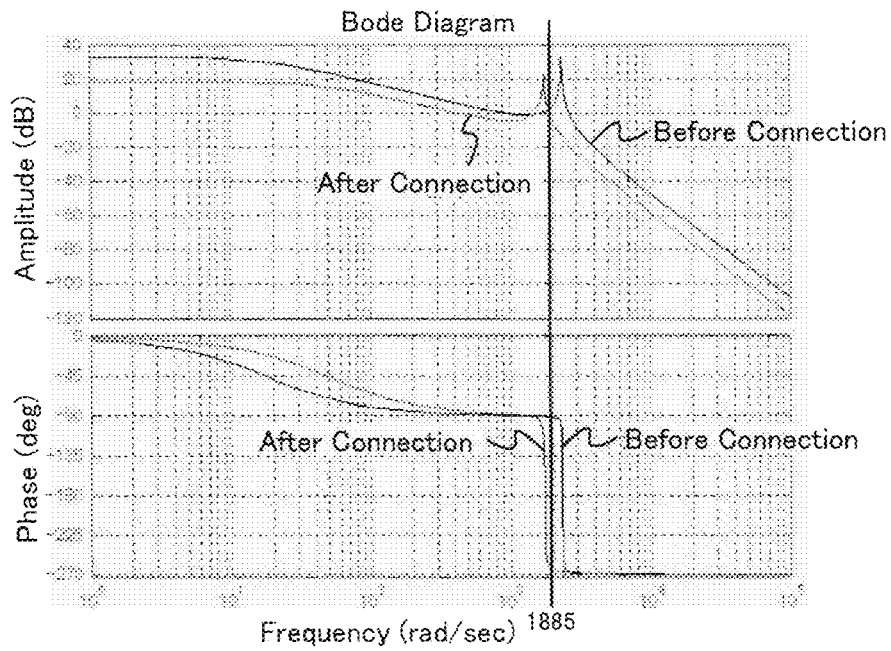
FIG. 21 is a Bode diagram showing a transfer function before and after interconnection.

FIG. 21 is a Bode diagram of a transfer function from an output voltage of the inverter circuit 2 to an output current of the interconnection inverter system A, showing an example of the transfer function before and after the interconnection inverter system A is connected with the electrical power system B.

With the system voltage fundamental wave angular frequency $\omega_0$ being $120\pi$ [rad/sec] (60 [Hz]), angular frequency of the fifth-order harmonic is $600\pi$ (~1885) [rad/sec] (300 [Hz]). According to FIG. 21, the phase of the fifth-order harmonic is delayed by about 90 degrees before the connection, but delayed by about 270 degrees after the connection. In other words, even if the phase adjustment for negative feedback control is made before the connection, the control will become positive feedback control after the connection and therefore the control will become divergent. Hereinafter, a tenth embodiment will cover an arrangement including a configuration for preventing such a control divergence.

Figure 22:
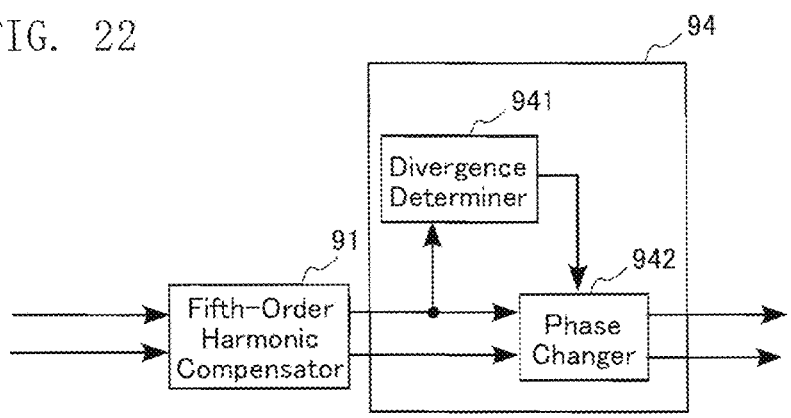
FIG. 22 is a diagram for describing a harmonic compensation controller according to a tenth embodiment.

FIG. 22 is a drawing for describing a harmonic compensation controller according to the tenth embodiment. The figure shows a fifth-order harmonic compensator 91 and a divergence preventer disposed on the subsequent stage.

The divergence preventer 94 works for preventing the fifth-order harmonic suppression control from becoming divergent. If the divergence preventer 94 determines that the control tends to be divergent, then the divergence preventer 94 changes the phase of the fifth-order harmonic compensation signals $Y\alpha_5$, $Y\beta_5$ inputted from the fifth-order harmonic compensator 91, and outputs the changed signals. The divergence preventer 94 includes a divergence determiner 941 and a phase changer 942.

The divergence determiner 941 determines whether or not the control has a divergent tendency. The divergence determiner 941 compares the fifth-order harmonic compensation signal $Y\alpha_5$ (or the fifth-order harmonic compensation signal $Y\beta_5$) from the fifth-order harmonic compensator 91 with a predetermined threshold value, and if the fifth-order harmonic compensation signal $Y\alpha_5$ is greater than the predetermined threshold value, it determines that the control has a divergent tendency. Upon determination that the control has a divergent tendency, the divergence determiner 941 outputs a judge signal to the phase changer 942. It should be noted here that the divergence determiner 941 may determine the divergent tendency by a different method. For example, the determiner may determine that the control has a divergent tendency if the fifth-order harmonic compensation signals $Y\alpha_5$ remains greater than a predetermined threshold value for a predetermined amount of time. Another method may be that a maximum value of the fifth-order harmonic compensation signal $Y\alpha_5$ is always stored and a gradient of the maximum value is utilized as a base of determining if the control has a divergent tendency.

The phase changer 942 changes the phase of the fifth-order harmonic compensation signals $Y\alpha_5$, $Y\beta_5$ inputted from the fifth-order harmonic compensator 91, and outputs the changed signals. The phase changer 942 performs a process represented by Equation (38) shown below, to output fifth-order harmonic compensation signals $Y'\alpha_5$, $Y'\beta_5$:

$$\begin{bmatrix} Y'\alpha_5 \\ Y'\beta_5 \end{bmatrix} = \begin{bmatrix} \cos\Delta\theta_5 & -\sin\Delta\theta_5 \\ \sin\Delta\theta_5 & \cos\Delta\theta_5 \end{bmatrix} \begin{bmatrix} Y\alpha_5 \\ Y\beta_5 \end{bmatrix} \Lambda \quad (38)$$

The item $\Delta\theta_5$ has an initial value of "0", so the fifth-order harmonic compensation signals $Y\alpha_5$, $Y\beta_5$ are outputted without any phase change until there is an input of the judge signal from the divergence determiner 941. When there is an input of the judge signal from the divergence determiner 941, the phase changer 942 varies $\Delta\theta_5$, thereby changing the phase and then outputs the changed fifth-order harmonic compensation signals $Y'\alpha_5$, $Y'_5$. When the input of the judge signal from the divergence determiner 941 ceases, the phase changer 942 fixes the value of $\Delta\theta_5$. Thus, the phase changer 942 changes the phase and output the changed fifth-order harmonic compensation signals $Y'\alpha_5$, $Y'\beta_5$. If varying the $\Delta\theta_5$ (e.g., increasing the value thereof) gives a greater value to the fifth-order harmonic compensation signals $Y\alpha_5$, then the phase changer 942 varies the $\Delta\theta_5$ in reverse direction (e.g., decreasing the value thereof), to search for a value for $\Delta\theta_5$ to converge the control.

If the control has a divergent tendency, $\Delta\theta_5$ is varied in search for an appropriate $\Delta\theta_5$ while if the control does not have a divergent tendency $\Delta\theta_5$ is fixed to output the fifth-order harmonic compensation signals $Y'\alpha_5$, $Y'\beta_5$ in which appropriate adjustment has been made to the phase. Thus, the arrangement prevents the control from becoming divergent.

However, the configuration for control divergence prevention is not limited to the above. Divergence in control may be prevented by other methods.

Figure 23:
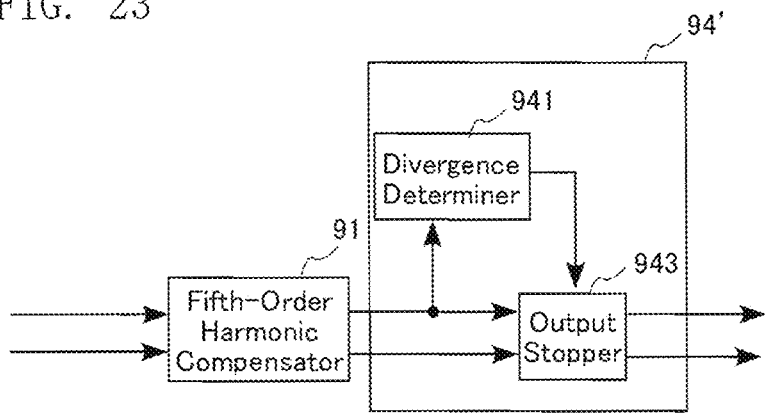
FIG. 23 is a diagram for describing another example of the harmonic compensation controller according to the tenth embodiment.

FIG. 23 is a drawing for describing a harmonic compensation controller according to another example of the tenth embodiment. The figure shows a fifth-order harmonic compensator 91 and a divergence preventer disposed on the subsequent stage.

A divergence preventer 94' works for preventing the fifth-order harmonic suppression control from becoming divergent. If the divergence preventer 94' determines that the control tends to be divergent, then the divergence preventer 94' stops outputting the fifth-order harmonic compensation signals $Y\alpha_5$, $Y\beta_5$ received from the fifth-order harmonic compensator 91. The divergence preventer 94' differs from the divergence preventer 94 in FIG. 22 in that it includes an output stopper 943 in place of the phase changer 942.

The output stopper 943 outputs the fifth-order harmonic compensation signals $Y\alpha_5$, $Y\beta_5$ as it receives as long as there is no input of the judge signal from the divergence determiner 941. If there is an input of the judge signal from the divergence determiner 941, the output stopper 943 stops outputting the fifth-order harmonic compensation signals $Y\alpha_5$, $Y\beta_5$.

If the control does not have a divergent tendency, the fifth-order harmonic compensation signals $Y\alpha_5$, $Y\beta_5$ inputted from the fifth-order harmonic compensator 91 are outputted as are, whereas if the control has a divergent tendency, the output of the fifth-order harmonic compensation signals $Y\alpha_5$, $Y\beta_5$ is stopped. Without the output of the fifth-order harmonic compensation signals $Y\alpha_5$, $Y\beta_5$, the fifth-order harmonic suppression control ceases and therefore the arrangement prevents the control from becoming divergence. The lack of the fifth-order harmonic suppression control does not affect the other controls.

It should be noted here that the phase changer 942 shown in FIG. 22 may be provided before the output stopper 943, so that search for a $\Delta\theta_5$ may be performed while the fifth-order harmonic suppression control is ceased and the output stopper 943 is resumed once the $\Delta\theta_5$ is determined.

The seventh-order harmonic compensator 92 and the eleventh-order harmonic compensator 93 may include the same arrangement to prevent divergence in each harmonic suppression control. Also, the eighth and the ninth embodiments may have the same arrangement to prevent harmonic suppression control from becoming divergent at each harmonic level.

In the seventh through the tenth embodiment thus far, description was made for cases where the harmonic compensation controller 9 is added to the control circuit of the interconnection inverter system (inverter system). However, the present invention is not limited to these. For example, the harmonic compensation controller 9 (9') may be added to control circuits for harmonic compensation devices, power active filters, unbalanced compensators, static var compensators (SVC, SVG) and uninterruptable power supply systems (UPS). Also, the control circuit may provide harmonic compensation only without controlling the fundamental waves (i.e., the circuit may not include the current controller). For example, the harmonic compensator is implemented by whichever of the arrangements shown in FIG. 16 and FIG. 20, if the arrangement does not include the current controller 74 (74"). The circuit will then be dedicated to harmonic suppression by the harmonic compensation controller 9 (9'). Further, the idea of adding the harmonic compensation controller 9 (9') is not limited to those control circuits for controlling inverter circuits which convert DC current into three-phase AC current. For example, the harmonic compensation controller 9 (9') may be added to control circuits for converter circuits (see the sixth embodiment in FIG. 15) which convert three-phase AC current into DC current, for cyclo-converters which convert three-phase AC frequencies, etc.

Next, description will cover a case where the control circuit according to the present invention is applied to a control circuit of a motor driving inverter circuit. Motor driving inverter circuits are an inverter circuit for driving AC motors (e.g., induction motors and synchronous motors), i.e., electric motors which are driven by AC power.

A typical control circuit in a conventional motor-drive inverter circuit receives current signals I detected by a current sensor, an angular frequency $\omega_0$ and a phase $\theta$ calculated by a rotation-speed/position detection circuit as inputs, generates PWM signals based on these, and outputs the PWM signals to the inverter circuit. The rotation-speed/position detection circuit detects rotation speed and rotation position of the motor's rotor, and uses this information to calculate the angular frequency $\omega_0$ and the phase $\theta$ for use in the control provided by the control circuit.

AC motors are used in a variety of fields and there is an increasing demand for high-speed rotation in recent years for purposes of higher output, wider operation speed range, etc. For AC motors to be able to achieve high-speed rotation, stable current control is essential. Conventionally, control circuits for motor driving inverter circuits provide a control which is based on rotating coordinate system, and this poses a technical problem of interference between the d axis control system and the q axis control system. The interference between the d axis control system and the q axis control system caused by the motor's inductance destabilizes the current control, and in order to suppress the interference, adjustment is performed by calculating an amount of interference by using a non-interference portion.

However, it is difficult to accurately identify the motor inductance. Consequently, as the angular frequency $\omega_0$ increases with increase in the motor speed, the amount of interference which is calculated by using the non-interference portion has an increased error. This leads to unstable non-interference process, which then leads to unstable control by the control circuit. Another problem is that it is not possible to design the control system by a linear control theory since the conventional control is based on a nonlinear time-varying process. For these reasons, it has been difficult to design a control system which provides both of rapid response and stability.

Hereinafter, a motor driving unit will be described as an eleventh embodiment in which a current controller which provides a process expressed by the transfer function matrix $G_I$ represented by Equation (12) is applied to a control circuit of a motor driving inverter circuit for providing control based on a fixed coordinate system.

Figure 24:
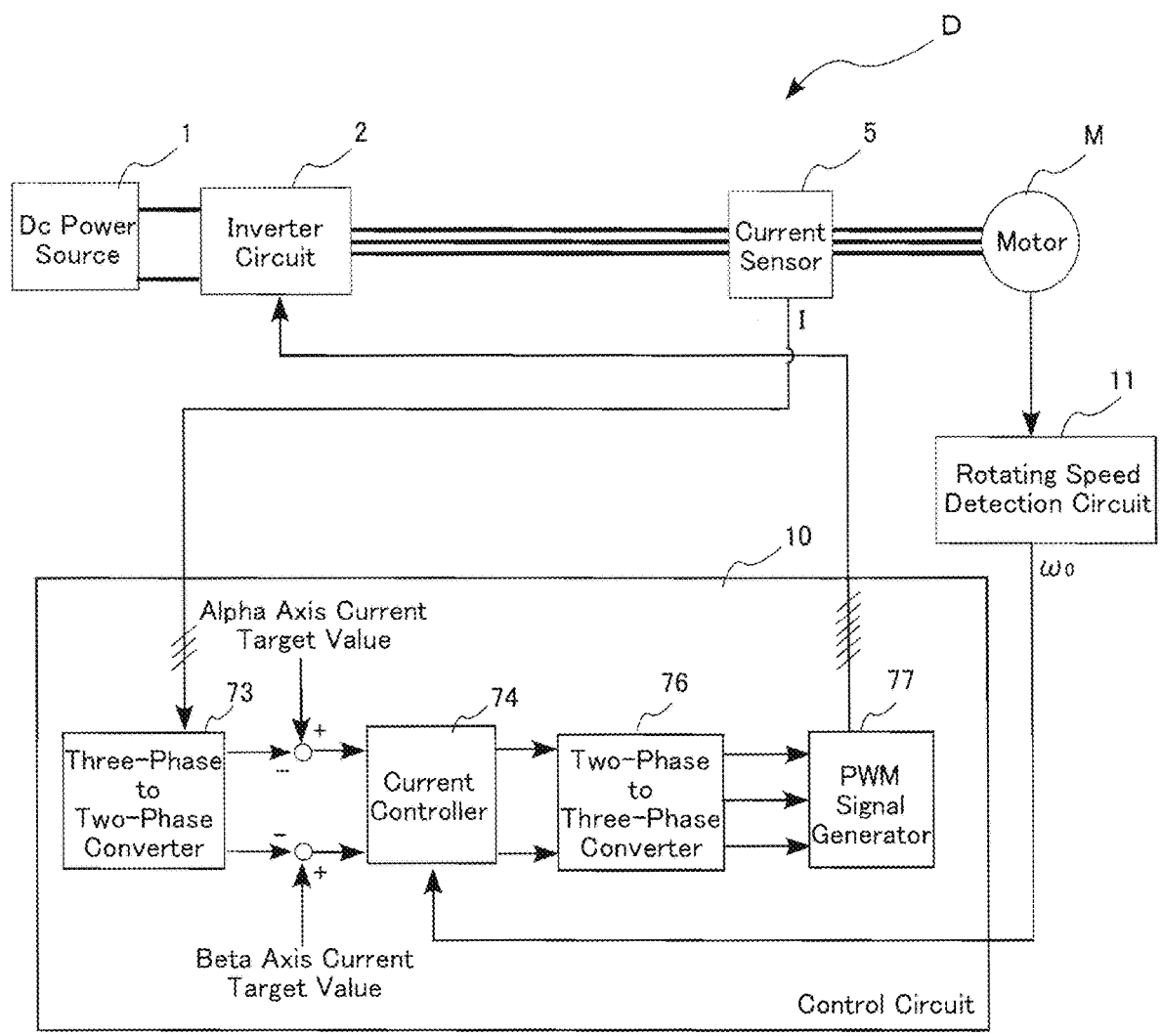
FIG. 24 is a block diagram for describing a motor driving unit according to an eleventh embodiment.

FIG. 24 is a block diagram for describing a motor driving unit according to the eleventh embodiment. In this figure, elements which are identical with or similar to those in the interconnection inverter system A in FIG. 1 are indicated by the same reference codes.

As shown in the figure, a motor driving unit D includes an inverter circuit 2 and a control circuit 10, converts DC power from a DC power source 1 into AC power, and supplies the AC power to a motor M. The inverter circuit 2 has a current sensor 5 in its output line. The current sensor 5 detects a current which is flowing in a motor winding wire of each phase in the motor M. The control circuit 10 provides control so that the current signals detected by the current sensor 5 will be equal to target values. The motor M is provided with a rotating speed detection circuit 11, which detects a rotating speed of the rotor of the motor M and calculates the angular frequency $\omega_0$.

The DC power source 1 outputs DC power by, e.g., converting AC power from the electrical power system into DC power using a converter, a rectifier, etc. It may include batteries, fuel cells, electric double layer capacitor, lithium-ion batteries or solar cells.

The inverter circuit 2 converts a DC voltage from the DC power source 1 into an AC voltage, and outputs the AC voltage. The inverter circuit 2, which includes an unillustrated PWM-control three-phase inverter having six switching elements in three sets, switches ON and OFF each of the switching elements based on PWM signals from the control circuit 10, thereby converting the DC voltage from the DC power source 1 into AC voltages.

The motor M is an electric motor which utilizes three-phase AC power and is provided by, e.g., a three-phase induction motor or a three-phase synchronous motor. The current sensor 5 detects an AC current of each phase outputted from the inverter circuit 2 (Specifically, it detects a current which flows into the winding wire of each phase in the motor M). The detected current signals I (Iu, Iv, Iw) are inputted to the control circuit 10. The rotating speed detection circuit 11 detects the rotor's rotating speed in the motor M by means of encoder for example, adds a slip angular velocity to the detected rotating speed, thereby calculating the angular frequency $\omega_0$. The detected angular frequency $\omega_0$ is inputted to the control circuit 10. Alternatively, however, the rotating speed detection circuit 11 may detect and output a rotor rotating speed of the motor M to the control circuit 10 so that the angular frequency $\omega_0$ is calculated by the control circuit 10.

The control circuit 10 controls the inverter circuit 2, and is implemented by a microcomputer for example. The control circuit 10 differs from the control circuit 7 (see FIG. 6) according to the first embodiment, in that the angular frequency $\omega_0$ is inputted from the rotating speed detection circuit 11 and that it does not have the system matching-fraction generator 72.

In the present embodiment, the control circuit 10 performs control in the fixed coordinate system without making fixed-to-rotating coordinate conversion nor rotating-to-fixed coordinate conversion. Therefore, no interference is caused to the control due to the inductance. Hence, it is possible to provide stable control even when the motor M is rotating at a high speed. Also, since the inductance causes no interference with the control, there is no need to provide a non-interference portion. Also, as has been described earlier, the transfer function matrix $G_I$ is a transfer function matrix which shows a process equivalent to carrying out fixed-to-rotating coordinate conversion, I control and then rotating-to-fixed coordinate conversion.

Since the process performed in the current controller 74 is expressed as a transfer function matrix $G_I$, it is a linear time-invariant process. Also, the control circuit 10 does not include nonlinear time-varying processes, i.e., the circuit does not include fixed-to-rotating coordinate conversion process nor rotating-to-fixed coordinate conversion process. Hence, the entire current control system is a linear time-invariant system. Therefore, the arrangement enables control system design and system analysis using a linear control theory. Since it is now possible to design control systems which provides both rapid response and stability, it is now possible to provide stable control with rapid response. As described, use of the transfer function matrix $G_I$ represented by Equation (12) enables to replace the non-linear process in which fixed-to-rotating coordinate conversion is followed by I control and then by rotating-to-fixed coordinate conversion with a linear time-invariant multi-input multi-output system. This makes it easy to perform system analysis and control system design.

It should be noted here that variations described for the first through the third embodiments are also applicable to the present embodiment. Namely, control may be made to negative phase sequence component of the fundamental wave component in the current signals I (Iu, Iv Iw); control may be made to both positive-phase and negative-phase sequence components; or control may be made directly by using three current signals Iu, Iv, Iw. Also, the current controller 74 may provide alternative control which replaces PI control or other controls.

When a motor is driven by an inverter, harmonic components are sometimes contained in electric currents which flow through the motor. Causes of the harmonic components include dead time which is added during PWM signal generation, imbalance or offset in the current sensor, voltage swing in the DC voltage which is outputted from the DC power source, structure of the motor, etc. Harmonic component inclusion in motor driving can cause over current, operating noise, reduced performance in control, etc. Therefore, it is necessary to suppress harmonic components. Hence, as has been described for the seventh through the tenth embodiments, the control circuit 10 may include the harmonic compensation controller 9 (9') to suppress harmonic components. In this case, the rotating speed detection circuit 11 also supplies the angular frequency (c for use by the harmonic compensation controller 9 (9').

Next, methods for compensating for torque ripples will be described.

In motor torque control, quality of torque generated is an important factor. Like harmonics, torque ripples are caused by dead time which is added during PWM signal generation, imbalance or offset in the current sensor, voltage swing in the DC voltage which is outputted from the DC power source, structure of the motor, etc. As a method for removing this periodic ripples in the torque, an appropriate compensation signal (hereinafter will be called "torque ripple compensation signal") may be superimposed on an electric-current target value of each torque command for compensation for torque ripples. Generally, the torque ripple compensation signals are harmonic components of the fifth-, seventh-, eleventh-, and other orders. Therefore, harmonic compensation by the harmonic compensation controller 9 (see FIG. 16) may be replaced by control which follows the torque ripple compensation signal. Specifically, instead of inputting the alpha axis current signal Iα and the beta axis current signal Iβ to the harmonic compensation controller 9, deviations of the alpha axis current signal Iα and the beta axis current signal Iβ from their respective target values are inputted.

The fifth-order harmonic compensator 91, the seventh-order harmonic compensator 92 and the eleventh-order harmonic compensator 93 are all supplied with deviations ΔIα, ΔIβ of the alpha axis current signal Iα and the beta axis current signal Iβ from the alpha axis current target value and the beta axis current target value respectively, but each of the harmonic compensators 91, 92, 93 controls harmonic component corresponding only to their amplitude characteristic (see FIG. 7). Therefore, in the fifth-order harmonic compensator 91 for example, the fifth-order harmonic component contained in the alpha axis current signal Iα and in the beta axis current signal Iβ are controlled to follow the fifth-order harmonic component of the torque ripple compensation signal superimposed on the alpha axis current target value and beta axis current target value. Thus, the current which flows from the inverter circuit 2 to the motor M follows the current target value which is superimposed with the torque ripple compensation signal, whereby periodic ripples in the torque are removed. The same applies to cases where direct control is performed by using three current signals Iu, Iv, Iw. Namely, deviations of the current signals Iu, Iv, Iw from their respective target values are inputted to the harmonic compensation controller 9' (see FIG. 20) instead of inputting the current signals Iu, Iv, Iw.

In the first through the eleventh embodiments, description was made for cases where the inverter circuit 2 is provided by a three-phase inverter circuit and power is supplied to a three-phase electrical power system B or a three-phase AC motor. However, the present invention is not limited to these. The control circuit according to the present invention is also applicable to cases where a single-phase inverter circuit supplies power to a single-phase electrical power system or a single-phase AC motor. Hereinafter, description will cover a twelfth embodiment where the present invention is applied to a control circuit of a single-phase inverter circuit in a single-phase interconnection inverter system.

Figure 25:
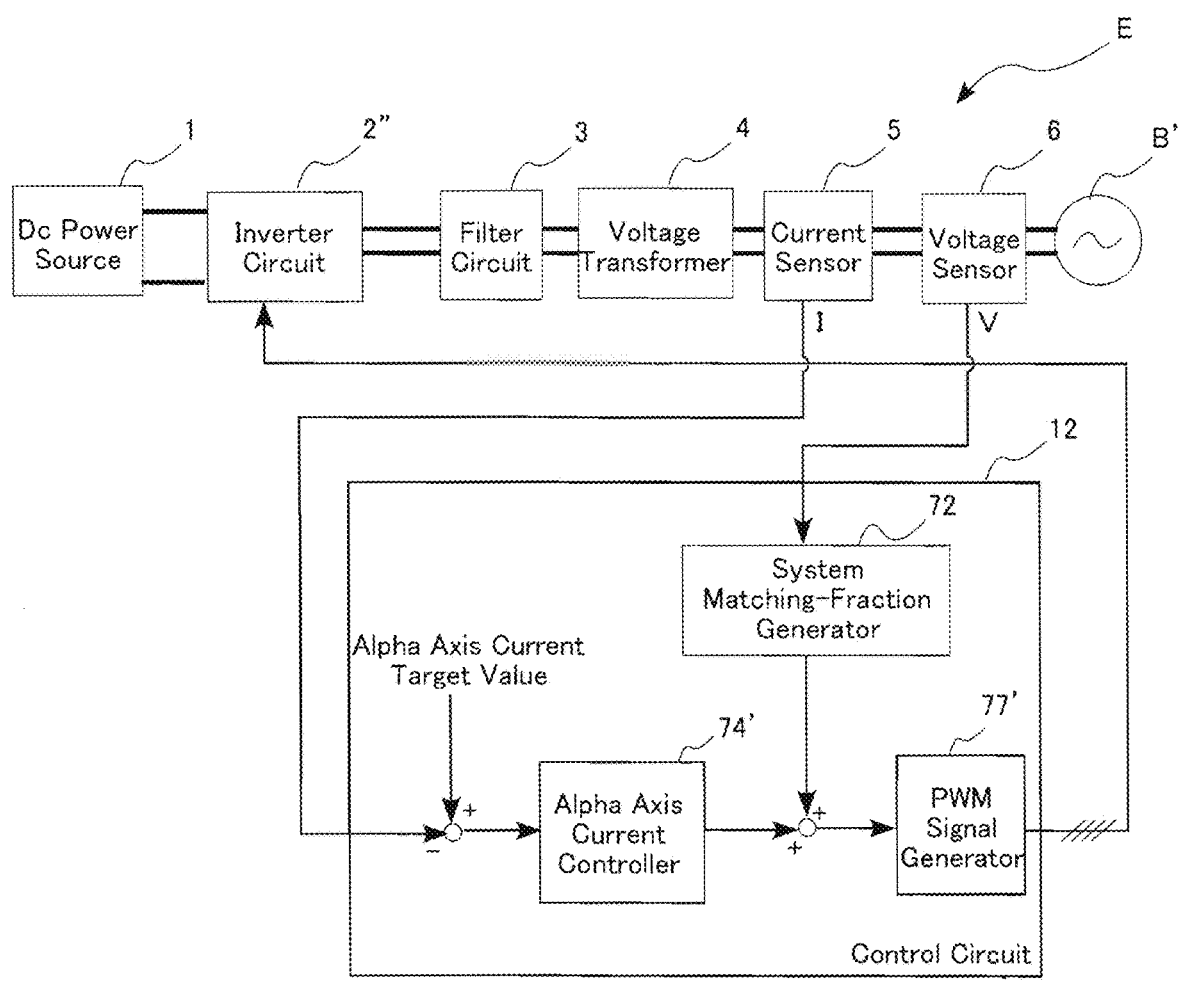
FIG. 25 is a block diagram for describing a single-phase interconnection inverter system according to a twelfth embodiment.

FIG. 25 is a block diagram for describing a single-phase interconnection inverter system according to the twelfth embodiment. In this figure, elements which are identical with or similar to those in the interconnection inverter system A (see FIG. 6) according to the first embodiment are indicated by the same reference codes.

As shown in the figure, an interconnection inverter system E includes a DC power source 1, an inverter circuit 2", a filter circuit 3, a voltage transformer circuit 4, a current sensor 5, a voltage sensor 6, and a control circuit 12. The inverter circuit 2" is a single-phase inverter provided by a PWM control inverter circuit which includes unillustrated four switching elements in two sets. The interconnection inverter system E converts DC power from the DC power source 1 into AC power, for supply to a single-phase AC electrical power system B'.

The control circuit 12 differs from the control circuit 7 (see FIG. 6) according to the first embodiment in that it does not include the three-phase to two-phase converter 73 and the two-phase to three-phase converter 76, and that it includes the alpha axis current controller 74' (see FIG. 9) according to the second embodiment in place of the current controller 74.

The alpha axis current controller 74' receives a deviation between a single-phase current signal (alpha axis current signal) detected by the single-phase current sensor 5 and its target value, i.e., an alpha axis current target value. The alpha axis current controller 74' performs a process given by a transfer function $G_I(s)$ represented by the following Equation (39), which expresses the element (1, 1) and the element (2, 2) in the matrix $G_I$ and outputs a compensation value signal X. In a single-phase system, the process needs to be performed only to the alpha axis current signal, so it is not necessary to generate a signal which has a 90-degree phase delay.

$$G_I(s) = \frac{K_I s}{s^2 + \omega_0^2} \Lambda \tag{39}$$

As has been described earlier, the alpha axis current controller 74' is designed by H∞ loop shaping method, which is a method based on linear control theory, with a frequency weight being provided by the transfer function $G_f(s)$. Since the process performed in the alpha axis current controller 74' is expressed as a transfer function $G_f(s)$, it is a linear time-invariant process. Hence, it is possible to perform control system design using a linear control theory. It should be noted here that a linear control theory other than the H∞ loop shaping method may be utilized in the design.

The system command value K from the system matching-fraction generator 72 and the correction value signal X from the alpha axis current controller 74' are added to each other, to obtain a command value signals X', which is then inputted to the PWM signal generator 77'.

The PWM signal generator 77' generates PWM signals Pp, Pn by triangle wave comparison method based on the command value signal X' inputted, a signal provided by inverting the command value signal X' and a carrier signal which is generated as a triangle-wave signal at a predetermined frequency (e.g. 4 kHz). The generated PWM signals Pp, Pn are outputted to the inverter circuit 2". The PWM signal generator 77' also outputs signals which are provided by inverting the PWM signal Pp, Pn, to the inverter circuit 2".

The present embodiment provides the same advantages as offered by the first embodiment. Also, since the control circuit 12 does not need the signal which has a 90-degree phase delay from the alpha axis current signal, there is no need for an arrangement to generate a signal which has a 90-degree phase delay. Further, since the process is performed only to the alpha axis current signal (since there is no need for processing the signal with a 90-degree phase delay) the embodiment provides a simple configuration.

Like the fourth and the fifth embodiment, the twelfth embodiment may use an arrangement to control output voltage. Also, like in the sixth embodiment, the control circuit 12 may be used for a control circuit of a converter circuit which converts a single-phase AC into DC. Also, the alpha axis current controller 74' may provide alternative control which replaces PI control or other controls. Further, the present embodiment may be applied to the eleventh embodiment, i.e. driving of AC motors for driving single-phase AC motors.

Still further, like the seventh through the tenth embodiments, the control circuit 12 may include a harmonic compensation controller for suppression of harmonic components. Hereinafter, a thirteenth embodiment will cover such a case where a harmonic compensation controller is included in the control circuit 12 of the single-phase inverter circuit 2".

The transfer function $G_f(s)$ represented by Equation (39) above is for control of fundamental wave components. The n-th harmonic is an angular frequency component obtained by multiplying the fundamental wave angular frequency by n. Therefore, a transfer function for controlling the n-th-order harmonic is given as a transfer function $G_{In}(s)$ represented by Equation (40) shown below, which is Equation (39) with the item $\omega_0$ substituted for $n \cdot \omega_0$. Equation (40) expresses the element (1, 1) and the element (2, 2) in the matrix $G_{In}$ represented by Equations (24), (24')

$$G_{In}(s) = \frac{K_I s}{s^2 + (n \cdot \omega_0)^2} \Lambda \quad (40)$$

Figure 26:
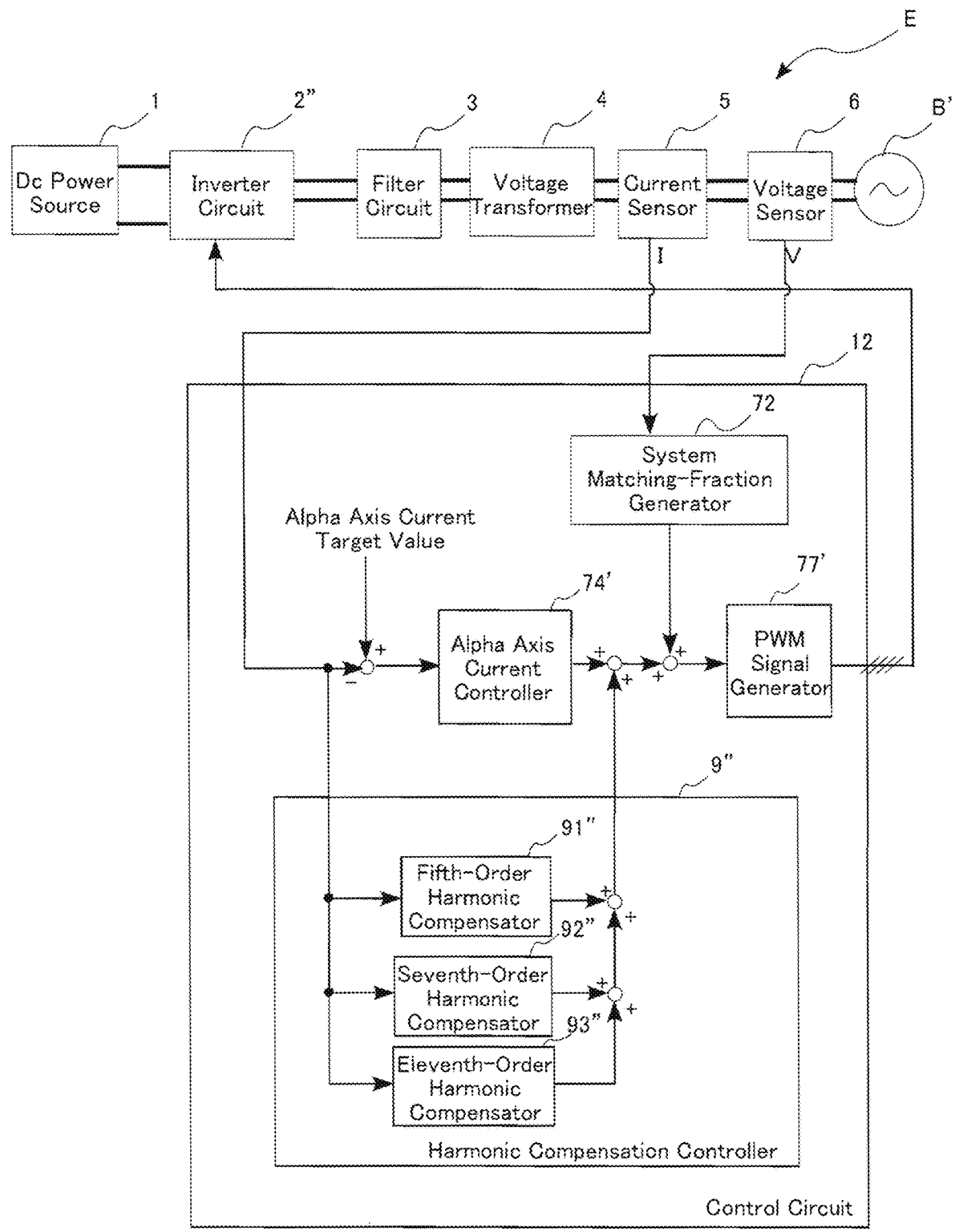
FIG. 26 is a block diagram for describing a single-phase interconnection inverter system according to a thirteenth embodiment.

FIG. 26 is a block diagram for describing an interconnection inverter system according to a thirteenth embodiment. In this figure, elements which are identical with or similar to those in the control circuit 12 in FIG. 25 are indicated by the same reference codes. FIG. 26 shows a control circuit 12, which is the control circuit 12 (see FIG. 25) according to the twelfth embodiment further including a harmonic compensation controller 9".

The harmonic compensation controller 9" receives a current signal I detected by the current sensor 5, and generates a harmonic compensation signal Y for the harmonic suppression control. The harmonic compensation controller 9" includes a fifth-order harmonic compensator 91" for suppressing the fifth-order harmonic, a seventh-order harmonic compensator 92" for suppressing the seventh-order harmonic and an eleventh-order harmonic compensator 93" for suppressing the eleventh-order harmonic.

The fifth-order harmonic compensator 91" works for suppressing the fifth-order harmonic. The fifth-order harmonic compensator 91" performs a process given by a transfer function $G_{I5}(s)$, which is the transfer function $G_{In}(s)$ expressed by Equation (40) with n=5 for the control of the fifth-order harmonic. In other words, the fifth-order harmonic compensator 91" performs a process represented by the following Equation (41), to output fifth-order harmonic compensation signal $Y_5$. As for the angular frequency $\omega_0$, a predetermined value is set as an angular frequency (for example, $\omega_0 = 120\pi$ [rad/sec](60 [Hz])) for the system voltage fundamental wave, and the integral gain $K_{I5}$ is a pre-designed value. Also, the fifth-order harmonic compensator 91" performs a stability margin maximization process, which includes phase adjustment to correct a phase delay in the control loop for reversing the phase. The current signal I represents the "input signal" according to the present invention whereas the fifth-order harmonic compensation signal Y5 represents the "output signal" according to the present invention.

$$Y_5 = G_{I5}(s)I = \frac{K_{I5} s}{s^2 + 25\omega_0^2} I \Lambda \quad (41)$$

In the present embodiment, the fifth-order harmonic compensator 91" is designed by H loop shaping method, which is a method based on a linear control theory, with a frequency weight being provided by the matrix $G_{I5}(s)$ of the transfer function. The process performed in the fifth-order harmonic compensator 91" is expressed as the matrix $G_{I5}(s)$ of the transfer function, and therefore is a linear time-invariant process. Hence, it is possible to perform control system design using a linear control theory.

It should be noted here that design method to be used in designing the control system is not limited to this. In other words, other linear control theories may be employed for the design. Examples of usable methods include loop shaping method, optimum control, HO control, mixed sensitivity problem, and more. Also, there may be an arrangement that a phase $\theta_5$ is calculated and set in advance for adjustment based on the phase delay. For example, if the target of control has a 90-degree phase delay, a 180-degree phase delay may be designed by a setting of $\theta_5 = -90$ degrees.

The seventh-order harmonic compensator 92" works for suppressing the seventh-order harmonic. The seventh-order harmonic compensator 92" performs a process expressed by a transfer function $G_{I7}(s)$, which is the transfer function $G_{In}(s)$ represented by Equation (40) with n=7 for the control of the seventh-order harmonic. In other words, the seventh-order harmonic compensator 92" performs a process represented by Equation (42) shown below, to output seventh-order harmonic compensation signal $Y_7$. As for the angular frequency $\omega_0$, a predetermined value is set as an angular frequency for the system voltage fundamental wave, and the integral gain $K_{I7}$ is a pre-designed value. Also, the seventh-order harmonic compensator 92" performs a stability margin maximization process, which includes phase adjustment to correct a phase delay in the control loop for reversing the phase. The seventh-order harmonic compensator 92" is also designed by the same method as is the fifth-order harmonic compensator 91".

$$Y_7 = G_{I7}(s)I = \frac{K_{I7}s}{s^2 + 49\omega_0^2} I\Lambda \qquad (42)$$

The eleventh-order harmonic compensator 93" works for suppressing the eleventh-order harmonic. The eleventh-order harmonic compensator 93" performs a process expressed by a transfer function $G_{I11}(s)$, which is the transfer function $G_{In}(s)$ represented by Equation (40) with n=11 for the control of the eleventh-order harmonic. In other words, the eleventh-order harmonic compensator 93" performs a process represented by Equation (43) shown below, to output eleventh-order harmonic compensation signal $Y_{11}$. As for the angular frequency $\omega_0$, a predetermined value is set as an angular frequency for the system voltage fundamental wave, and the integral gain $K_{I11}$ is a pre-designed value. Also, the eleventh-order harmonic compensator 93" performs a stability margin maximization process, which includes phase adjustment to correct a phase delay in the control loop for reversing the phase. The eleventh-order harmonic compensator 93" is designed by the same method as is the fifth-order harmonic compensator 91".

$$Y_{11} = G_{I11}(s)I = \frac{K_{I11}s}{s^2 + 121\omega_0^2} I\Lambda \qquad (43)$$

The fifth-order harmonic compensation signal $Y_5$ outputted by the fifth-order harmonic compensator 91", the seventh-order harmonic compensation signal $Y_7$ outputted by the seventh-order harmonic compensator 92" and the eleventh-order harmonic compensation signal $Y_{11}$ outputted by the eleventh-order harmonic compensator 93" are added together, and a resulting harmonic compensation signal Y is outputted from the harmonic compensation controller 9". It should be noted here that in the present embodiment, description was made for a case where the harmonic compensation controller 9" includes the fifth-order harmonic compensator 91", the seventh-order harmonic compensator 92" and the eleventh-order harmonic compensator 93". However, the present invention is not limited to this. The harmonic compensation controller 9" is designed in accordance with the orders of harmonics which must be suppressed. For example, if the fifth-order harmonic is the only target of suppression, then only the fifth-order harmonic compensator 91" may be included. Likewise, if it is desired to suppress the thirteenth-order harmonic, then a thirteenth-order harmonic compensator should be added for a process expressed in a matrix $G_{I13}$, which is the transfer function matrix $G_{In}(s)$ represented by Equation (16), with n=13.

The harmonic compensation signal Y outputted from the harmonic compensation controller 9" is added to a correction value signal X outputted from the current controller 74'. After the addition of the compensation signal Y, a system command value K from the system matching-fraction generator 72 is added to the correction value signal X, to obtain a command value signal X', which is then inputted to the PWM signal generator 77'.

The present embodiment provides the same advantages as offered by the twelfth embodiment. Also, as has been described earlier, the transfer function $G_{I5}$ (s) is a transfer function which shows a process equivalent to carrying out fixed-to-rotating coordinate conversion, I control and then rotating-to-fixed coordinate conversion. The process performed in the fifth-order harmonic compensator 91" is expressed as the transfer function matrix $G_{I5}(s)$, and therefore is a linear time-invariant process. Also, the fifth-order harmonic compensation does not include nonlinear time-varying processes, i.e., the circuit does not include fixed-to-rotating coordinate conversion process nor rotating-to-fixed coordinate conversion process. Hence, the entire control loop is a linear time-invariant system. Therefore, the arrangement enables control system design and system analysis using a linear control theory. As described, use of the transfer function $G_{I5}(s)$ enables to replace the non-linear process in which fixed-to-rotating coordinate conversion is followed by I control and then by rotating-to-fixed coordinate conversion with a linear time-invariant multi-input multi-output system. This makes it easy to perform system analysis and control system design.

The same applies to the seventh-order harmonic compensator 92" and the eleventh-order harmonic compensator 93". In other words, the processes performed in the seventh-order harmonic compensator 92" and in the eleventh-order harmonic compensator 93" are also linear time-invariant processes, and therefore it is possible to design control systems and perform system analyses using linear control theories.

In the present embodiment, description was made for a case where the fifth-order harmonic compensator 91", the seventh-order harmonic compensator 92" and the eleventh-order harmonic compensator 93" are designed individually from each other. However, the present invention is not limited to this. The fifth-order harmonic compensator 91", the seventh-order harmonic compensator 92" and the eleventh-order harmonic compensator 93" may be designed all in one, with a common integral gain.

In the present embodiment, description was made for cases where the fifth-order harmonic compensator 91", the seventh-order harmonic compensator 92" and the eleventh-order harmonic compensator 93" perform a control which replaces I control. However, the present invention is not limited by this. For example, alternative control which replaces PI control may be provided. If the fifth-order harmonic compensator 91", the seventh-order harmonic compensator 92" and the eleventh-order harmonic compensator 93" in the present embodiment are to provide an alternative control which replaces PI control, it can be accomplished by using a transfer function $G_{PIn}(s)$ represented by Equation (44) shown below which is the transfer function $G_{PI}(s)$ of the element (1, 1) of the transfer function matrix $G_{PI}$ expressed by the Equation (11), with $\omega_0$ substituted for n·$\omega_0$. Equation (44) provides the element (1, 1) and the element (2, 2) of the matrix $G_{PIn}$ represented by Equations (35), (35').

$$G_{PIn}(s) = \frac{K_P s^2 + K_I s + K_P n^2 \omega_0^2}{s^2 + n^2 \omega_0^2} \Lambda \qquad (44)$$

If the fifth-order harmonic compensator 91" is to provide alternative control which replaces PI control, it can be accomplished by using a transfer function $G_{PI5}(s)$ expressed by Equation (44) with n=5. If the seventh-order harmonic compensator 92" is to provide alternative control which replaces PI control, it can be accomplished by using a transfer function $G_{PI7}(s)$ expressed by Equation (44) with n=7. If the eleventh-order harmonic compensator 93" is to provide alternative control which replaces PI control, it can be accomplished by using a transfer function $G_{PI11}(s)$ expressed by Equation (44) with n=11.

Alternatively, the fifth-order harmonic compensator 91", the seventh-order harmonic compensator 92" and the eleventh-order harmonic compensator 93" may perform an alternative control which replaces the above-described alternative controls to the I or PI control. By substituting the transfer function F(s) in the transfer function $G_n(s)$ expressed as Equation (45) shown below (which is the transfer function of the element (1, 1) and the element (2, 2) in the matrix $G_n$ represented by the Equations (23), (23')) for the transfer function which gives the alternative control, it becomes possible to calculate a transfer function which represents a process equivalent to carrying out fixed-to-rotating coordinate conversion, then the alternative control and then rotating-to-fixed coordinate conversion.

$$G_n(s) = \frac{F(s + jn\omega_0) + F(s - jn\omega_0)}{2} \Lambda \qquad (45)$$

Like the tenth embodiment, the present embodiment may include a divergence preventer. Also, like the fourth and the fifth embodiments, the output voltage may be controlled. Also, like in the sixth embodiment, the control circuit 12 may be used for a control circuit of a converter circuit which converts a single-phase AC into DC. Further, the present embodiment may be applied to driving of AC motors as in the eleventh embodiment, for driving single-phase AC motors.

Further, the arrangements in the first, the second, the fourth through the eighth, and the eleventh embodiment can also be used to handle single-phase applications if their respective control circuits 7 (7', 8, 8', 10) have their three-phase to two-phase converter 61 replaced with an arrangement for delaying the phase. Hereinafter, a fourteenth embodiment will cover such a case where a single-phase inverter circuit is controlled with the use of a signal which is generated from a current signal from the current sensor by delaying the phase by π/2 (90 degrees).

Figure 27:
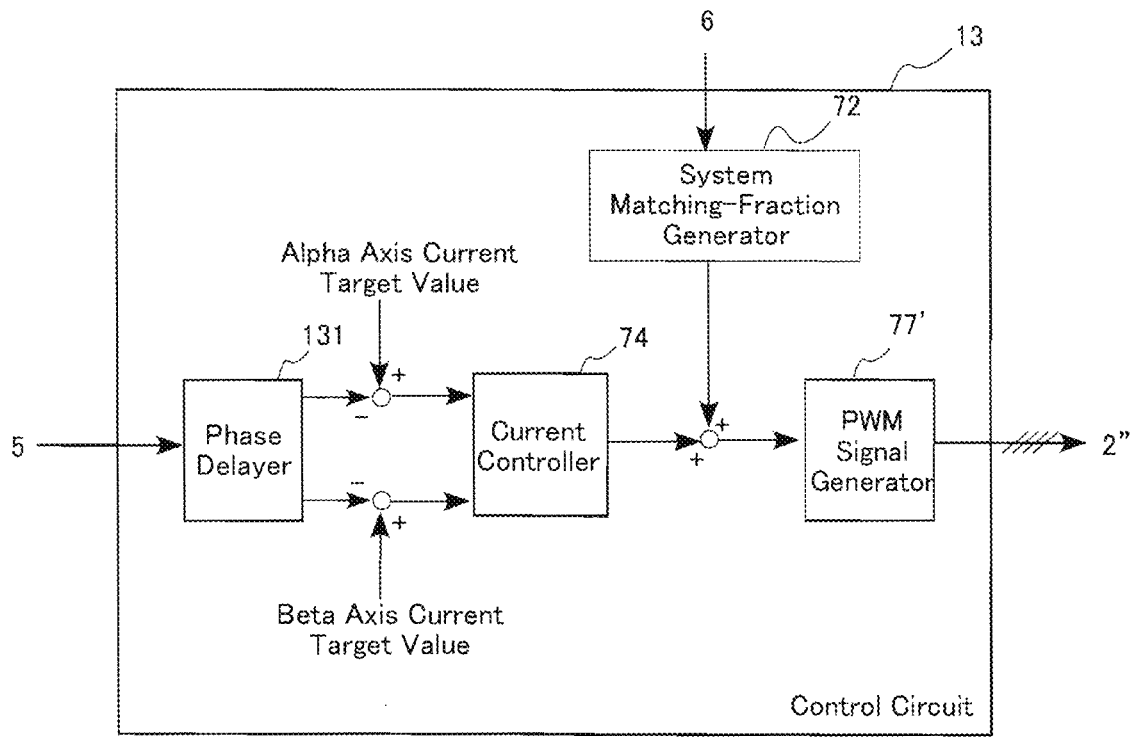
FIG. 27 is a block diagram for describing a control circuit according to a fourteenth embodiment.

FIG. 27 is a block diagram for describing a control circuit according to the fourteenth embodiment. In this figure, elements which are identical with or similar to those in the control circuit 7 (see FIG. 6) according to the first embodiment are indicated by the same reference codes.

FIG. 27 shows a control circuit 13 which controls a single-phase inverter circuit 2" (see FIG. 25). The control circuit 13 receives a single-phase current signal detected by the current sensor 5, generates a PWM signal, and output the PWM signal to the inverter circuit 2". The control circuit 13 differs from the control circuit 7 (see FIG. 6) according to the first embodiment in that it does not include the three-phase to two-phase converter 73 and the two-phase to three-phase converter 76, but includes a phase delayer 131.

The phase delayer 131 receives a single-phase current signal detected by the current sensor 5, and outputs this current signal (alpha axis current signal Iα) and a beta axis current signal Iβ which is made by delaying the phase of the alpha axis current signal Iα by π/2. The phase delayer 131 performs a Hilbert transformation in which the phase of the inputted signal is delayed by π/2. The ideal Hilbert transformation is given by a transfer function H(ω) represented by Equation (46) shown below. In this Equation, $\omega_S$ is the angular frequency whereas j is the imaginary unit. In other words, the Hilbert transformation is a filtering process in which the amplitude characteristic is kept constant regardless of the frequency, and the phase characteristic is delayed by π/2 in the positive and the negative frequency regions. Since it is impossible to implement the ideal Hilbert transformation, it is approximately implemented as an FIR (Finite impulse response) filter for example.

$$H(\omega) = \begin{cases} -j, & 0 < \omega < \omega_s/2 \\ +j, & -\omega_s/2 < \omega < 0 \end{cases} \Lambda \qquad (46)$$

The phase delayer 131 is not limited to the above, and may be implemented by any other arrangement as long as the arrangement is capable of generating a signal with a π/2 phase delay. This can be implemented, for example, by a complex coefficient filter disclosed in Japanese Patent Application No. 2011-231445 which was filed by the applicant of the present invention. Another alternative is to use a fundamental wave positive phase sequence component extractor F12 which is related to a seventeenth embodiment to be described later.

The current controller 74 receives deviations ΔIα, ΔIβ of the alpha axis current signal Iα (single-phase current signal detected by the current sensor 5) and the beta axis current signal Iβ (the signal made by delaying the phase of the alpha axis current signal Iα by π/2) outputted by the phase delayer 131 from their respective target values, and performs a process represented by Equation (13), to generate correction value signals Xα, Xβ for current control. The system command value K from the system matching-fraction generator 72 and the correction value signal Xα (or the correction value signal Xβ) from the current controller 74 are added together, to obtain a command value signals X', which is then inputted to the PWM signal generator 77'. An alternative procedure may be that a deviation ΔIα of the alpha axis current signal Iα from the alpha axis current target value is calculated first, and this deviation signal is inputted to the phase delayer 131 to generate a signal which has a π/2 phase delay, and these are inputted to the current controller 74.

In the present embodiment, the phase of a single-phase current signal (alpha axis current signal Iα) is delayed by π/2 whereby a beta axis current signal Iβ is generated instead of performing three-phase two-phase conversion to a three-phase current signal in order to generate the alpha axis current signal Iα and the beta axis current signal Iβ. In this way, it is possible to apply the three-phase current control process according to the first embodiment. The present embodiment provides the same advantages as offered by the first embodiment.

It should be noted here that both positive-phase and negative-phase sequence components may be controlled also in the fourteenth embodiment like in the second embodiment. Further, like in the fourth and the fifth embodiments, output voltage may be controlled. Also, like in the sixth embodiment, the control circuit 13 may be used for a control circuit of a converter circuit which converts single-phase AC into DC. Still further, the current controller 74 may provide alternative control which replaces PI control or other controls. Further, the present embodiment may be applied to driving of AC motors as in the eleventh embodiment for driving single-phase AC motors. Still further, like in the seventh through the tenth embodiments, the control circuit 12 may include a harmonic compensation controller for suppression of harmonic components.

In the first through the thirteenth embodiments, description was made for cases where the signal processor according to the present invention is used as a controller of a control circuit. However, the present invention is not limited to this. For example, the signal processor according to the present invention may also be used as a filter.

Figure 28:
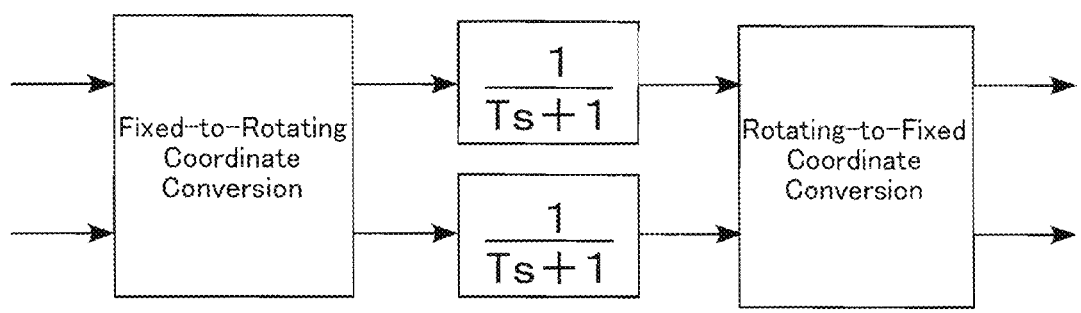
FIG. 28 is a block diagram of a process in which fixed-to-rotating coordinate conversion is followed by low-pass filter process and then by rotating-to-fixed coordinate conversion.

A transfer function of a low-pass filter can be expressed as F(s)=1/(Ts+1), where T represents time constant. Therefore, a transfer function matrix $G_{LPF}$ which gives a process equivalent to a process in FIG. 28, i.e., the process in which fixed-to-rotating coordinate conversion is followed by low-pass filtering process, and then by rotating-to-fixed coordinate conversion, will be calculated as Equation (47) shown below, by using Equation (10):

$$G_{LPF} = \begin{bmatrix} \cos\theta & \sin\theta \\ -\sin\theta & \cos\theta \end{bmatrix} \begin{bmatrix} \frac{1}{Ts+1} & 0 \\ 0 & \frac{1}{Ts+1} \end{bmatrix} \begin{bmatrix} \cos\theta & -\sin\theta \\ \sin\theta & \cos\theta \end{bmatrix} \quad (47)$$

$$\begin{bmatrix} \frac{1}{2}\left(\frac{1}{T(s+j\omega_0)+1} + \frac{1}{T(s-j\omega_0)+1}\right) & \frac{1}{2j}\left(\frac{1}{T(s+j\omega_0)+1} - \frac{1}{T(s-j\omega_0)+1}\right) \\ -\frac{1}{2j}\left(\frac{1}{T(s+j\omega_0)+1} - \frac{1}{T(s-j\omega_0)+1}\right) & \frac{1}{2}\left(\frac{1}{T(s+j\omega_0)+1} + \frac{1}{T(s-j\omega_0)+1}\right) \end{bmatrix} =$$

$$\begin{bmatrix} \frac{Ts+1}{(Ts+1)^2+(T\omega_0)^2} & \frac{-T\omega_0}{(Ts+1)^2+(T\omega_0)^2} \\ -\frac{T\omega_0}{(Ts+1)^2+(T\omega_0)^2} & \frac{Ts+1}{(Ts+1)^2+(T\omega_0)^2} \end{bmatrix} \Lambda$$

Figure 29:
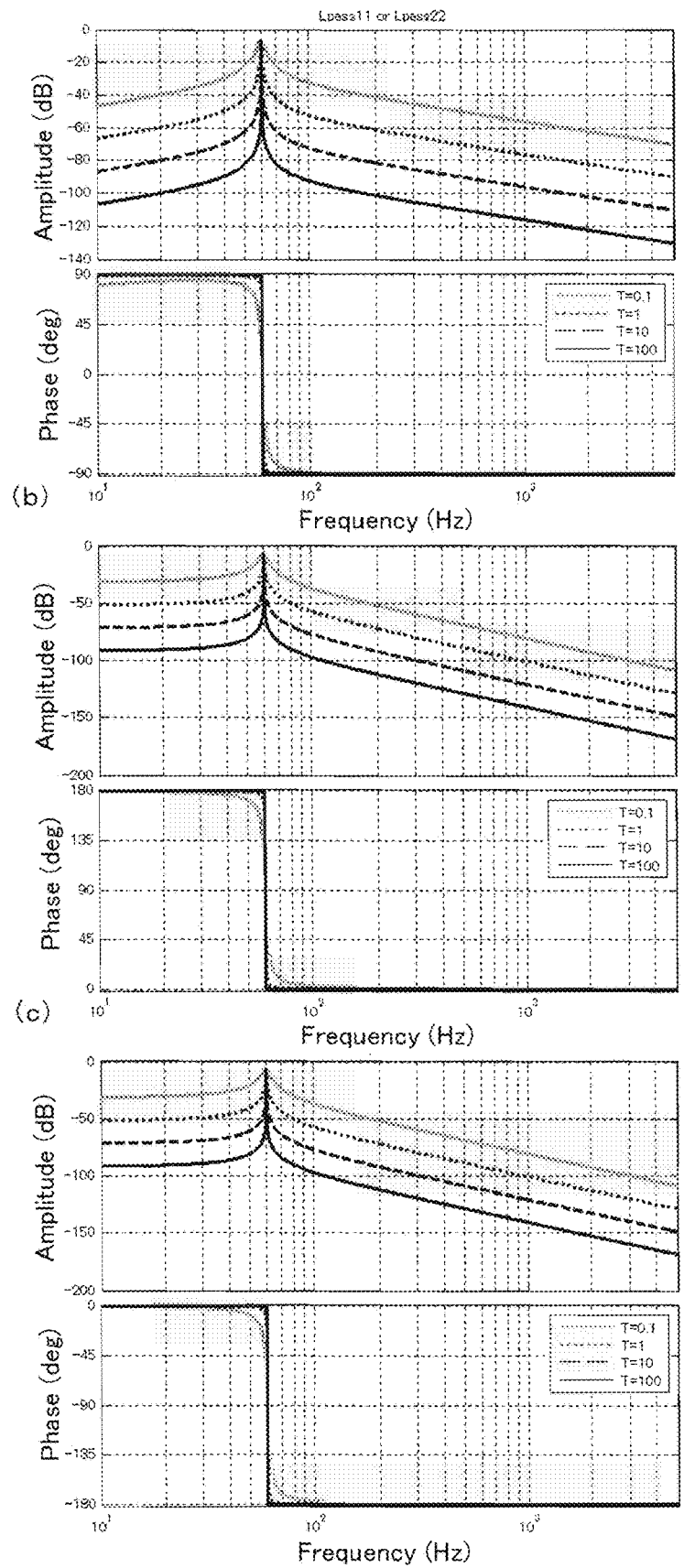
FIG. 29 is a Bode diagram for analyzing transfer functions as elements of a matrix $G_{LPF}$.

FIG. 29 is a Bode diagram for analyzing transfer functions as elements of the matrix $G_{LPF}$. FIG. 29(a) shows transfer functions of the element (1, 1) and the element (2, 2) of the matrix $G_{PLF}$ whereas FIG. 29(b) shows a transfer function of the element (1, 2) of the matrix $G_{PLF}$, and FIG. 29(c) shows a transfer function of the element (2, 1) of the matrix $G_{PLF}$. FIG. 29 shows a case where the center frequency is 60 Hz, and the time constant T is set to "0.1", "1", "10" and "100".

All amplitude characteristics in FIGS. 29 (a), (b) and (c) show a peak at the center frequency, and a pass band which decreases as the time constant T increases. The amplitude characteristic has a peak at −6 dB (=½). FIG. 29(b) shows a phase characteristic, which attains 0 degrees at the center frequency. In other words, the transfer functions of the element (1, 1) and the element (2, 2) of the matrix $G_{LPF}$ allow signals of the center frequency to pass through without changing the phase. FIG. 29(b) shows a phase characteristic, which attains 90 degrees at the center frequency. In other words, the transfer function of the element (1, 2) of the matrix $G_{LPF}$ allows signals of the center frequency to pass through with a 90-degree phase advance. On the other hand, FIG. 29(c) shows a phase characteristic, which attains −90 degrees at the center frequency. In other words, the transfer functions for the element (2, 1) of the matrix $G_{LPF}$ allows signals of the center frequency to pass through with a 90-degree phase delay. Hereinafter, discussion will be made for a process shown in the transfer function matrix $G_{LPF}$ performed to the alpha axis current signal Iα and the beta axis current signal Iβ (see the vector α and the vector β in FIG. 8) after the three-phase to two-phase conversion.

FIG. 8(a) shows a positive phase sequence component signal of a fundamental wave component. The positive phase sequence component in the fundamental wave component of the alpha axis current signal Iα has a 90-degree phase advance over the positive phase sequence component in the fundamental wave component of the beta axis current signal Iβ. Performing the process represented by the transfer function of the element (1, 1) of the matrix $G_{LPF}$ to the alpha axis current signal Iα halves the amplitude of the positive phase sequence component in the fundamental wave component and does not change the phase (see FIG. 29(a)). Performing the process represented by the transfer function of the element (1, 2) in the matrix $G_{LPF}$ to the beta axis current signal Iβ halves the amplitude of the positive phase sequence component in the fundamental wave component and advances the phase by 90 degrees (see FIG. 29(b)). Therefore, adding the two will extract the positive phase sequence component of the fundamental wave component in the alpha axis current signal Iα. On the other hand, performing the process represented by the transfer function of the element (2, 1) in the matrix $G_{LPF}$ to the alpha axis current signal Iα halves the amplitude of the positive phase sequence component in the fundamental wave component and delays the phase by 90 degrees (see FIG. 29(c)). Performing the process represented by the transfer function of the element (2, 2) in the matrix $G_{LPF}$ to the beta axis current signal Iβ halves the amplitude of the positive phase sequence component in the fundamental wave component and does not change the phase. Therefore, adding the two will extract the positive phase sequence component of the fundamental wave component in the beta axis current signal Iβ. In other words, the process shown in the transfer function matrix $G_{LPF}$ is a process to extract the positive phase sequence component of the fundamental wave component from the alpha axis current signal Iα and the beta axis current signal Iβ.

FIG. 8(b) shows a negative phase sequence component signal of a fundamental wave component. The negative phase sequence component in the fundamental wave component of the alpha axis current signal Iα has a 90-degree phase delay from the negative phase sequence component in the fundamental wave component of the beta axis current signal Iβ. Performing the process represented by the transfer function of the element (1, 2) of the matrix $G_{LPF}$ to the beta axis current signal Iβ advances the phase of the negative phase sequence component in the fundamental wave component. The advanced phase is now opposite to the phase of the negative phase component in the fundamental wave component of the alpha axis current signal Iα, so they cancel each other. Performing the process represented by the transfer function of the element (1, 2) of the matrix $G_{LPF}$ to the alpha axis current signal Iα delays the phase of the negative-phase sequence component in the fundamental wave component. The delayed phase is now opposite to the phase of the negative phase component in the fundamental wave component of the alpha axis current signal Iα, so they cancel each other. Therefore, the process shown in the transfer function matrix $G_{LPF}$ is a process to suppress the negative phase sequence component in the fundamental wave component. Also, components other than the fundamental wave components are attenuated from the level of the fundamental wave component. Therefore, it is clear that the process shown in the transfer function matrix $G_{LPF}$ is a band-pass filtering process which extracts only positive phase sequence component in the fundamental wave component. In other words, the matrix transfer function $G_{LPF}$ can be used as a band-pass filter for extracting only positive phase sequence component in the fundamental wave component.

If the negative phase sequence component in the fundamental wave component is to be extracted rather than the positive phase sequence component, it can be achieved by using the transfer function matrix $G_{LPF}$ in which the element (1, 2) and the element (2, 1) are swapped each other. If both of the positive-phase and the negative-phase sequence components in the fundamental wave component are to be extracted, it can be achieved by using a matrix in which "0" is given to the element (1, 2) and the element (2, 1) in the transfer function matrix $G_{LPF}$.

Hereinafter, description will cover a fifteenth embodiment of the present invention, as a case where a signal processor which performs the process given by the transfer function matrix $G_{LPF}$ expressed by Equation (47) is used as a band-pass filter in a phase detector.

Figure 30:
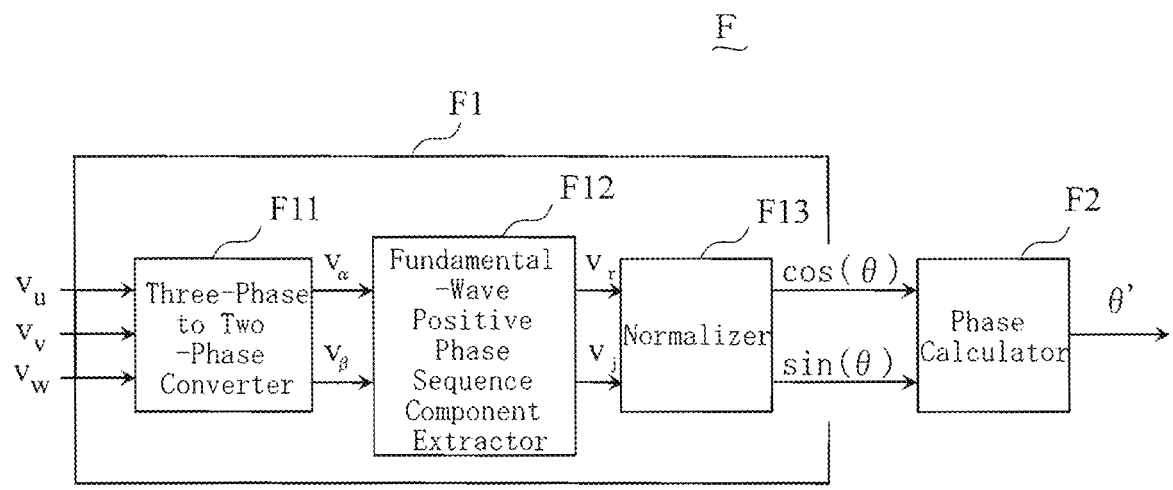
FIG. 30 is a diagram showing a block configuration example of a phase detector according to a fifteenth embodiment.

FIG. 30 shows a block configuration of the phase detector according to the fifteenth embodiment.

The phase detector F in FIG. 30 detects a phase of a system voltage in an electrical power system for example, and includes a fundamental wave orthogonal component calculator F1 and a phase calculator F2. The fundamental wave orthogonal component calculator F1 removes unbalanced components (negative phase sequence component in the fundamental wave component) and harmonic components from detected three-phase voltage signals Vu, Vv, Vw of an electrical power system, and calculates a fundamental wave component (sine wave signal) of the normalized voltage signal, and a signal (cosine wave signal) perpendicular to the fundamental wave component. The phase calculator F2 receives the sine wave signal (momentary value) and the cosine wave signal (momentary value) from the fundamental wave orthogonal component calculator F1 as well as a phase which is outputted from the phase detector F, to perform a PLL operation to output a phase (θ) of the voltage signal in the electrical power system.

The fundamental wave orthogonal component calculator F1 includes: a three-phase to two-phase converter F11 which converts three-phase voltage signals Vu, Vv, Vw (momentary values inputted at a predetermined sampling interval) from an unillustrated voltage sensor into mutually perpendicular two-phase (α phase and β phase) alpha axis voltage signal Vα and beta axis voltage signal Vβ; a fundamental-wave positive phase sequence component extractor F12 which removes unbalanced components and harmonic components contained in the alpha axis voltage signal Vα and the beta axis voltage signal Vβ outputted from the three-phase to two-phase converter F11 thereby extracting the fundamental wave component; and a normalizer F13 which normalizes voltage signals Vr, Vj outputted from the fundamental wave positive phase sequence component extractor F12. It should be noted here that the normalizer F13 can be eliminated if appropriate gain adjustment is made to the fundamental wave positive phase sequence component extractor F12.

The three-phase to two-phase converter F11 is identical with the three-phase to two-phase converter 83 (see FIG. 13) Generally, the three-phase voltage signals Vu, Vv, Vw are unbalanced three-phase signals which contain unbalanced components and odd-order harmonic components such as fifth-order, seventh-order and eleventh-order harmonics c, in addition to the positive phase sequence component of the fundamental wave component. Therefore, the alpha axis voltage signal Vα and the beta axis voltage signal Vβ outputted from the three-phase to two-phase converter F11 also contain these components.

The fundamental-wave positive phase sequence component extractor F12 extracts voltage signals Vr, Vj which are the positive phase sequence components of the fundamental wave component, from the alpha axis voltage signal Vα and the beta axis voltage signal Vβ inputted from the three-phase to two-phase converter F11, by performing a process given by the transfer function matrix $G_{LPF}$ represented by Equation (47). By processing the alpha axis voltage signal Vα and the beta axis voltage signal Vβ by fixed-to-rotating coordinate conversion based on the phase θ of the system voltage fundamental wave, the positive phase sequence component in the fundamental wave component is converted into a DC component. The signals after the fixed-to-rotating coordinate conversion are then processed with a low-pass filter which allows only the DC component to pass through while blocking AC components. As a result, only the positive phase sequence component in the fundamental wave component which was converted into DC is extracted. The extracted DC component is subjected to rotating-to-fixed coordinate conversion, whereby the DC component is brought back to the positive phase sequence component of the fundamental wave component. In this way, the positive phase sequence component of the fundamental wave component, i.e., the voltage signals Vr, Vj are extracted. The fundamental-wave positive phase sequence component extractor F12 performs a process which is equivalent to the above-described processes, as a linear time-invariant process.

The fundamental-wave positive phase sequence component extractor F12 performs a process represented by Equation (48) shown below. As for the angular frequency $\omega_0$, a predetermined value is set as an angular frequency ωs=120π [rad/sec] correspondingly to the system frequency fs=60 Hz, and the time constant T is a pre-designed value.

$$\begin{bmatrix} Vr \\ Vj \end{bmatrix} = \quad (48)$$

$$G_{LPF} \begin{bmatrix} V\alpha \\ V\beta \end{bmatrix} = \begin{bmatrix} \dfrac{Ts+1}{(Ts+1)^2 + (T\omega_0)^2} & \dfrac{-T\omega_0}{(Ts+1)^2 + (T\omega_0)^2} \\ \dfrac{T\omega_0}{(Ts+1)^2 + (T\omega_0)^2} & \dfrac{Ts+1}{(Ts+1)^2 + (T\omega_0)^2} \end{bmatrix} \begin{bmatrix} V\alpha \\ V\beta \end{bmatrix} \wedge$$

It should be noted here that the angular frequency $\omega_0$ used in the fundamental-wave positive phase sequence component extractor F12 need not necessarily be pre-designed. If the signal process makes signal sampling at a fixed interval, then a system frequency fs may be detected by, e.g., a frequency detector so that the angular frequency $\omega_0$ is calculated from the detected frequency.

The normalizer F13 performs an arithmetic process of normalizing the level of voltage signals Vr, Vj which are outputted from the fundamental-wave positive phase sequence component extractor F12 to "1". Since the voltage signals Vr, Vj outputted from the fundamental-wave positive phase sequence component extractor F12 are a sine wave signal and a cosine wave signal having the same amplitude, the amplitude is obtained by calculating $\sqrt{(Vr^2+Vj^2)}$. Therefore, the normalizer F13 performs processes $Vr/\sqrt{(Vr2+Vj2)}$ and $Vj/\sqrt{(Vr2+Vj2)}$ to the voltage signals Vr, Vj respectively, thereby normalizing the signals, and then outputs normalized signals represented by a voltage signal $Vr'=\cos(\theta)$ ($\theta=\omega \cdot t$) and a voltage signal $Vj'=\sin(\theta)$.

The phase calculator F2 receives the normalized voltage signals Vr', Vj' from the fundamental wave the orthogonal component calculator F1 and a phase $\theta'$(hereinafter will be called "output phase $\theta'$") from the phase calculator F2, calculates a phase difference $\Delta\theta(=\theta-\theta')$ between the phase $\theta$ (hereinafter will be called "input phase $\theta$") of the voltage signals Vr', Vj' and the output phase $\theta'$, updates the output phase $\theta'$ based on the phase difference $\Delta\theta$, and thereby converges the output phase $\theta'$ on the input phase $\theta$. However, the configuration of the phase calculator F2 is not limited to the one described above. For example, the phase difference may be calculated by a different method.

As understood from the above, according to the phase detector F in the present embodiment, the fundamental-wave positive phase sequence component extractor F12 extracts the positive phase sequence component of the fundamental wave component, removes the other components (unbalanced component and harmonic components of the predetermined order(s)) and thereafter calculates the phase difference $\Delta\theta$. Therefore, the phase detector F can detect the phase quickly and accurately while reducing influence of unbalanced components and harmonic components. Also, the phase detector F provides another advantage that there is no phase difference between the input to and the output from the fundamental-wave positive phase sequence component extractor F12. Further, since the phase detector also reduces noise frequency components added through the voltage sensor for example, there is no need for providing a filter.

As has been described earlier, the transfer function matrix $G_{LPF}$ is a transfer function matrix which represents a process equivalent to carrying out fixed-to-rotating coordinate conversion, low-pass filter process and then rotating-to-fixed coordinate conversion. The process performed in the fundamental-wave positive phase sequence component extractor F12 is expressed as the matrix $G_{LPF}$ of the transfer function, and therefore is a linear time-invariant process. Therefore, the arrangement enables control system design and system analysis using a linear control theory.

In the fifteenth embodiment, description was made for a case where a signal processor according to the present invention is used as a band-pass filter incorporated in a phase detector. However the present invention is not limited to this. The signal processor according to the present invention can also be used as a band-pass filter which exclusively extract positive phase sequence component or negative phase sequence component from a signal of a specific frequency. Also, the signal processor according to the present invention can be used as a band-pass filter which extracts both positive-phase and negative-phase sequence components from a signal of a specific frequency.

In the fifteenth embodiment, description was made for a case where the fundamental-wave positive phase sequence component extractor F12 performs alternative process which replaces a low-pass filter, thereby extracting positive phase sequence component of the fundamental wave component. However, the present invention is not limited to this. If unbalanced components or harmonic components as targets of suppression are known, those components may be suppressed so as to extract the positive phase sequence component of the fundamental wave component. In this case, the signal processor may be designed to provide a process which replaces a high-pass filter, so that the signal processor can be used as a notch filter. Hereinafter, description will cover a sixteenth embodiment, where the fundamental-wave positive phase sequence component extractor F12 performs a process which replaces a high-pass filter, to extract a fundamental wave component.

Figure 31:
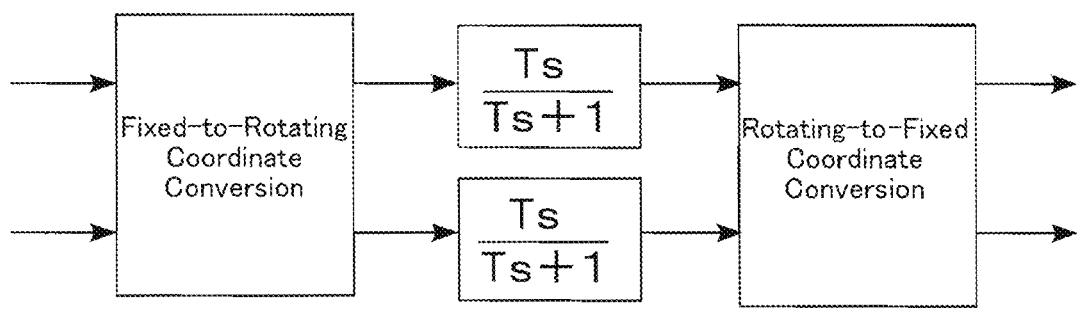
FIG. 31 is a block diagram of a process in which fixed-to-rotating coordinate conversion is followed by a high-pass filtering process and then by rotating-to-fixed coordinate conversion.

A transfer function of a high-pass filter can be expressed as $F(s)=Ts/(Ts+1)$, where T represents time constant. Therefore, a transfer function matrix $G_{HPF}$ which represents a process equivalent to the process in FIG. 31, in which fixed-to-rotating coordinate conversion is followed by a high-pass filter process, and then followed by a rotating-to-fixed coordinate conversion, will be calculated as Equation (49) shown below by using Equation (10).

$$G_{HPF} = \begin{bmatrix} \cos\theta & \sin\theta \\ -\sin\theta & \cos\theta \end{bmatrix} \begin{bmatrix} \frac{Ts}{Ts+1} & 0 \\ 0 & \frac{Ts}{Ts+1} \end{bmatrix} \begin{bmatrix} \cos\theta & -\sin\theta \\ \sin\theta & \cos\theta \end{bmatrix} \tag{49}$$

$$\begin{bmatrix} \frac{1}{2}\left(\frac{T(s+j\omega_0)}{T(s+j\omega_0)+1} + \frac{T(s-j\omega_0)}{T(s-j\omega_0)+1}\right) & \frac{1}{2j}\left(\frac{T(s+j\omega_0)}{T(s+j\omega_0)+1} - \frac{T(s-j\omega_0)}{T(s-j\omega_0)+1}\right) \\ -\frac{1}{2j}\left(\frac{T(s+j\omega_0)}{T(s+j\omega_0)+1} - \frac{T(s-j\omega_0)}{T(s-j\omega_0)+1}\right) & \frac{1}{2}\left(\frac{T(s+j\omega_0)}{T(s+j\omega_0)+1} + \frac{T(s-j\omega_0)}{T(s-j\omega_0)+1}\right) \end{bmatrix} =$$

$$\begin{bmatrix} \frac{T^2s^2+Ts+T^2\omega_0^2}{(Ts+1)^2+(T\omega_0)^2} & \frac{T\omega_0}{(Ts+1)^2+(T\omega_0)^2} \\ -\frac{T\omega_0}{(Ts+1)^2+(T\omega_0)^2} & \frac{T^2s^2+Ts+T^2\omega_0^2}{(Ts+1)^2+(T\omega_0)^2} \end{bmatrix} A$$

Figure 32:
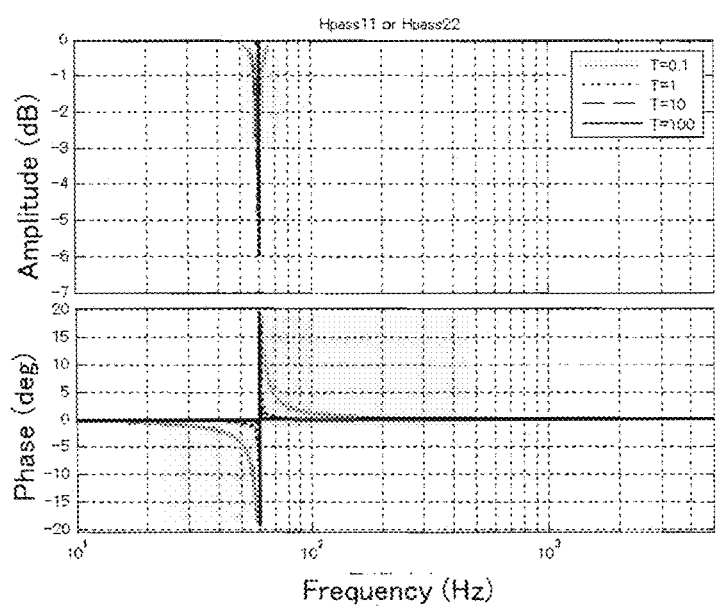
FIG. 32 is a Bode diagram for analyzing transfer functions as elements of a matrix $G_{HPF}$.
Figure 32:
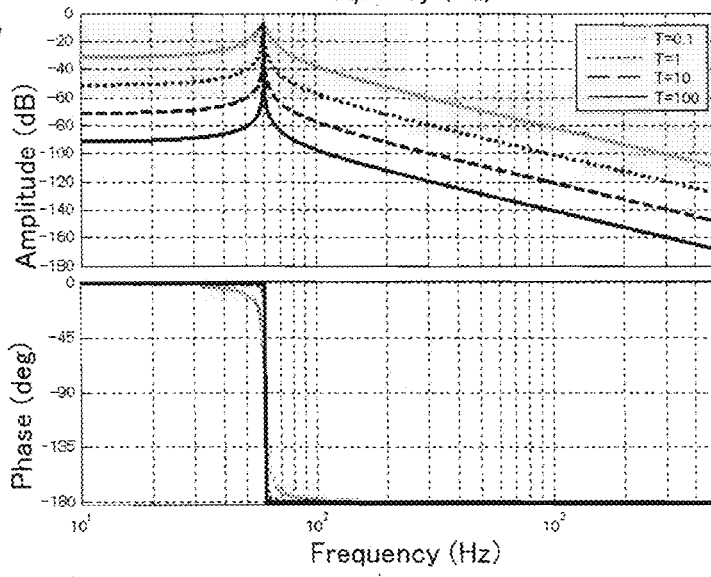
Figure 32:
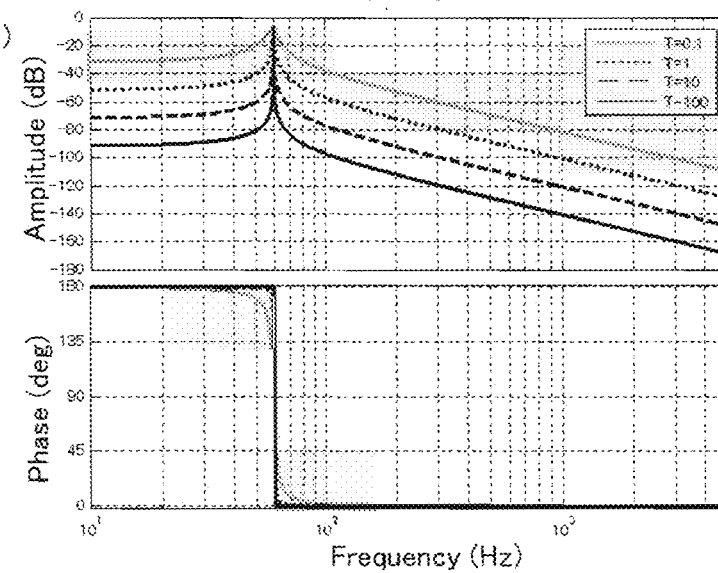

FIG. 32 is a Bode diagram for analyzing transfer functions as elements of a matrix $G_{HPF}$. FIG. 32(a) shows transfer functions of the element (1, 1) and the element (2, 2) of the matrix $G_{HPF}$ whereas FIG. 32(b) shows a transfer function of the element (1, 2) of the matrix $G_{HPF}$, and FIG. 32(c) shows a transfer function of the element (2, 1) of the matrix $G_{HPF}$. FIG. 32 shows a case where the center frequency is 60 Hz, and the time constant T is set to "0.1", "1", "10" and "100".

FIG. 32(a) shows an amplitude characteristic, with an attenuation near the center frequency. The amplitude characteristic at the center frequency is −6 dB (=½). The figure also shows a narrowing cut-off band as the time constant T increases. FIGS. 32 (b) and (c) both show an amplitude characteristic which has a peak at the center frequency, at −6 dB (=½). The figure also shows a narrowing pass band as the time constant T increases. Also, FIG. 32(a) shows a phase characteristic, which attains zero degree at the center frequency. In other words, the transfer functions of the element (1, 1) and the element (2, 2) of the matrix $G_{HPF}$ allow signals of the center frequency to pass through without changing the phase. FIG. 32(b) shows a phase characteristic, which attains −90 degrees at the center frequency. In other words, the transfer functions for the element (1, 2) of the matrix $G_{HPF}$ allows signals of the center frequency to pass through with a 90-degree phase delay. On the other hand, FIG. 32(c) shows a phase characteristic, which attains 90 degrees at the center frequency. In other words, the transfer functions for the element (2, 1) of the matrix $G_{HPF}$ allows signals of the center frequency to pass through with a 90-degree phase advance. Hereinafter, discussion will be made for a process expressed by the transfer function matrix $G_{HPF}$ to be performed to the alpha axis voltage signal Vα and the beta axis voltage signal Vβ (see the vector α and the vector β in FIG. 8) which are outputted from the three-phase to two-phase converter F11.

The positive phase sequence component in the fundamental wave component of the alpha axis voltage signal Vα has a 90-degree phase advance over the positive phase sequence component in the fundamental wave component of the beta axis voltage signal Vβ. Performing the process represented by the transfer function of the element (1, 1) of the matrix $G_{HPF}$ to the alpha axis voltage signal Vα halves the amplitude of the positive phase sequence component in the fundamental wave component and does not change the phase (see FIG. 32(a)). Performing the process represented by the transfer function of the element (1, 2) of the matrix $G_{HPF}$ to the beta axis voltage signal Vβ halves the amplitude of the positive phase sequence component in the fundamental wave component and delays the phase by 90 degrees (see FIG. 32(b)). Therefore, the two phases becomes opposite to each other, which means they cancel each other when the two are added to each other. On the other hand, performing the process represented by the transfer function of the element (2, 1) in the matrix $G_{HPF}$ to the alpha axis voltage signal Vα halves the amplitude of the positive phase sequence component in the fundamental wave component and advances the phase by 90 degrees (see FIG. 32(c)). Performing the process represented by the transfer function of the element (2, 2) in the matrix $G_{HPF}$ to the beta axis voltage signal Vβ halves the amplitude of the positive phase sequence component in the fundamental wave component and does not change the phase. Therefore, the two phases becomes opposite to each other, which means they cancel each other when the two are added to each other.

The negative phase sequence component in the fundamental wave component of the alpha axis voltage signal Vα has a 90-degree phase delay from the negative phase sequence component in the fundamental wave component of the beta axis voltage signal Vβ. Performing the process represented by the transfer function of the element (1, 1) of the matrix $G_{HPF}$ to the alpha axis voltage signal Vα halves the amplitude of the negative-phase sequence component in the fundamental wave component and does not change the phase. Performing the process represented by the transfer function of the element (1, 2) of the matrix $G_{HPF}$ to the beta axis voltage signal Vβ halves the amplitude of the negative-phase sequence component in the fundamental wave component and delays the phase by 90 degrees. Therefore, both phases are now the same as the phase of the negative phase sequence component in the fundamental wave component of the alpha axis voltage signal Vα, which means adding the two will reproduce the negative phase sequence component in the fundamental wave component of the alpha axis voltage signal Vα. On the other hand, performing the process represented by the transfer function of the element (2, 1) in the matrix $G_{HPF}$ to the alpha axis voltage signal Vα halves the amplitude of the negative-phase sequence component in the fundamental wave component and advances the phase by 90 degrees (see FIG. 18(c)). Performing the process represented by the transfer function of the element (2, 2) in the matrix $G_{HPF}$ to the beta axis voltage signal Vβ halves the amplitude of the negative phase sequence component in the fundamental wave component and does not change the phase. Therefore, both phases are now the same as the phase of the beta axis voltage signal Vβ, which means adding the two will reproduce the negative phase sequence component in the fundamental wave component of the beta axis voltage signal Vβ.

In other words, the transfer function matrix $G_{HPF}$ allows the negative phase sequence component of the fundamental wave component to pass through while suppressing the positive phase sequence component of the fundamental wave component. For signals other than the positive phase sequence component and the negative phase sequence component of the fundamental wave component (e.g., harmonic component signals), the process represented by the transfer function of the element (1, 1) and the element (2, 2) of the matrix $G_{HPF}$ allows these signals to pass through (see FIG. 32(a)) as they are whereas the process represented by the transfer function of the element (1, 2) and the element (2, 1) allows these signals to pass through with some attenuation but substantially as they are (see FIGS. 32(b), (c)). Therefore, the process shown in the transfer function matrix $G_{HPF}$ is a notch filtering process which suppresses only the positive phase sequence component in the fundamental wave component.

Swapping the element (1, 2) and the element (2, 1) in the transfer function matrix $G_{HPF}$ will result in the opposite of what was described above, i.e., negative phase sequence components in the fundamental wave component will be suppressed while positive phase sequence component, harmonic components, etc. in the fundamental wave component will be allowed to pass through. In other words, if the element (1, 2) and the element (2, 1) in the matrix $G_{HPF}$ of the transfer function is swapped with each other, the resulting process is a notch filtering process which suppresses only the negative phase sequence component in the fundamental wave component. The matrix may also be considered as the transfer function matrix $G_{HPF}$ in which the angular frequency $\omega_0$ is substituted for "$-\omega_0$". In other words, the process shown in the transfer function matrix $G_{HPF}$ is a notch filtering process which suppresses only a designated frequency component specified as having an angular frequency $\omega_0$.

For example, if it is desired to suppress the negative phase component (−fs), the fifth-, the seventh- and the eleventh-order harmonic components (−5fs, +7fs, −11fs) in the fundamental wave component, the notch filtering process may be performed to each of these frequency components in order to extract only the positive phase sequence component of the fundamental wave component.

The phase detector according to the sixteenth embodiment can be represented by the block diagram of the phase detector F according to the fifteenth embodiment shown in FIG. 30, differing, however, in that the fundamental-wave positive phase sequence component extractor F12 is replaced by a fundamental-wave positive phase sequence component extractor F12' (see FIG. 33 to be described later) (The figure only shows the fundamental-wave positive phase sequence component extractor F12' and none other). For an identification purpose from the phase detector F according to the fifteenth embodiment, the phase detector according to the sixteenth embodiment will be denoted as a phase detector F'.

Figure 33:
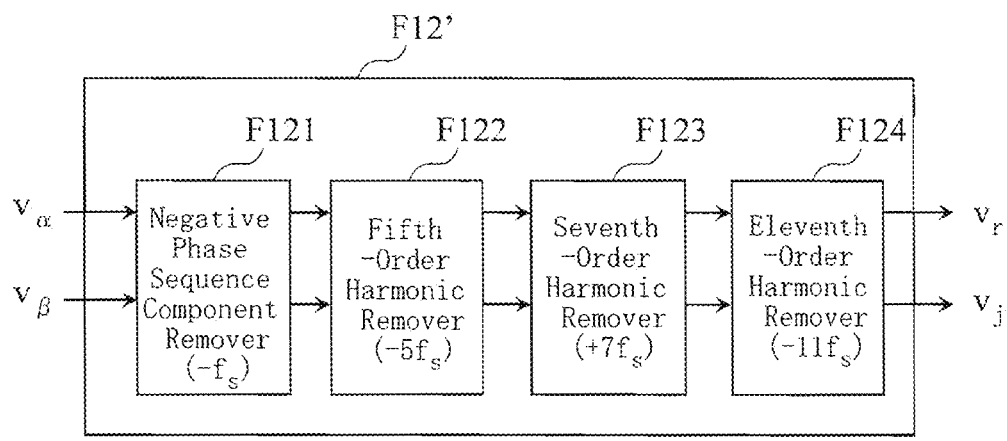
FIG. 33 is a block diagram for describing an internal configuration of a fundamental wave extractor according to a sixteenth embodiment.

FIG. 33 is a block diagram for describing an internal configuration of a fundamental-wave positive phase sequence component extractor F12' according to the sixteenth embodiment.

The fundamental-wave positive phase sequence component extractor F12' includes a negative phase sequence component remover F121, a fifth-order harmonic remover F122, a seventh-order harmonic remover F123, and an eleventh-order harmonic remover F124. The negative phase sequence component remover F121 suppresses negative phase sequence component signals by removing a negative phase sequence component from an alpha axis voltage signal Vα and a beta axis voltage signal Vβ inputted from the three-phase to two-phase converter F11 (see FIG. 30). The negative phase sequence component remover F121 performs a process in which the angular frequency $\omega_0$ is substituted for "$-\omega_0$" in the transfer function matrix $G_{HPF}$ represented by Equation (48) described above; namely it performs a process expressed by Equation (50) shown below, where Vα', Vβ' are signals outputted from the negative phase sequence component remover F121. As for the angular frequency $\omega_0$, a predetermined value is set as an angular frequency $\omega s=120\pi$ [rad/sec] correspondingly to the system frequency fs=60 Hz, and the time constant T is a pre-designed value.

$$\begin{bmatrix} V\alpha' \\ V\beta' \end{bmatrix} = \begin{bmatrix} \frac{T^2s^2 + Ts + T^2(-\omega_0)^2}{(Ts+1)^2 + (-T\omega_0)^2} & \frac{T(-\omega_0)}{(Ts+1)^2 + (-T\omega_0)^2} \\ \frac{-T(-\omega_0)}{(Ts+1)^2 + (-T\omega_0)^2} & \frac{T^2s^2 + Ts + T^2(-\omega_0)^2}{(Ts+1)^2 + (-T\omega_0)^2} \end{bmatrix} \begin{bmatrix} V\alpha \\ V\beta \end{bmatrix} = \quad (50)$$

$$\begin{bmatrix} \frac{T^2s^2 + Ts + T^2\omega_0^2}{(Ts+1)^2 + (T\omega_0)^2} & \frac{-T\omega_0}{(Ts+1)^2 + (T\omega_0)^2} \\ \frac{T\omega_0}{(Ts+1)^2 + (T\omega_0)^2} & \frac{T^2s^2 + Ts + T^2\omega_0^2}{(Ts+1)^2 + (T\omega_0)^2} \end{bmatrix} \begin{bmatrix} V\alpha \\ V\beta \end{bmatrix}$$

The fifth-order harmonic remover F122, the seventh-order harmonic remover F123 and the eleventh-order harmonic remover F124 suppress the fifth-order harmonic, the seventh-order harmonic and the eleventh-order harmonic respectively by performing processes where the angular frequency $\omega_0$ is substituted for "$-5\omega_0$", "$7\omega_0$" and "$-11\omega_0$" respectively in the transfer function matrix $G_{HPF}$ represented by Equation (49). As for the angular frequency $\omega_0$, a predetermined value is set as an angular frequency $\omega s=120\pi$ [rad/sec] correspondingly to the system frequency fs=60 Hz.

It should be noted here that the angular frequency $\omega_0$ used in the fundamental-wave positive phase sequence component extractor F12' need not necessarily be pre-designed. If the signal process makes signal sampling at a fixed interval, then a system frequency fs may be detected by, e.g., a frequency detector so that the angular frequency $\omega_0$ is calculated from the detected frequency.

Figure 34:
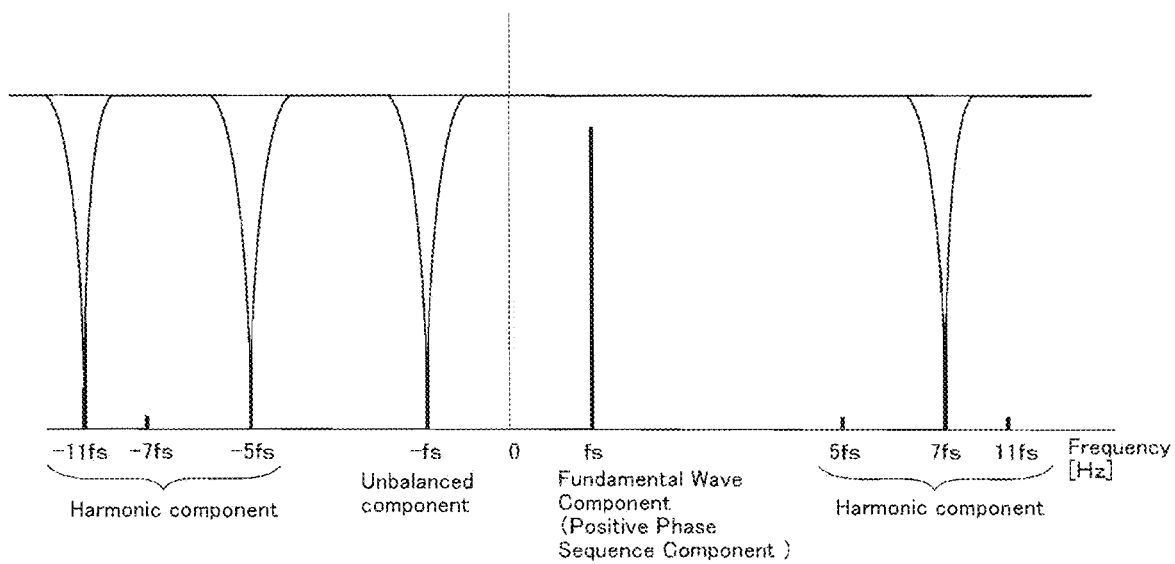
FIG. 34 is a diagram showing frequency characteristics of the fundamental wave extractor according to the sixteenth embodiment.

FIG. 34 shows a frequency characteristic of the fundamental-wave positive phase sequence component extractor F12'. The negative phase sequence component remover F121, the fifth-order harmonic remover F122, the seventh-order harmonic remover F123 and the eleventh-order harmonic remover F124 have frequency characteristics to suppress the negative phase sequence component (–fs), the fifth-order harmonic component (–5fs), the seventh-order harmonic component (7fs) and the eleventh-order harmonic component (–11fs) respectively. Therefore, a frequency characteristic of the fundamental-wave positive phase sequence component extractor F12' as a whole is as shown in FIG. 34. According to the figure, the negative phase sequence component (–fs), the fifth-order harmonic component (–5fs), the seventh-order harmonic component (7fs) and the eleventh-order harmonic component (–11fs) are suppressed while the other component, i.e., the fundamental wave component (fs) is allowed to pass. Therefore, the fundamental-wave positive phase sequence component extractor F12' allows the positive phase sequence component of the fundamental wave component to desirably pass through, and thereby extracts the positive phase sequence component voltage signals Vr, Vj of the fundamental wave component from the alpha axis voltage signal Vα and beta axis voltage signal Vβ.

Generally, harmonics which are found in an electrical power system are the fifth-order, the seventh-order and the eleventh-order harmonics. Thus, the present embodiment is designed to suppress these and the negative phase sequence components in the fundamental wave component. The fundamental-wave positive phase sequence component extractor F12' is designed in accordance with the orders of harmonics which must be suppressed. For example, if the fifth-order harmonic is the only harmonic to be suppressed, there is no need to include the seventh-order harmonic remover F123 or the eleventh-order harmonic remover F124. If it is desired to further suppress the thirteenth-order harmonic, a thirteenth-order harmonic remover should simply be added with the angular frequency $\omega_0$ substituted for "$13\omega_0$" in the transfer function matrix $G_{HPF}$ of the transfer function represented by Equation (49). Also, if harmonic components in the electrical power system are negligibly small, the remover may only include the negative phase sequence component remover F121. Further, if there is a noise added by the voltage sensor for example, the fundamental-wave positive phase sequence component extractor F12' may also include a noise remover for removing the noise component of that specific frequency.

Again in the sixteenth embodiment, it is possible to extract the positive phase sequence component of the fundamental wave component by removing negative phase sequence component and harmonic components of the predetermined orders in the fundamental wave component by using the fundamental-wave positive phase sequence component extractor F12'. Therefore, the embodiment provides the same advantages as does the fifteenth embodiment.

As already known publicly, multi-stage configuration of notch filters and band-pass filters will provide sharp filtering characteristics while it is easy to adjust removal characteristics of the negative phase sequence component and harmonic components as well as to adjust responsiveness. In practical application therefore, it is recommendable to make use of multi-stage configuration of an appropriate number of stages. For example, the phase detector F (see FIG. 30) according to the fifteenth embodiment may further include another fundamental-wave positive phase sequence component extractor F12 after the fundamental-wave positive phase sequence component extractor F12. Also, a combination of notch filters and band-pass filters will provide an advantage of combined characteristics of the two types, providing an option when faster and more accurate phase detection are required. Therefore, for example, the phase detector F (see FIG. 30) according to the fifteenth embodiment may further include a fundamental-wave positive phase sequence component extractor F12' after the fundamental-wave positive phase sequence component extractor F12.

In the sixteenth embodiment, description was made for a case where a signal processor according to the present invention is used as a notch filter incorporated in a phase detector. However the present invention is not limited to this. The signal processor according to the present invention can also be used as a notch filter which exclusively suppresses positive phase sequence components or negative phase sequence components from a signal of a specific frequency.

In the fifteenth and the sixteenth embodiment, description was made for cases where the phase detector F (F') detects phases of a system voltage in a three-phase electrical power system. However, the present invention is also applicable to cases where a phase of a system voltage in a single-phase electrical power system is detected. Hereinafter, a seventeenth embodiment will provide a phase detector which detects a system voltage in a single-phase electrical power system.

Figure 35:
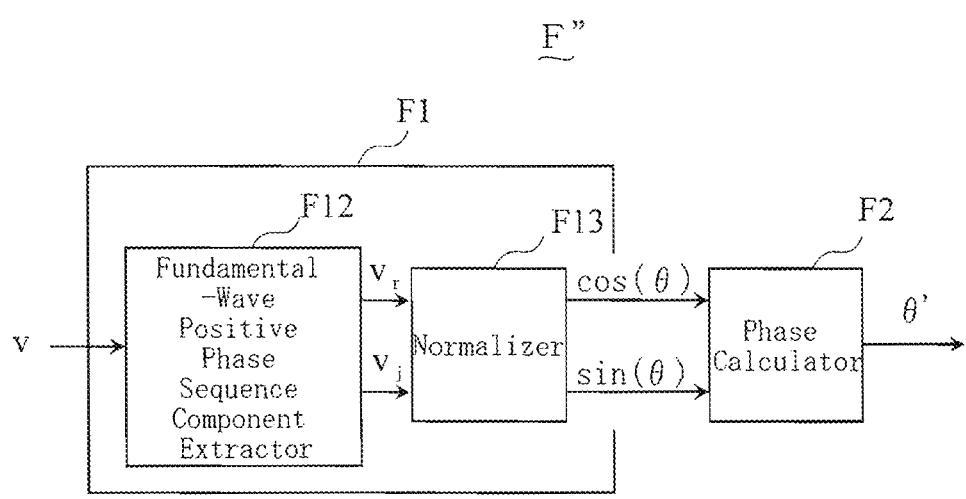
FIG. 35 is a diagram showing a block configuration of a phase detector according to a seventeenth embodiment.

FIG. 35 is a block diagram of a phase detector F" according to the seventeenth embodiment. The phase detector F" differs from the phase detector F in FIG. 30 only in that it does not include the three-phase to two-phase converter F11. Since single-phase power has only one voltage signal V, a sampling data of this voltage signal V and "0" are inputted to the fundamental-wave positive phase sequence component extractor F12. With Vα=V and Vβ=0, Equation (48) shown above will be expressed as Equation (51) below:

$$\begin{bmatrix} Vr \\ Vj \end{bmatrix} = G_{LPF} \begin{bmatrix} V \\ 0 \end{bmatrix} = \begin{bmatrix} \frac{Ts+1}{(Ts+1)^2+(T\omega_0)^2} & \frac{-T\omega_0}{(Ts+1)^2+(T\omega_0)^2} \\ \frac{T\omega_0}{(Ts+1)^2+(T\omega_0)^2} & \frac{Ts+1}{(Ts+1)^2+(T\omega_0)^2} \end{bmatrix} \begin{bmatrix} V \\ 0 \end{bmatrix} = \begin{bmatrix} \frac{Ts+1}{(Ts+1)^2+(T\omega_0)^2} V \\ \frac{T\omega_0}{(Ts+1)^2+(T\omega_0)^2} V \end{bmatrix} \quad (51)$$

Performing a process represented by the transfer function of the element (1, 1) of the matrix $G_{HPF}$ to the voltage signal V halves the amplitude of the fundamental wave component and does not change the phase (see FIG. 29(a)). In other words, the voltage signal Vr is the voltage signal V having its amplitude halved. Performing the process represented by the transfer function of the element (2, 1) of the matrix $G_{LPF}$ to the voltage signal V halves the amplitude of the fundamental wave component and delays the phase by 90 degrees (see FIG. 29(c)). In other words, the voltage signal Vj is the voltage signal V having its amplitude halved and its phase delayed by 90 degrees. Therefore, with the input of the voltage signal V and "0", the fundamental-wave positive phase sequence component extractor F12 outputs orthogonal voltage signals Vr, Vj. It should be noted here that although the amplitude of the voltage signals Vr, Vj is a half of the amplitude of the fundamental wave component in the voltage signal V, it is normalized by the normalizer F13. The phase detector F in FIG. 30 may not have the three-phase to two-phase converter F11, but have an arrangement that a sampling data of one of the phases U, V, W in the voltage signal V is inputted.

In the fundamental-wave positive phase sequence component extractor F12, an input of a single-phase voltage signal results in an output of mutually perpendicular voltage signals Vr, Vj (sine wave signal and cosine wave signal) like in a three-phase configuration. Therefore, the fundamental-wave positive phase sequence component extractor F12, the normalizer F13 and the phase calculator F2 can be implemented in the same way as is the three-phase phase detector F in FIG. 30. The seventeenth embodiment provides the same advantages as offered by the fifteenth embodiment.

In the seventeenth embodiment, description was made for a case where a signal processor according to the present invention is used as a filter incorporated in a phase detector. However the present invention is not limited to this. The signal processor according to the present invention can also be used as a filter which exclusively extracts signals of a specific frequency from an input signal, and outputs mutually perpendicular two signals. This, for example, may be used in a control circuit of a single-phase inverter circuit, or may used in the phase delayer 131 according to the fourteenth embodiment. It should be noted here that as has been described earlier, performing the process given by the matrix $G_{LPF}$ to a single-phase signal will halve the amplitude of the original signal's fundamental wave component in the outputted signal, and therefore it is necessary to provide an arrangement to double the amplitude of the outputted signal.

The signal processors, filters, control circuits, according to the present invention and interconnection inverter systems and PWM converter systems using these control circuits are not limited to those already covered by the embodiments. Specific arrangements in the signal processors, filters, control circuits, and interconnection inverter systems and PWM converter systems using these control circuits according to the present invention may be varied in many ways.

The invention claimed is:

1. A signal processor comprising:
   a signal processing circuit configured to perform linear time-invariant signal processing equivalent to conventional non-linear time-variant signal processing with respect to a first input signal $S_1$, a second input signal $S_2$ and a third input signal $S_3$, the conventional processing including: fixed-to-rotating coordinate conversion based on a non-zero target angular frequency ω; intermediate processing by a transfer function F(s) subsequent to the fixed-to-rotating coordinate conversion; and inverse conversion of the fixed-to-rotating coordinate conversion subsequent to the intermediate processing, the transfer function F(s) corresponding to an impulse response of the intermediate processing,
   wherein the signal processing circuit is configured to convert the first input signal $S_1$, the second input signal $S_2$ and the third input signal $S_3$ to a first output signal $C_1$, a second output signal C2 and a third output signal $C_3$ by an equation below involving a first transfer function $G_1(s)$, a second transfer function $G_2(s)$, and a third transfer function $G_3(s)$, $$\begin{pmatrix} G_1(s) & G_2(s) & G_3(s) \\ G_3(s) & G_1(s) & G_2(s) \\ G_2(s) & G_3(s) & G_1(s) \end{pmatrix} \begin{pmatrix} S_1 \\ S_2 \\ S_3 \end{pmatrix} = \begin{pmatrix} C_1 \\ C_2 \\ C_3 \end{pmatrix}$$

wherein $G_1(s)$, $G_2(s)$ and $G_3(s)$ are represented by following formulas, where $G_1(s) \neq 0$ and j represents an imaginary unit, $$G_1(s) = \frac{F(s+j\omega) + F(s-j\omega)}{3}$$

$$G_2(s) = \frac{(-1 \mp \sqrt{3}\,j) \cdot F(s+j\omega) + (-1 \pm \sqrt{3}\,j) \cdot F(s-j\omega)}{6}$$

$$G_3(s) = \frac{(-1 \pm \sqrt{3}\,j) \cdot F(s+j\omega) + (-1 \mp \sqrt{3}\,j) \cdot F(s-j\omega)}{6}$$

2. The signal processor according to claim 1, wherein the transfer function F(s) is equal to one of $K_I/S$ ($K_I$ represents an integral gain), $K_P+K_I/S$ ($K_P$ represents a proportional gain, and $K_I$ represents an integral gain) or $K_p+K_I/S+K_D \cdot S$ ($K_P$ represents a proportional gain, $K_I$ represents an integral gain, and $K_D$ represents a differential gain).

3. A control circuit for controlling a plurality of switching units inside a power converter circuit by a PWM signal, comprising:
   a signal processor according to claim 1; and
   a PWM signal generator configured to generate a PWM signal based on an output from the signal processor.

4. The control circuit according to claim 3, wherein the power converter circuit relates to a three-phase alternate current.

5. The control circuit according to claim 3, further comprising a divergence determination unit and an output control unit,
   wherein the divergence determination unit is configured to determine, based on output signals from the signal processor, if control for driving the plurality of switching units tends to diverge, and
   wherein when the divergence determination unit determines that the control for driving the plurality of switching units tends to diverge, the output control unit stops the output signal or changes a phase of the output signal to another phase whereby the control for driving the plurality of switching units does not diverge.

6. The control circuit according to claim 3, wherein the power converter circuit comprises a converter circuit for conversion of AC power supplied from an electrical power system into DC power, and the target angular frequency $\omega$ corresponds to $n\omega_0$, where n is a positive integer and $\omega_0$ is an angular frequency of a fundamental wave in the electrical power system.

7. A PWM converter system comprising:
   a control circuit according to claim 3; and
   a converter circuit.

8. The control circuit according to claim 3, wherein the power converter circuit comprises an inverter circuit for generation of AC power to be supplied to an electrical power system, and the target angular frequency $\omega$ corresponds to $n\omega_0$, where n is a positive integer and $\omega_0$ is an angular frequency of a fundamental wave in the electrical power system.

9. An interconnection inverter system comprising:
   a control circuit according to claim 3; and
   an inverter circuit.

10. The control circuit according to claim 3, wherein the power converter circuit comprises an inverter circuit for driving a motor, and the target angular frequency $\omega$ corresponds to a rotating speed of the motor.

11. A filter comprising a signal processor according to claim 1, wherein the transfer function F(s) is equal to one of $K_I/S$ ($K_I$ represents an integral gain), $K_P+K_I/S$ ($K_P$ represents a proportional gain, and $K_I$ represents an integral gain), $K_p+K_I/S+K_D \cdot S$ ($K_P$ represents a proportional gain, $K_I$ represents an integral gain, and $K_D$ represents a differential gain), $1/(T \cdot s+1)$ or $T \cdot s/(T \cdot s+1)$, where T represents a time constant.

12. A phase detector for detecting a phase of a fundamental wave component in an AC signal, comprising:
   a filter according to claim 11, wherein the target angular frequency $\omega$ is an angular frequency of the fundamental wave component in the AC signal.

* * * * *